(12) United States Patent
Bednorz et al.

(10) Patent No.: US 8,060,169 B1
(45) Date of Patent: Nov. 15, 2011

(54) SUPERCONDUCTIVE COMPOUNDS HAVING HIGH TRANSITION TEMPERATURE, AND METHODS FOR THEIR USE AND PREPARATION

(75) Inventors: Johannes Georg Bednorz, Adliswil (CH); Carl Alexander Mueller, Hedingen (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/479,810

(22) Filed: Jun. 7, 1995

Related U.S. Application Data

(60) Continuation of application No. 08/303,561, filed on Sep. 9, 1994, which is a continuation of application No. 08/060,470, filed on May 11, 1993, now abandoned, which is a continuation of application No. 07/875,003, filed on Apr. 24, 1992, now abandoned, which is a division of application No. 07/053,307, filed on May 22, 1987, now abandoned.

(51) Int. Cl.
*H01B 12/00* (2006.01)
*H01L 39/12* (2006.01)

(52) U.S. Cl. ......... 505/150; 505/163; 505/166; 505/211

(58) Field of Classification Search .................. 505/725, 505/776, 780, 126, 238, 150–213, 825–908; 252/518.1–521.1
See application file for complete search history.

(56) References Cited

OTHER PUBLICATIONS

Asahi Shinbum, International Satellite Edition (London), Nov. 1986.*
CRC Handbook of Chemistry and Physics, 63rd ed., Weast, R. C., ed., p. E-84 and E-85, Month not known, -82.*
Schuller et al, "A Snapshot View of High Temperature Superconductivity 2002", workshop on High Temperature Superconductivity Apr. 5-8, 2002. pp. 1-50.*
"Exploring Superconductivity", www.nobelchannel.com/learningstudio/introduction, no publication date.*
J. B. Goodenough and J. M. Longo, *Magnetic and Other Properties of Oxides and Related Compounds*, in Landolt-Bornstein New Series, vol. III/4a, K.-H. Hellwege and A. M. Hellwege, eds. (Springer-Verlag 1970) pp. 261-314.
P. W. Anderson, Comments on Solid *State Physics*, vol. II, pp. 193-197 (Feb./Mar. 1970).
R. Englman, *The Jahn-Teller Effect in Molecules and Crystals*, (Wiley-Interscience, 1972), pp. 139-141, 164-181, 249-265.
B. K. Chakraverty, *Journal de Physique-Lettres*, vol. 40, pp. L-99-L-100, (Mar. 1979).
G. Deutscher et al. *Physical Review B*, vol. 21 pp. 5041-5047, (Jun. 1, 1980).
K. A. Muller et al. *Physical Review Letters*, vol. 45, pp. 832-835, (Sep. 8, 1980).
R. A. Buhrman et al., in *AIP Conference Proceedings, Inhomogeneous Superconductors*—1979, (Berkeley Springs, W.V.), D. U. Gubser et al. pp. 207-215, (1980).
T. D. Thanh et al. *Applied Physics*, vol. 22, pp. 205-212 (1980).

(Continued)

*Primary Examiner* — Mark Kopec
(74) *Attorney, Agent, or Firm* — Daniel P. Morris; Jackson E. Stanland

(57) ABSTRACT

A new class of superconducting compositions, and methods for making and using them are described. These compositions exhibit superconductivity at temperatures in excess of 26° K. and are comprised of transition metal oxides having at least one additional element therein which may create a multi-valent state of the transition metal oxide. The composition can be a ceramic-like material having a layer-like crystalline structure, where the structure is distorted having either an oxygen excess or deficiency. An example is RE-AE-TM-O, where RE is a rare earth or rare earth-like element, AE is an alkaline earth element, TM is a transition metal element (such as Cu) and O is oxygen.

679 Claims, 3 Drawing Sheets

OTHER PUBLICATIONS

C. Methfessel and S. Methfessel, in *Proceedings of the IV Conference on Superconductivity in d- and f- Band Metals*, W. Buckel and W. Weber, eds. (Kernforschungszentrum, Karlsruhe, 1982, pp. 393-399.

A. Baratoff et al., in *Proceedings of the IV Conference on Superconductivity in d- and f- Band Metals*, W. Buckel and W. Weber eds., (Kernforschungszentrum, Karlsruhe, 1982) p. 419.

J. Muller, *Rep. Prog. Phys.*, vol. 43, pp. 642-687. (1980).

M. Suzukl et al., *Shinku*, vol. 24, pp. 67-75, (1981). [in Japanese].

K. A. Muller et al., *Physical Review Letters*, vol. 47, pp. 138-142, (Jul. 13, 1981).

Y. Enomoto et al., *Japanese Journal of Applied Physics*, vol. 20, pp. L661-L664, (Sep. 1981).

B. K. Chakraverty, *Journal de Physique*, vol. 42, pp. 1351-1356, (Sep. 1981).

L. Er-Rakho et al., *Journal of Solid State Chemistry*, vol. 37, pp. 151-156, (1981).

A. Baratoff and G. Binnig, *Physica*, vol. 108B, pp. 1335-1336, (1982).

L. F. Mattheiss and D. R. Hamann, *Physical Review B*, vol. 26, pp. 2686-2689, (Sep. 1, 1982).

L. F. Mattheiss and D. R. Hamann, *Physical Review B*, vol. 28, pp. 4227-4241, (Oct. 15, 1983).

K.-H. Hock et al, *Helvetica Physica Acta*, vol. 56, pp. 237-243, (1983).

N. Nguyen et al., *Journal of the Physics and Chemistry of Solids*, vol. 44, pp. 389-400, (1983).

D. R. Bowman and D. Stroud, *Physical Review Letters*, vol. 52, pp. 299-302, (Jan. 23, 1984).

M. Tinkham et al., *Workshop on Problems in Superconductivity*, Copper Mountain, CO, pp. 12-22, (1984).

B. Batlogg, *Physica*, vol. 126B, pp. 275-279, (1984).

C. Ebner and D. Stroud, *Physical Review B*, vol. 31, pp. 165-171, (Jan. 1, 1985).

M. R. Harrison et al., *Philosophical Magazine B*, vol. 52, pp. 679-699, (1985).

E. Stocker and J. Buttet, *Solid State Communications*, vol. 53, pp. 915-917, (1985).

C. Van Haesendonck and Y. Bruynseraede, *Physical Review B*, vol. 33, pp. 1684-1690, (Feb. 1, 1986).

H. R. Ott, Unconventional Superconductivity, Zurich Physical Society Seminar, Zurich, (Feb. 13, 1986), [in German].

T. Ogushi and Y. Osono, *Applied Physics Letters*, vol. 48, pp. 1167-1168, (Apr. 28, 1986).

S.-I. Uchida et al. "High $T_c$ Superconductivity of La-Ba-Cu Oxides", unpublished nine-page manuscript bearing date of Nov. 22, 1986.

Asahi Shinbum, International Satellite Edition (London), Nov. 28, 1986, (in Japanese with English translation).

H. Takagi et al., "High-$T_c$ Superconductivity of La-Ba-Cu Oxides, II-Specification of the Superconducting Phase", unpublished nine-page manuscript bearing date of Dec. 8, 1986.

S.-I. Uchida et al., "High-$T_c$ Superconductivity of La-Ba-Cu Oxides. III-Electrical Resistivity Measurement", unpublished nine-page manuscript—(p. 7 missing) bearing date of Dec. 22, 1986.

K. Kishio et al., "New High Temperature Superconducting Oxides. $(La_{1-x}Sr_x)2CuO_{4-\delta}$ and $(La_{1-x}Ca_x)2Cu)_{4-\delta}$ " unpublished four-page manuscript bearing date of Dec. 22, 1986.

C. W. Chu et al. "Superconductivity Above 52K in the La-Ba-Cu-O System" unpublished fourteen-page manuscript bearing date of Dec. 30, 1986.

W. Sullivan, *New York Times*, Dec. 31, 1986, p. A1, cols. 2-3 and A13, cols. 1-2.

S.-I. Uchida et al., "High-$T_c$ Superconductivity of La-Ba-(Sr)-Cu Oxides. IV—Critical Magnetic Fields" unpublished ten-page manuscript bearing date of Jan. 8, 1987.

S. Kanbe et al., "Superconductivity and Lattice Parameters in $(La_{1-x}Sr_x)2Cu)_{4-\delta}$ Solid Solution System" unpublished four-page manuscript bearing date of Jan. 13, 1987.

H. Tagaki et al., Influence of the Oxygen Deficiency on the Electrical Resistivity in High-$T_c$ Superconducting Oxides $(LaBa)2CuO_{4-y}$, unpublished eight page manuscript bearng date of Jan. 17, 1987.

Z. Zhao et al., "High $T_c$ Superconductivity of Sr(Ba)La-Cu Oxides" unpublished eleven-page manuscript bearing date of Jan. 21, 1987.

Thin Solid Films, 54, (1978) 129-136 "Superconducting $BaPb_{1-x} Bi_x O_3$ Ceramic films Prepared by R.F. Sputtering" by L.R. Gilbert et al.

Proceedings of the 13th Conf. on Solid State Devices, Tokyo, 1981 pp. 313-318 (Invited) New Materials for Jocephson Junction Devices by T. Inamura et al.

Europhysics Letters, 3(3), pp. 379-385 (1987) "Susceptibility Measurements Support High-$T_c$ Superconductivity . . . " by J.G. Bednorz et al.

Jap. Journal of Appl. Phys. vol. 21, No. 6, Jun. 1982, pp. L375-L376, 'Hysteresis Loop in Current-Voltage Curve for $Ba-Pb_{0.7} Bi_{O.3} O_{.}$Joseplson Junction Array in a Microwave Field' by M. Ito et al.

J. Vac. Sci Technol, 17(1) Jan./Feb. 1980, pp. 389-391, "Resputtaring Effects in $Ba(Pb, Bi)O_3$ Perovskite" by L. R. Gilber et al.

Ibaraki Electrical Comm. Lab, "New Devices Using Superconducting $BaPb_{0.7} Bi_{0.3} O_3$ (BPB) Thin Films" by T. Murakami et al.

Jap. Journal of Appl. Phys, vol. 21, No. 7, Jul. 1982, pp. L437-L439 "Temperature Dependence of Max. DC Johnson Current through Grain Boundary Junctions in $BaPb_{0.75} Bi_{0.25} O_3$ Films" by M Suzuki et al.

Phys. Rev. Lett, vol. 45, No. 16, (Oct. 1980) "Two-Band Superconductivity in Nb-Doped $SrTiO_3$" by G. Binnig et al.

Jap. Journal of Appl. Phys. vol. 19, No. 5, May 1980 pp. L231-L234, "Preparation of Superconductivity $BaPb_{1-x} Bi_x O_3$ Thin Films . . . " by M. Suzuki et al.

J. Appl. Phys. 53 (3), Mar. 1982, pp. 1622-1630, "Preparation and Properties of Superconductivity $BaPb_{1-x} Bi_x O_3$ Thin films by Sputtering" by M. Suzuki et al.

Materials Research, Phyiscs Today, Oct. 1984, pp. 60-68, "Superconducting Materials" by M. R. Beasley et al.

Solid State Communications, vol. 17, pp. 27-28, 1975, "High-Temparature Superconductivity in the $BaPb_{1-x} Bi_x O_3$ System" by A. W. Sleight et al.

Mat. Res. Bull. vol. 8, pp. 777-784, 1973, "High Temparature Superconductivity in the Li-Ti-O Ternary System" by D. C. Johnson et al.

Z. Phys. B-Condensed Matter 64, 189-193 (1986) "Possible High $T_c$ Super-Conductivity in the Ba-La-Cu-O System" by J. G. Bednorz et al.

Revue de Chimie Minerale, t, 21, 1984, p. 407, "Oxygen Intercalation in Mixed Valence Copper Oxides Related to the Perovskites" by C. Michel et al.

Mat. Res. Bull., vol. 20, pp. 667-671, 1985 Pregamon Press Ltd, "The Oxygen Defect Perovskite $BaLa_4 Cu_5 O_{13.4}$, A Metallic Detector" by C. Michel et al.

Jap. Journal of Appl. Phys. vol. 21, No. 6, Jun. 1982, pp. L375-L376, 'Hysteresis Loop in Current-Voltage Curve for $BaPb_{0.7} Bi_{O.3} O_3$ Josephson Junction Array in a Microwave Field' by M. Ito et al.

J. Vac. Sci Technol. 17(1) Jan./Feb. 1980, pp. 389-391, "Resputtaring Effects in $Ba(Pb, Bi)O_3$ Perovskite" by L. R. Gilbert et al.

Thin Solid Films, 54, (1978) 129-136 "Superconducting $BaPb_{i-x} Bi_x O_3$ Ceramic Films Prepared by R. F. Sputtering" by L. R. Gilbert et al.

Proceedings of the 13th Conf. on Solid State Devices, Tokyo, 1981 pp. 313-318 (Invited) New Materials for Jocephson Junction Devices by T. Inamura et al.

Europhysics Letters, 3(3), pp. 379-385 (1987) "Susceptibility Measurements Support High-$T_c$ Superconductivity . . . " by J. G. Bednorz et al.

Uihda "High $T_c$ Superconductivity of La Ba Cu Oxides" Jap. Jnl. Appl. Phys. V26 (1) Jan. 1987 PL1-L2.

Cava "Bulk Superconductivity at 36K in $La_{1-x} Sr_{0.2} Cu O_4$" Phys. Rev. Lett. U. 58 (4) Jan. 26, 1987 p. 408-410.

Nguyen "Oxygen Defect $K_2 Ni F_4$ Type Oxides . . . " Jnl. of Solid State Chem. V34 1981 p. 170-177.

Shaplygin "Preparation and Properties of the Compounds . . . " Russian Jnl. of Inorg. Chem. V24 (6) 1979 p. 870-4.

Bednorz "Phase diagram of the $(La Al O_3)_{1-x} (SnTiO_3)x$ . . . " Met. Res. Bull. v. 18 1983 p. 181-187.

Perin Simon "Chimie dos Solides" C. R. Acad Sc. Pros (28) 1976, pp. 33-35.

Mossner "$Ba_6 B_{0.5} Nb_{4.5} O_{18}$ (Bi, Sc, Y, Im . . . ) . . . " Journal of the Less Common Metals V. 105 1985 p. 165-168.

Chichilkar "Thermal Behavior of compositions m . . . " Thermal Analysis , 6th vol. 2 1980 p. 251-6.

Ahmad "Effect of Environmental cations on Force . . . " Spectroscopy Letters V.9(1) 1976 p. 39-55.

Blassi "Electronic and Vibrational Spect of Ordered Perovskites" Jnl of Solid State. Chem. V.6 1973 p. 513-518.

Anderton "Production of Conductivity Oxide Powders . . . " Powder Meet No. 1 1979 p. 14-21.

Ogushi "Possibility of Superconductivity with High $T_c$ . . . " J. of Low Temp. Physics v 64 (5,6) 1987 p. 451-8.

Rao "High $T_c$ Superconductivity in Quasi Two-Dimensionist" Current Science V56 Jan. 20, 1987 p. 47-94.

Ganguly High $T_c$ Superconductivity in Oxides Derived From $La_{1-\delta}Sr_{0.5}CuO_4$ Proc. Inda Acad Sci v 97 (STC) Feb. 1987 p. 631-633.

\* cited by examiner

SUPERCONDUCTIVE COMPOUNDS HAVING HIGH TRANSITION TEMPERATURE, AND METHODS FOR THEIR USE AND PREPARATION

This application is a CON of Ser. No. 08/303,561 (filed Sep. 9, 1994), which application is a CON of Ser. No. 08/060,470 (filed May 11, 1993, now ABN), which application is a CON of Ser. No. 07/875,003 (filed Apr. 24, 1992, now ABN), which application is a DIV of Ser. No. 07/053,307 (filed May 22, 1987, now ABN).

TECHNICAL FIELD

This invention relates to a new class of superconducting compositions having high superconducting transition temperatures and methods for using and preparing these compositions, and more particularly to superconducting compositions including copper and/or other transition metals, the compositions being characterized by a superconducting phase and a layer-like structure.

BACKGROUND ART

Superconductivity is usually defined as the complete loss of electrical resistance of a material at a well-defined temperature. It is known to occur in many materials, including about a quarter of the elements of the periodic table and over 1000 alloys and other multi-component systems. Generally, superconductivity is considered to be a property of the metallic state of a material since all known superconductors are metallic under the conditions that cause them to be superconducting. A few normally non-metallic materials, for example, become superconducting under very high pressure wherein the pressure converts them to metals before they exhibit superconducting behavior.

Superconductors are known to be very attractive for the generation and energy-saving transport of electrical power over long distances, and as materials used to form the coils of very strong magnets. These magnets are used in, for example, plasma and nuclear physics, nuclear magnetic resonance medical diagnosis systems, and in connection with the magnetic levitation of fast trains. Other potential uses of superconducting materials occur in power generation systems using thermonuclear fusion where very large magnetic fields must be provided, superconducting magnets being the only possible means for providing such high fields. In addition to these applications, superconductors are known in high speed switching devices, such as Josephson type switches, and in high density packaging and circuit layouts. Superconductors also are used in different types of electronic instrumentation, such as magnetic susceptometers and magnetometers.

While the advantages of superconductors are quite obvious to scientists and engineers, the common disadvantage of all presently known superconductive materials lies in their very low transition temperature. This temperature is often called the critical temperature $T_c$ and is the temperature above which superconductivity will not exist. Usually $T_c$ is on the order of a few degrees Kelvin. The element with the highest $T_c$ is niobium whose $T_c$ is 9.2° K. The composition having the highest previously known $T_c$ is $Nb_3Ge$ which exhibits a $T_c$ of about 23° K at ambient pressure. Transition metal alloy compounds of the A15($Nb_3Sn$) and B1(NbN) structure have been shown to have high superconducting transition temperatures. Among the A15 compounds is the aforementioned composition $Nb_3Ge$. Some of these compositions are described in J. Muller, Rep. Prog. Phys. 43, 663 (1980), and M. R. Beasley et al, Phys. Today, 37 (10), 60 (1984).

It is known in the art that a small number of oxides will exhibit superconductivity. Reference is made to D. C. Johnston et al, Mat. Res. Bull. 8, 777 (1973), which describes high temperature superconductivity in the Li—Ti—O system with superconducting onsets as high as 13.7° K. These materials have multiple crystallographic phases including a spinel structure exhibiting the high $T_c$. Other metallic oxides, such as the perovskite Ba—Pb—Bi—O system can exhibit superconductivity due to high electron-phonon coupling in a mixed valent compound, as described by G. Binnig et al, Phys. Rev. Lett., 45, 1352 (1980), and A. W. Sleight et al, Solid State Communications, 17, 27 (1975).

As is evident from the foregoing, superconductors presently known require liquid helium for cooling and this, in turn, requires an elaborate technology and a considerable investment in cost and energy. Accordingly, it is a primary object of the present invention to provide new compositions which exhibit high $T_c$ and methods for using and producing the same.

It is another object of the present invention to provide new superconducting compositions and methods for using and making them where cooling with liquid helium is not required in order to have superconductive properties in the compositions.

It is another object of the present invention to provide novel superconductive materials that are multi-valent oxides including transition metals, the compositions having a perovskite-like structure.

It is a further object of the present invention to provide novel superconductive compositions that are oxides including rare earth and/or rare earth-like atoms, together with copper or other transition metals that can exhibit mixed valent behavior.

It is a still further object of the present invention to provide novel superconductive compositions exhibiting high $T_c$, where the compositions are oxides including a phase having a layer-like structure and including copper.

It is a still further object of the present invention to provide new superconductive compositions exhibiting high $T_c$, where the superconductive compositions include layered structures including a rare earth and/or rare earth-like element and a transition metal.

It is another object of this invention to provide a new class of superconducting compositions characterized by a $T_c$ greater than 26° K, and methods for making and using these compositions.

It is another object of this invention to provide new compositions and methods for using them, where the compositions include a multi-valent oxide of copper and exhibit a $T_c$ greater than 26° K.

The basis for our invention has been described by us in the following previously published article: J. G. Bednorz and K. A. Muller, Zeitschrift fur Physik B—Condensed Matter, 64, pp. 189-193.

Another article of interest by us is J. G. Bednorz, K. A. Muller, M. Takashige, Europhysics Letters, 3(3), pp. 379-385 (1987).

SUMMARY OF THE INVENTION

This invention relates to novel compositions exhibiting superconductivity at temperatures higher than those obtained in prior known superconductive materials, and to methods for using and forming these compositions. These compositions can carry supercurrents (i.e., electrical currents in a substantially zero resistance state of the composition) at temperatures at greater than 26° K. In general, the compositions are characterized as mixed transition metal oxide systems where the transition metal oxide can exhibit multivalent behavior. These compositions have a layer-type crystalline structure, often perovskite-like, and can contain a rare earth or rare earth-like element. A rare earth-like element (sometimes termed a near rare earth element, is one whose properties make it essentially a rare earth element. An example is a group IIIB element of the periodic table, such as La. Substitutions can be found in the rare earth (or rare earth-like) site or in the transition metal sites of the compositions. For example, the rare earth site can also include alkaline earth elements selected from group IIA of the periodic table, or a combination of rare earth or rare earth-like elements and alkaline earth elements. Examples of suitable alkaline earths include Ca, Sr, and Ba. The transition metal site can include a transition metal exhibiting mixed valent behavior, and can include more than one transition metal. A particularly good example of a suitable transition metal is copper. As will be apparent later, Cu-oxide based systems provide unique and excellent properties as high $T_c$ superconductors.

An example of a superconductive composition having high $T_c$ is the composition represented by the formula RE-TM-O, where RE is a rare earth or rare earth-like element, TM is a nonmagnetic transition metal, and O is oxygen. Examples of transition metal elements include Cu, Ni, Cr etc. In particular, transition metals that can exhibit multi-valent states are very suitable. The rare earth elements are typically elements 58-71 of the periodic table, including Ce, Nd, etc. If an alkaline earth element (AE) were also present, the composition would be represented by the general formula RE-AE-TM-O.

The ratio (AE,RE):TM is generally approximately 1:1, but can vary from this as will be shown by examples where the ratio (AE,RE):TM is 2:1. Of course, the amount of oxygen present in the final composition will adjust depending upon the processing conditions and will be such that the valence requirements of the system are satisfied.

The methods by which these superconductive compositions can be made can use known principles of ceramic fabrication, including the mixing of powders containing the rare earth or rare earth-like, alkaline earth, and transition metal elements, coprecipitation of these materials, and heating steps in oxygen or air.

A particularly suitable superconducting material in accordance with this invention is one containing copper as the transition metal. Copper can exist in a $Cu^{2+}$ or $Cu^{3+}$ mixed valence state. The state(s) assumed by copper in the overall composition will depend on the amount of oxygen present and on any substitutions in the crystalline structure. Very high $T_c$ has been found in Cu-oxide systems exhibiting mixed valence states, as indicated by conductivity and other measurements. Copper oxide systems including a rare earth or rare earth-like element, and an alkaline earth element, are unique examples of this general class of superconducting layered copper oxides which exhibit $T_c$ greater than 26° K.

These and other objects, features, and advantages will be apparent from the following more particular description of the preferred embodiments.

DESCRIPTION OF THE PREFERRED EMBODIMENTS

Figure 1:
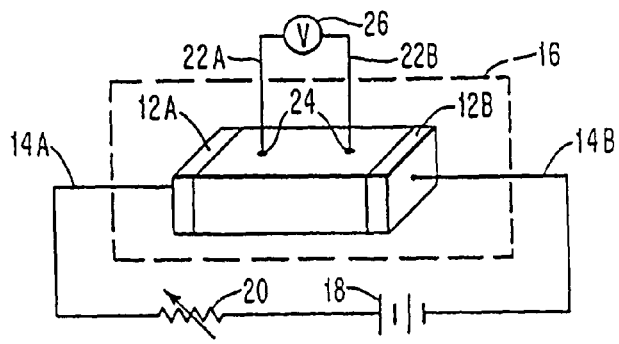
FIG. 1 is a schematic illustration of a representative circuit used to measure dc conductivity in the high $T_c$ superconductors of this invention.

The superconductive compositions of this invention are transition metal oxides generally having a mixed valence and a layer-like crystalline structure, and exhibit $T_c$'s higher than those of previously known superconducting materials. These compositions can also include a rare earth site in the layer-like structure where this site can be occupied by rare earth and rare earth-like atoms, and also by alkaline earth substitutions such as Ca, Sr, and Ba. The amount of oxygen present will be such that the valence requirements of the system are satisfied, the amount of oxygen being somewhat a function of the processing steps used to make the superconductive compositions. Non-stoichiometric amounts of oxygen can be present in these compositions. The valence state of the elements in the oxide will be determined by the final composition in a manner well known to chemists. For example, the transition metal Cu may be present in some compositions in both a $Cu^{2+}$ and a $Cu^{3+}$ state.

An example of a superconductive compound having a layer-type structure in accordance with the present invention is an oxide of the general composition $RE_2TMO_4$, where RE stands for the rare earths (lanthanides) or rare earth-like elements and TM stands for a transition metal. In these compounds the RE portion can be partially substituted by one or more members of the alkaline earth group of elements. In these particular compounds, the oxygen content is at a deficit.

For example, one such compound that meets this general description is lanthanum copper oxide $La_2CuO_4$ in which the lanthanum—which belongs to the IIIB group of elements—is in part substituted by one member of the neighboring IIA group of elements, viz. by one of the alkaline earth metals (or by a combination of the members of the IIA group), e.g., by barium. Also, the oxygen content of the compound can be incomplete such that the compound will have the general composition $La_{2-x}Ba_xCuO_{4-y}$, wherein $x \leq 0.3$ and $y < 0.5$.

Another example of a compound meeting this general formula is lanthanum nickel oxide wherein the lanthanum is partially substituted by strontium, yielding the general formula $La_{2-x}Sr_xNiO_{4-y}$. Still another example is cerium nickel oxide wherein the cerium is partially substituted by calcium, resulting in $Ce_{2-x}Ca_xNiO_{4-y}$.

The following description will mainly refer to barium as a partial replacement for lanthanum in a $La_2CuO_4$ compound because it is in the Ba—La—Cu—O system that many laboratory tests have been conducted. Some compounds of the general Ba—La—Cu—O system have been described by C. Michel and B. Raveau in Rev. Chim. Min. 21 (1984) 407, and by C. Michel, L. Er-Rakho and B. Raveau in Mat. Res. Bull., Vol. 20, (1985) 667-671. They did not, however, find or try to find superconductivity. These references and their teachings regarding perovskite-like layered oxides of mixed valent transition metals, and their preparation, are herein incorporated by reference.

Experiments conducted in connection with the present invention have revealed that high-$T_c$ superconductivity is present in compounds where the rare earth or rare earth-like element is partially replaced by any one or more of the members of the IIA group of elements, i.e., the alkaline earth metals. Actually, the $T_c$ of $La_2CuO_{4-y}$ with the substitution $Sr^{2+}$ is higher and its superconductivity-induced diamagnetism larger than that found with the substitutions $Ba^{2+}$ and $Ca^{2+}$.

The Ba—La—Cu—O system can exhibit a number of crystallographic phases, namely with mixed-valent copper constituents which have itinerant electronic states between non-Jahn-Teller $Cu^{3+}$ and Jahn-Teller $Cu^{2+}$ ions.

This applies likewise to systems where nickel is used in place of copper, with $Ni^{3+}$ being the Jahn-Teller constituent, and $Ni^{2+}$ being the non-Jahn-Teller constituent. The existence of Jahn-Teller polarons in conducting crystals was postulated theoretically by K. H. Hoeck, H. Nickisch and H. Thomas in Helv. Phys. Acta 56 (1983) 237. Polarons have large electron-phonon interactions and, therefore, are favorable to the occurrence of superconductivity at higher critical temperatures.

Samples in the Ba—La—Cu—O system, when subjected to X-ray analysis, revealed three individual crystallographic phases, viz.

a first layer-type perovskite-like phase, related to the $K_2NiF_4$ structure, with the general composition $La_{2-x}Ba_xCuO_{4-y}$, with $x\ll1$ and $y\geq0$;

a second, non-conducting CuO phase; and a third, nearly cubic perovskite phase of the general composition $La_{1-x}Ba_xCuO_{3-y}$ which appears to be independent of the exact starting composition.

Of these three phases the first one appeared to be responsible for the observed high-$T_c$ superconductivity, the critical temperature showing a dependence on the barium concentration in that phase. Obviously, the $Ba^{2+}$ substitution caused a mixed-valent state of $Cu^{2+}$ and $Cu^{3+}$ to preserve charge neutrality. It is assumed that the oxygen deficiency, y, is the same in the doped and undoped crystallites.

In this application, the terms transition metal oxide, copper oxide, Cu-oxide, etc. are meant to broadly include the oxides which exhibit superconductivity at temperatures greater than 26° K. Thus, the term copper oxide can mean, among other things, an oxide such as $CuO_{4-y}$ in the mixed oxide composition $La_{2-x}Ba_xCuO_{4-y}$.

Both $La_2CuO_4$ and $LaCuO_3$ are metallic conductors at high temperatures in the absence of barium. Actually, both are metals like $LaNiO_3$. Despite their metallic character, the Ba—La—Cu—O type materials are essentially ceramics, as are the other compounds of the $RE_2TMO_4$, type, and their manufacture generally follows the known principles of ceramic fabrication. The preparation of a superconductive Ba—La—Cu—O compound, for example, in accordance with the present invention typically involves the following manufacturing steps:

Preparing aqueous solutions of the respective nitrates of barium, lanthanum and copper and coprecipitation thereof in their appropriate ratios, adding the coprecipitate to oxalic acid and forming an intimate mixture of the respective oxalates.

decomposing the precipitate and causing a solid-state reaction by heating the precipitate to a temperature between 500 and 1200° C. for one to eight hours.

pressing the resulting product at a pressure of about 4 kbar to form pellets.

re-heating the pellets to a temperature between 500 and 900° C. for one half hour to three hours for sintering.

It will be evident to those skilled in the art that if the partial substitution of lanthanum by another alkaline earth element, such as strontium or calcium, is desired, the particular nitrate thereof will have to be used in place of the barium nitrate of the example process described above. Also, if the copper of this example is to be replaced by another transition metal, the nitrate thereof will obviously have to be employed. Other precursors of metal oxides, such as carbonates or hydroxides, can be chosen in accordance with known principles.

Experiments have shown that the partial contents of the individual compounds in the starting composition play an important role in the formation of the phases present in the final product. While, as mentioned above, the final Ba—La—Cu—O system obtained generally contains the said three phases, with the second phase being present only in a very small amount, the partial substitution of lanthanum by strontium or calcium (and perhaps beryllium) will result in only one phase existing in the final $La_{2-x}Sr_xCuO_{4-y}$ or $La_{2-x}Ca_xCuO_{4-y}$, respectively, provided x<0.3.

With a ratio of 1:1 for the respective (Ba, La) and Cu contents, it is expected that the three phases will occur in the final product. Setting aside the second phase, i.e. the CuO phase whose amount is negligible, the relative volume amounts of the other two phases are dependent on the barium content in the $La_{2-x}Ba_xCuO_{4-y}$ complex. At the 1:1 ratio and with an x=0.02, the onset of a localization transition is observed, i.e., the resistivity increases with decreasing temperature, and there is no superconductivity.

With x=0.1 at the same 1:1 starting ratio, there is a resistivity drop at the very high critical temperature of 35° K.

With a (Ba, La) versus Cu ratio of 2:1 in the starting composition, the composition of the $La_2CuO_4$:Ba phase, which appears to be responsible for the superconductivity, is imitated, with the result that now only two phases are present, the CuO phase not existing. With a barium content of x=0.15, the resistivity drop occurs at $T_c$=26° K.

The method for preparing these Ba—La—Cu—O sample complexes used two heat treatments for the precipitate at an elevated temperature for several hours. In the experiments carried out in connection with the present invention it was found that best results were obtained at 900° C. for a decomposition and reaction period of 5 hours, and again at 900° C. for a sintering period of one hour. These values apply to a 1:1 ratio composition as well as to a 2:1 ratio composition.

For the 2:1 ratio composition, a somewhat higher temperature is permissible owing to the higher melting point of the composition in the absence of excess copper oxide. However, a one-phase compound was not achieved by a high temperature treatment.

Conductivity Measurements (FIGS. 1-4)

The dc conductivity of representative Ba—La—Cu—O compositions was measured to determine their low temperature behavior and to observe their high $T_c$. These measurements were performed using the well known four-point probe technique, which is schematically illustrated in FIG. 1. Rectangular shaped samples 10 of $Ba_x, La_{5-x}, Cu_5O_{5(3-y)}$ were cut from sintered pellets, and provided with gold sputtered electrodes 12A and 12B, about 0.5 microns thick. Indium wires 14A and 14B contact electrodes 12A and 12B, respectively. The sample was contained in a continuous flow cryostat 16 (Leybold-Hereaus) and measurements were made over a temperature range 300-412° K.

Electrodes 12A and 12B are connected in a circuit including a current source 18 and a variable resistor 20. Indium leads 22A and 22B are pressed into contact with sample 10 and fixed with silver paint 24. Leads 22A, 22B are connected to a voltage reading instrument 26. Since the current and voltage are accurately determined, the resistivity of the sample 10 is then known. In the configuration used for these measurements, a computer was used to provide a computer-controlled fully-automatic system for temperature variation, data acquisition and processing.

Figure 2:
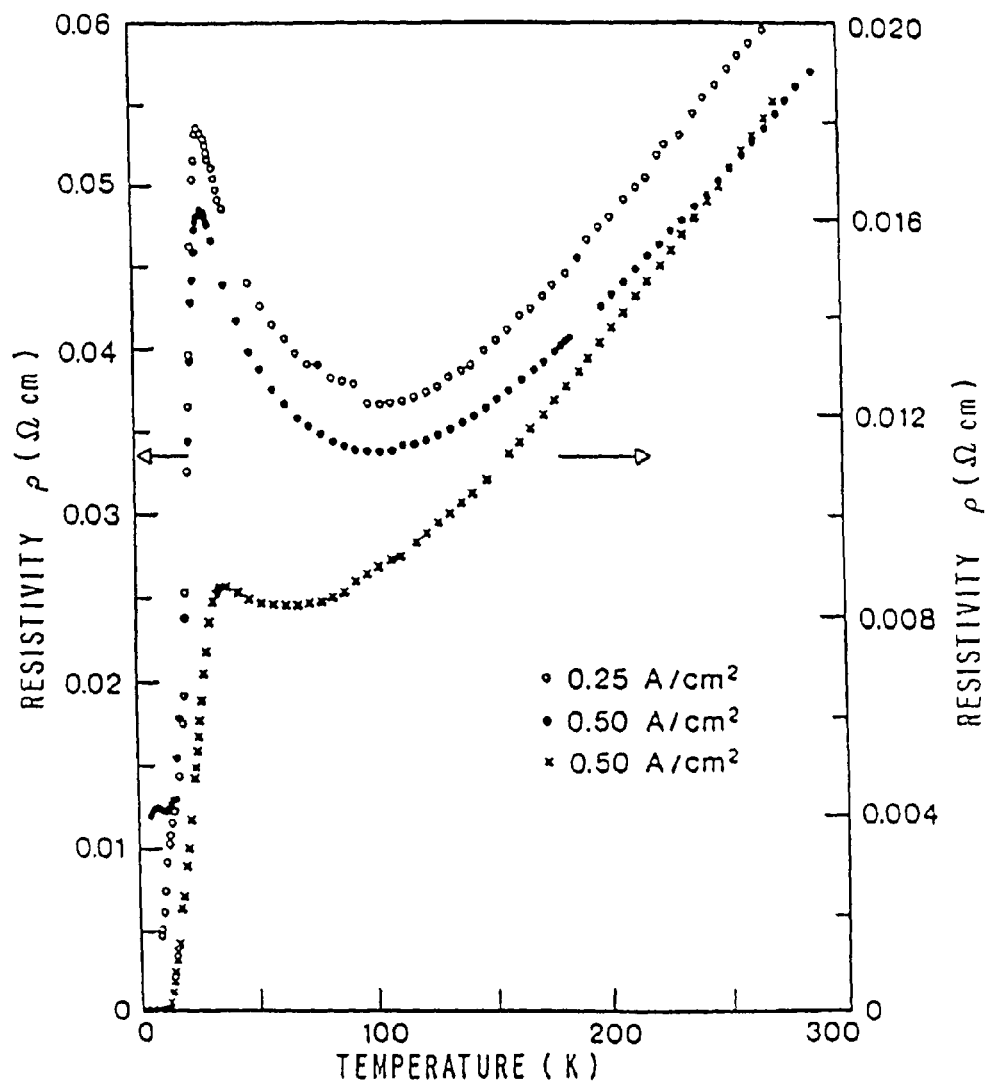
FIG. 2 is a plot of the temperature dependence and resistivity in the composition $Ba_xLa_{5-x}Cu_5O_{5(3-y)}$ for samples with x(Ba)=1 (upper two curves, left scale) and x(Ba)=0.75 (lower curve, right scale). The influence of current density through the composition is also shown.
Figure 3:
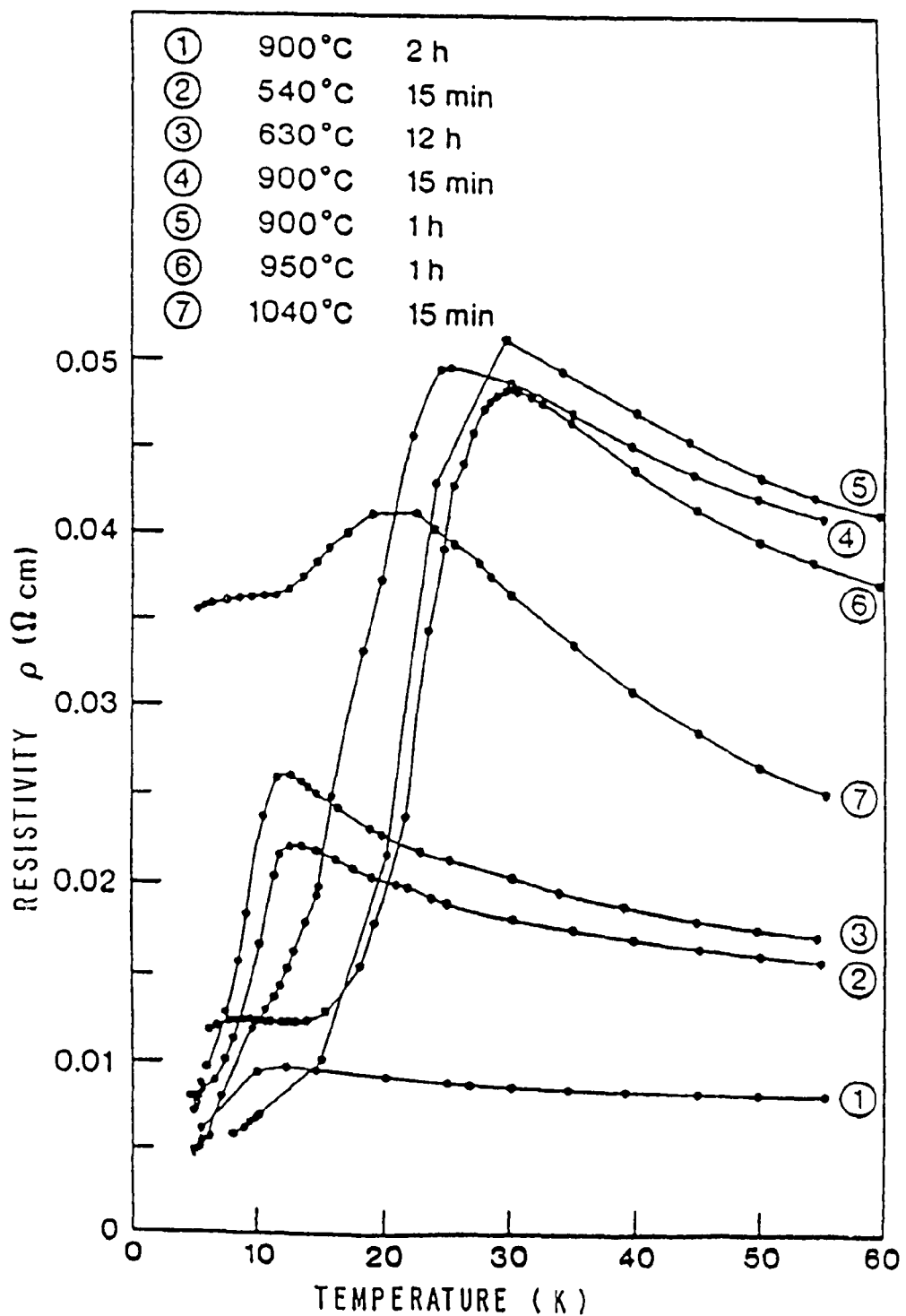
FIG. 3 is a plot of the low temperature dependence of resistivity in the composition $Ba_xLa_{5-x}Cu_5O_{5(3-y)}$ with x(Ba))=1, for different annealing conditions (i.e., temperature and oxygen partial pressure.

In FIG. 2, the low temperature dependence of resistivity (p, measured in ohm-cms) in the composition $Ba_xLa_{5-x}Cu_5O_{5(3-y)}$ is plotted for two different values of x. For the upper two curves, the value of x(Ba) is 1 and the left side vertical scale is used. For the lower curve, the value of x is 0.75, and the resistivity scale on the right hand side of the figure is used. The data is taken for different values of current density: 0.25 $A/cm^2$ for the top curve and 0.50 $A/cm^2$ for the middle and bottom curves.

For barium-doped samples with x(Ba)<1.0, for example with x<0.3, at current densities of 0.5 $A/cm^2$, a high-temperature metallic behavior with an increase in resistivity at low temperatures was found as depicted in FIG. 2. At still lower temperatures, a sharp drop in resistivity (>90%) occurred which for higher current densities became partially suppressed (FIG. 1 upper curves, left scale). This characteristic drop was studied as a function of the annealing conditions, i.e. temperature and oxygen partial pressure as shown in FIG. 2. For samples annealed in air, the transition from itinerant to localized behavior, as indicated by the minimum in resistivity in the 80° K range, was not found to be very pronounced. Annealing in a slightly reducing atmosphere, however, led to an increase in resistivity and a more pronounced localization effect. At the same time, the onset of the resistivity drop was shifted towards the 30° K region. Curves 4 and 5 (FIG. 3), recorded for samples treated at 900° C., show the occurrence of a shoulder at still lower temperatures, more pronounced in curve 6. At annealing temperatures of 1040° C., the highly conducting phase has almost vanished. Long annealing times and/or high temperatures will generally destroy the superconductivity.

Figure 4:
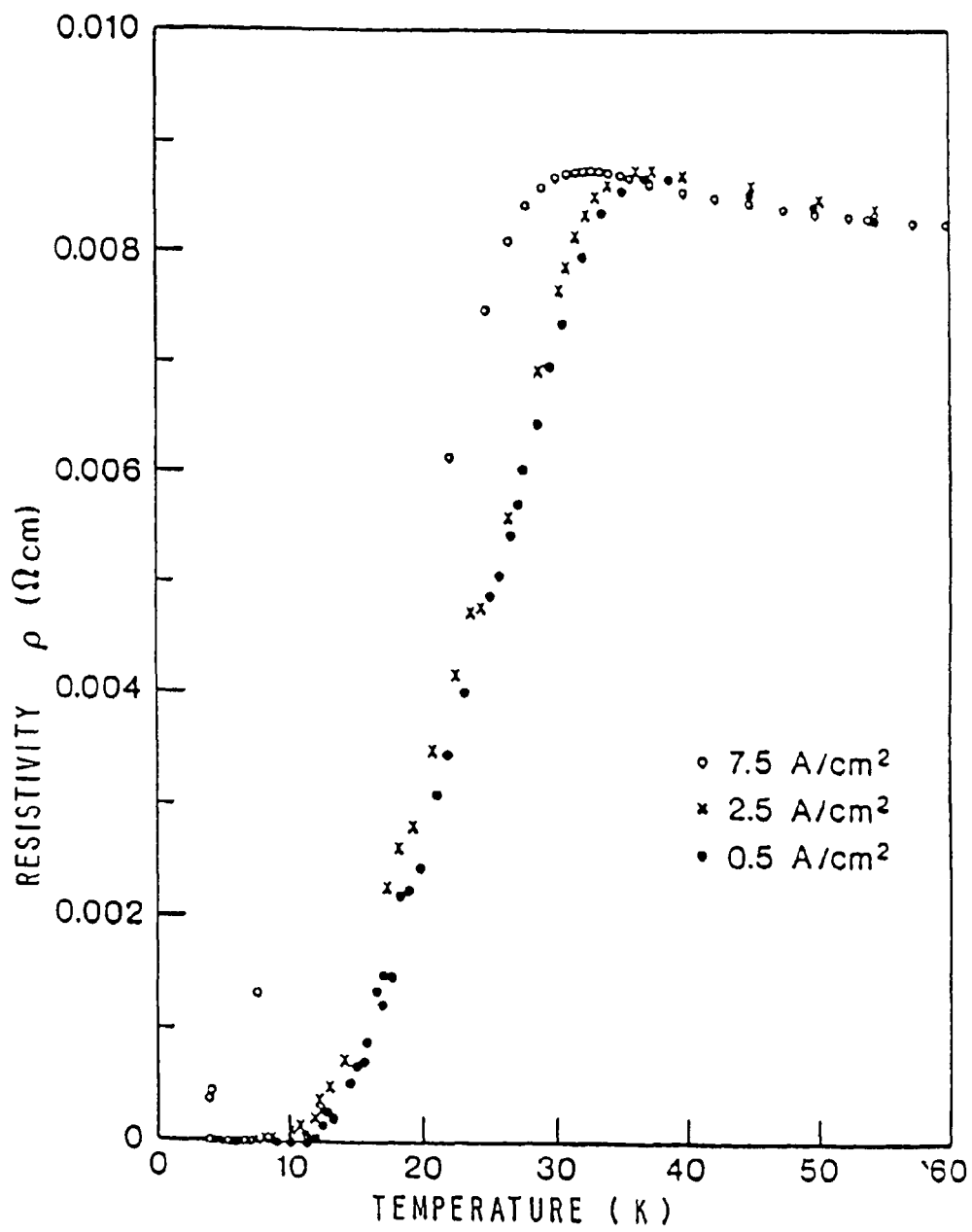
FIG. 4 is a plot of the low-temperature resistivity of the composition $Ba_xLa_{5-x}Cu_5O_{5(3-y)}$ with x(Ba)=0.75, recorded for different densities of electrical current through the composition.

The mixed-valent state of copper is of importance for electron-phonon coupling. Therefore, the concentration of electrons was varied by the Ba/La ratio. A typical curve for a sample with a lower Ba concentration of 0.75 is shown in FIG. 2 (right scale). Its resistivity decreases by at least three orders of magnitude, giving evidence for the bulk being superconducting below 13° K with an onset around 35° K, as shown in FIG. 4 on an expanded temperature scale. FIG. 4 also shows the influence of the current density, typical for granular compounds. Current densities of 7.5, 2.5, and 0.5 $A/cm^2$ were passed through the superconducting composition.

When cooling the samples from room temperature, the resistivity data first show a metal-like decrease. At low temperatures, a change to an increase occurs in the case of Ca substituted compounds and for the Ba-substituted samples. This increase is followed by a resistivity drop, showing the onset of superconductivity at 22±2° K and 33±2° K for the Ca and Ba compounds, respectively. In the Sr compound, the resistivity remains metallic down to the resistivity drop at 40±1° K. The presence of localization effects, however, depends strongly on alkaline-earth ion concentration and sample preparation, that is to say, on annealing conditions and also on the density, which have to be optimized. All samples with low concentrations of Ca, Sr, and Ba show a strong tendency to localization before the resistivity drops occur.

Apparently, the onset of the superconductivity, i.e. the value of the critical temperature $T_c$, is dependent on, among other parameters, the oxygen content of the final compound. It seems that for certain materials, an oxygen deficiency is necessary for the material to have a high-$T_c$ behavior. In accordance with the present invention, the method described above for making the $La_2CuO_4$:Ba complex is complemented by an annealing step during which the oxygen content of the final product can be adjusted. Of course, what was said in connection with the formation of the $La_2CuO_4$:Ba compound likewise applies to other compounds of the general formula $RE_2TMO_4$:AE (where AE is an alkaline earth element), such as, e.g. $Nd_2NiO_4$:Sr.

In the cases where a heat treatment for decomposition and reaction and/or for sintering was performed at a relatively low temperature, i.e., at no more than 950° C., the final product is subjected to an annealing step at about 900° C. for about one hour in a reducing atmosphere. It is assumed that the net effect of this annealing step is a removal of oxygen atoms from certain locations in the matrix of the $RE_2TMO_4$ complex, thus creating a distortion in its crystalline structure. The $O_2$ partial pressure for annealing in this case may be between $10^{-1}$ and $10^{-5}$ bar.

In those cases where a relatively high temperature (i.e., above 950° C.) is employed for the heat treatment, it might be advantageous to perform the annealing step in a slightly oxidizing atmosphere. This would make up for an assumed exaggerated removal of oxygen atoms from the system owing to the high temperature and resulting in a too severe distortion of the system's crystalline structure.

Resistivity and susceptibility measurements as a function of temperature of $Sr^{2+}$ and $Ca^{2+}$-doped $La_2CuO_{4-y}$ ceramics show the same general tendency as the $Ba^{2+}$-doped samples: a drop in resistivity $\rho(T)$, and a crossover to diamagnetism at a slightly lower temperature. The samples containing $Sr^{2+}$ actually yielded a higher onset than those containing $Ba^{2+}$ and $Ca^{2+}$. Furthermore, the diamagnetic susceptibility is about three times as large as for the Ba samples. As the ionic radius of $Sr^{2+}$ nearly matches that of $La^{3+}$, it seems that the size effect does not cause the occurrence of superconductivity. On the contrary, it is rather adverse, as the data on $Ba^{2+}$ and $Ca^{2+}$ indicate.

The highest $T_c$ for each of the dopant ions investigated occurred for those concentrations where, at room temperature, the $RE_{2-x}TM_xO_{4-y}$ structure is close to the orthorhombic-tetragonal structural phase transition, which may be related to the substantial electron-phonon interaction enhanced by the substitution. The alkaline-earth substitution of the rare earth metal is clearly important, and quite likely creates TM ions with no $e_g$ Jahn-Teller orbitals. Therefore, the absence of these Jahn-Teller orbitals, that is, Jahn-Teller holes near the Fermi energy, probably plays an important role in the $T_c$ enhancement.

While examples have been given using different transition metal elements in the superconducting compositions, copper oxide compositions having mixed valence appear to be unique and of particular importance, having superconducting properties at temperatures in excess of 26° K. These mixed valent copper compositions can include a rare earth element and/or a rare earth-like element which can be substituted for by an alkaline earth element. The amount of oxygen in these compositions will vary depending upon the mode of preparation and will be such as to meet the valence requirements of the composition. These copper-based compositions have a layer-like structure, often of a perovskite type. For a more detailed description of some of the types of crystallographic structures that may result, reference is made to the aforementioned publication by Michel and Raveau in Rev. Chim. Min. 21, 407 (1984), and to C. Michel et al, Mat. Res. Bull., Vol. 20, 667-671 (1985).

While the invention has been described with respect to particular embodiments thereof, it will be apparent to those of skill in the art that variations can be made therein without departing from the spirit and scope of the present invention. For example, while the range of compositions includes rare earth elements and transition metal elements, the ratios of these elements can be varied because the crystalline structure can accommodate vacancies of these elements and still retain a layer-like structural phase exhibiting superconductivy.

Further, the stoichiometry or degree of non-stoichiometry of oxygen content (i.e., oxygen deficit or surplus) of these compositions can be varied by using reducing or oxidizing atmospheres during formation of the compounds and by using different doping amounts in the rare earth and transition metal sites of the crystal structure. This type of distortion of the crystal structure and the many forms that it can encompass are readily apparent from reference to the aforementioned Michel and Raveau publications. Thus, the invention broadly relates to mixed (doped) transition metal oxides having a layer-like structure that exhibit superconducting behavior at temperatures in excess of 26° K. Of these materials, a mixed copper oxide having multi-valent states provides high $T_c$ and favorable superconducting properties.

Having thus described our invention what we claim as new and desire to secure as Letters Patent, is:

1. An apparatus comprising: a composition of matter having a $T_c$ greater than or equal to 26° K capable of carrying a superconducting current, said composition comprising at least one each of a rare earth, an alkaline earth, and copper oxide.

2. A device comprising: an element capable of carrying a superconductive current comprising a composition of matter having a $T_c$ greater than or equal to 26° K, said composition comprising at least one each of a IIIB element, an alkaline earth, and copper oxide and a temperature controller capable of mantaining said composition of matter at a temperature less than said $T_c$.

3. An apparatus comprising: an element capable of carrying a superconductive current comprising a composition of matter having a $T_c$ greater than or equal to 26° K, said composition comprising at least one each of a rare earth, an alkaline earth, and copper oxide.

4. A device comprising: an element capable of carrying a superconductive current comprising a composition of matter having a $T_c$ greater than or equal to 26° K, said composition comprising at least one each of a rare earth, and copper oxide.

5. A device comprising: an element capable of carrying a superconductive current comprising a composition of matter having a $T_c$ greater than or equal to 26° K, said composition comprising at least one each of a IIIB element, and copper oxide.

6. A superconducting apparatus comprising: a composition having a transition temperature greater than or equal to 28° K, the composition capable of exhibiting multivalent states comprising at least one phase that exhibits superconductivity at temperature greater than or equal to 26° K, a temperature controller capable of maintaining said composition at said temperature to exhibit said superconductivity and a current source capable of passing an electrical superconducting current through said composition while exhibiting said superconductivity, and said composition comprising a transition metal, oxygen and at least one element selected from the group consisting of a first element group, a second element group and combinations thereof, wherein said first element group comprises rare earth elements rare earth-like elements and Group IIIB elements and said second element group comprises alkaline earth elements and Group IIA elements.

7. The superconducting apparatus of claim 6, further including an alkaline earth element substituted for at least one atom of said rare earth or rare earth-like element in said composition.

8. The superconducting apparatus of claim 7, where said transition metal is Cu.

9. The superconducting apparatus of claim 8, where said alkaline earth element is selected from the group consisting of B, Ca, Ba, and Sr.

10. The superconducting apparatus of claim 7, where said rare earth or rare earth-like element is selected from the group consisting of La, Nd, and Ce.

11. The superconducting apparatus of claim 7, where said phase is crystalline with a perovskite-like structure.

12. The superconducting apparatus of claim 6, where said transition metal element is selected from the group consisting of Cu, Ni, and Cr.

13. The superconducting apparatus of claim 6, where said phase is crystalline with a perovskite-like structure.

14. The superconducting apparatus of claim 6, where said phase exhibits a layer-like crystalline structure.

15. The superconducting apparatus of claim 6, where said phase is a mixed copper oxide phase.

16. The superconducting apparatus of claim 6, where said composition is comprised of mixed oxides with alkaline earth doping.

17. A superconducting combination, comprising: a superconductive oxide having a transition temperature greater than or equal to 26° K,
a current source capable of passing a superconducting electrical current through said composition while said composition is at a temperature greater than or equal to 26° K and less than said transition temperature,
a temperature controller capable of cooling said composition to a superconducting state at a temperature greater than or equal to 26° K, and;
said superconducting oxide comprises a transition metal and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

18. The combination of claim 17, where said superconductive oxide comprises a layered structure.

19. The combination of claim 17, where said superconductive oxide comprises Cu-oxide.

20. The combination of claim 17, where said superconductive oxide comprises a multivalent transition metal.

21. The combination of claim 20, where said transition metal is Cu.

22. The combination of claim 20, where said superconductive oxide comprises a layered structure.

23. The combination of claim 20, where said superconductive oxide comprises a multiphase material comprising a superconductive phase.

24. The combination of claim 20, where said additional element is a rare earth or an element comprising a rare earth characteristic.

25. The combination of claim 17, where said superconductive oxide comprises a perovskite-like superconducting phase.

26. The combination of claim 17, where said superconductive oxide comprises a substituted transition metal oxide.

27. The combination of claim 26, where said substituted transition metal oxide comprises a multivalent transition metal element.

28. The combination of claim 26, where said substituted transition metal oxide is an oxide of copper.

29. The combination of claim 26, where said substituted transition metal oxide has a layer-like structure.

30. The combination of claim 26, where said substituted transition metal oxide has a structure comprising a layered characteristic.

31. The combination of claim 17, where said composition includes a substantially perovskite superconducting phase.

32. The combination of claim 17, where said composition includes a superconducting phase comprising a perovskite characteristic.

33. The combination of claim 17, where said composition includes a superconducting phase comprising a perovskite related structure.

34. An apparatus comprising:
a transition metal oxide having a phase therein which exhibits a superconducting state at a critical temperature greater than or equal to of 26° K,
a temperature controller capable of lowering the temperature of said material at least to said critical temperature to produce said superconducting state in said phase,
a current source capable of passing an electrical superconducting current through said transition metal oxide while it is in said superconducting state, and;
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

35. The apparatus of claim 34, where said transition metal oxide is comprised of a transition metal capable of exhibiting multivalent states.

36. The apparatus of claim 34, where said transition metal oxide is comprised of a Cu oxide.

37. A superconducting apparatus comprising: a composition having a transition temperature greater than or equal to 26° K, said composition being a substituted transition metal oxide comprising a superconducting phase having a structure which is structurally substantially similar to the orthorhombic-tetragonal phase of said composition, a temperature controller capable of maintaining said composition at a temperature greater than or equal to said transition temperature to put said composition in a superconducting state; and a current source capable of passing current through said composition while in said superconducting state, said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

38. The superconducting apparatus of claim 37, where said composition has a crystalline structure which enhances electron-phonon interactions to produce superconductivity at a temperature greater than or equal to 26° K.

39. The superconducting apparatus of claim 38, where said crystalline structure is layer-like, enhancing the number of Jahn-Teller polarons in said composition.

40. The superconducting apparatus of claim 38, where said crystalline structure comprises a layered characteristic, enhancing the number of Jahn-Teller polarons in said composite.

41. A superconducting apparatus, comprising: a composition having a transition temperature greater than or equal to 26° K, said composition being a substituted Cu-oxide including a superconducting phase having a structure which is structurally substantially similar to the orthorhombic-tetragonal phase of said composition, a temperature controller capable of maintaining said composition at a temperature greater than or equal to said transition temperature to put said composition in a superconducting state; and a current source capable of passing current through said composition while in said superconducting state,
wherein said substituted Cu-oxide includes a rare earth or rare earth-like element.

42. A superconducting apparatus, comprising: a composition having a transition temperature greater than or equal to 26° K, said composition being a substituted Cu-oxide including a superconducting phase having a structure which is structurally substantially similar to the orthorhombic-tetragonal phase of said composition, a temperature controller capable of maintaining said composition at a temperature greater than or equal to said transition temperature to put said composition in a superconducting state; and a current source capable of passing current through said composition while in said superconducting state, wherein said substituted Cu-oxide includes an alkaline earth element.

43. The superconducting apparatus of claim 42, where said alkaline earth element is atomically large with respect to Cu.

44. A superconducting apparatus comprising: a an element comprising a composition capable of carrying a superconductive current flowing therein having a superconducting onset temperature greater than or equal to 26° K, the composition being comprised of a copper oxide doped with an alkaline earth element where the concentration of said alkaline earth element is near to the concentration of said alkaline earth element where the superconducting copper oxide phase in said composition undergoes an orthorhombic to tetragonal structural phase transition.

45. A superconducting apparatus comprising: a composition having a superconducting onset temperature greater than or equal to 26° K, composition being comprised of a mixed copper oxide doped with an element chosen to result in $Cu^{3+}$ ions in said composition and a means current source capable of passing a superconducting current through said superconducting composition, and said composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

46. A superconducting appraratus comprising: an element comprising a superconducting onset temperature greater than or equal to 26° K, a composition being comprised of a mixed copper oxide doped with an element chosen to result in $Cu^{3+}$ ions in said composition and a current source capable of passing a superconducting current through said superconducting composition wherein said doping element includes an alkaline earth element.

47. A combination comprising:
a composition having a superconducting onset temperature greater than or equal to 26° K, said composition being comprised of a substituted transition metal oxide exhibiting mixed valence states and at least one other element in its crystalline structure.
a current source capable of passing a superconducting electrical current through said composition while said composition is at a temperature greater than or equal to 26° K and less than said superconducting onset temperature,
a temperature controller capable of cooling said composition to a superconducting state at a temperature greater than or equal to 26° K, and
said at least one other element comprising at least one element selected from the group consisting of a first element group, a second element group and combinations thereof,
wherein said first element group comprises rare earth elements, rare earth-like elements and Group IIIB elements and said second element group comprises alkaline earth elements and Group IIA elements.

48. The combination of claim 47, wherein said composition is a copper oxide and said at least one other element is an element which results in $Cu^{3+}$ ions in said composition.

49. The combination of claim 47, wherein said composition is a copper oxide and said at least one other element is an element chosen to result in the presence of both $Cu^{2+}$ and $Cu^{3+}$ ions in said composition.

50. A combination comprising:
a composition having a superconducting onset temperature greater than or equal to 26° K, said composition comprising a substituted copper oxide exhibiting mixed valence states and at least one other element in its crystalline structure,
a current source capable of passing a superconducting electrical current through said composition while said composition is at a temperature greater than or equal to 26° K and less than said superconducting onset temperature,
a temperature controller capable of cooling said composition to a superconducting state at a temperature greater than or equal to 26° K., and
wherein said at least one other element is an alkaline earth element.

51. An apparatus comprising: a superconductor exhibiting a superconducting onset at an onset temperature greater than or equal to 26° K, said superconductor being comprised of at least four elements, none of which is itself superconducting at a temperature greater than or equal to 26° K, a temperature controller capable of maintaining said superconductor at an operating temperature in excess of said onset temperature to maintain said superconductor in a superconducting state and a current source capable of passing current through said superconductor while in said superconducting state and said superconductor comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

52. The apparatus of claim 51, where said superconductor comprises a layered structure.

53. An apparatus comprising: a superconducting onset temperature greater than or equal to 26° K, said superconductor being a doped transition metal oxide, where said transition metal is itself non-superconducting and a current source capable of passing a superconducting electric current through said composition said transition metal oxide comprising at least one element selected from the group consisting of a first element group, a second element group and combinations thereof, wherein said first element group comprises rare earth elements rare earth-like elements and Group IIIB elements and said second element group comprises alkaline earth elements and Group IIA elements.

54. The apparatus of claim 53, where said doped transition metal oxide is multivalent in said superconductor.

55. The apparatus of claim 54, where said transition metal is Cu.

56. The apparatus of claim 53, further including an element which creates a mixed valent state of said transition metal.

57. An apparatus comprising: a superconductor having a superconducting onset temperature greater than or equal to 26° K, said superconductor being an oxide having multivalent oxidation states and including a metal, said oxide having a crystalline structure which is oxygen deficient and a current source capable of passing a superconducting electric current through said superconductor, said metal being a transition metal, and comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

58. The apparatus of claim 57, where said transition metal is Cu.

59. A superconductive apparatus comprising: a superconductive composition comprised of a transition metal oxide having substitutions therein, the amount of said substitutions being sufficient to produce sufficient electron-phonon interactions in said composition that said composition exhibits a superconducting onset at temperatures greater than or equal to 26° K, and a source of current capable of passing a superconducting electric current through said superconductor, and said superconductive composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

60. The superconductive apparatus of claim 59, where said transition metal oxide is multivalent in said composition.

61. The superconductive apparatus of claim 59, where said transition metal is Cu.

62. The superconductive apparatus of claim 59, where said substitutions include a rare earth or an element comprising a rare earth characteristic.

63. A superconductive apparatus comprising: a superconductive composition comprised of a transition metal oxide having substitutions therein, the amount of said substitutions being sufficient to produce sufficient electron-phonon interactions in said composition that said composition exhibits a superconducting onset at temperatures greater than or equal to 26° K, and a source of current capable of passing a superconducting electric current through said superconductor, wherein said substitutions include an alkaline earth element.

64. A superconductive apparatus comprising: a superconductive composition comprised of a transition metal oxide having substitutions therein, the amount of said substitutions being sufficient to produce sufficient electron-phonon interactions in said composition that said composition exhibits a superconducting onset at temperatures greater than or equal to 26° K, and a source of current capable of passing a superconducting electric current through said superconductor, wherein said substitutions include a rare earth or rare earth-like element.

65. A superconductive apparatus comprising: an element comprising a composition capable of carrying a superconductive current flowing therein comprising a layer-like crystalline structure and at least one additional element substituted in said crystalline structure, said structure being oxygen deficient and exhibiting a superconducting onset temperature greater than or equal to 26° K, and said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

66. The superconductor of claim 65, where said additional element creates a mixed valent state of said transition metal in said superconductor.

67. A combination, comprising:
a transition metal oxide having an superconducting onset temperature greater than about 26° K and having an oxygen deficiency, said transition metal being non-superconducting at said superconducting onset temperature and said oxide having multivalent states,
a current source capable of an electrical superconducting current through said oxide while said oxide is at a temperature greater than or equal to 26° K, and
a temperature controller capable of cooling said oxide in a superconducting state at a temperature greater than or equal to 26° K, and
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

68. The combination of claim 67, where said transition metal is Cu.

69. A combination comprising:
a superconducting oxide having a superconducting onset temperature greater than or equal to 26° K and containing at least 3 elements which are non-superconducting at said onset temperature,
a current source capable of a superconducting current through said oxide while said oxide is maintained at a temperature greater than or equal to 26° K, and
a temperature controller capable of maintaining said oxide in a superconducting state at a temperature greater than or equal to 26° K and less than said superconductive onset temperature, and
said superconducting oxide comprising a transition metal and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

70. A combination according to claim 69, wherein said superconductive oxide can be made according to known principles of ceramic science.

71. A combination comprising:
a transition metal oxide superconductor having a superconductor onset temperature greater than about 26° K including an element which results in a mixed valent state in said oxide, said oxide being crystalline and having a layer-like structure,
a current source capable of a superconducting current through said transition metal oxide while it is maintained at a temperature greater than or equal to 26° K and less than said superconducting onset temperature,
a temperature controller capable of cooling said transition metal oxide to a superconductive state at a temperature greater than or equal to 26° K and less than said superconducting onset temperature, and
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

72. A combination according to claim 71 wherein said transition metal is copper.

73. A combination according to claim 71 wherein said transion metal oxide is copper oxide.

74. A combination comprising:
a ceramic-like material having an onset of superconductivity at an onset temperature greater than or equal to 26° K,
a current source capable of providing a superconducting electrical current through said ceramic-like material while said material is maintained at a temperature greater than or equal to 26° K and less than said onset temperature,
a temperature controller capable of cooling said superconducting ceramic-like material to a superconductive state at a temperature greater than or equal to 26° K and less than said onset temperature, said material being superconductive at temperatures below said onset temperature and a ceramic at temperatures above said onset temperature, and
said ceramic-like material comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

75. A combination according to claim 74, wherein said ceramic-like material can be made according to known principles of ceramic science.

76. An apparatus comprising; a transition metal oxide, and at least one additional element, said superconductor having a distorted crystalline structure characterized by an oxygen deficiency and exhibiting a superconducting onset temperature greater than or equal to of 26° K, a source of current capable of passing a superconducting electric current in said transition metal oxide, and a cooling apparatus capable of maintaining said transition metal oxide below said onset temperature at a temperature greater than or equal to 26° K, and
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

77. The apparatus of claim 76, where said transition metal is Cu.

78. An apparatus comprising: a transition metal oxide and at least one additional element, said superconductor having a distorted crystalline structure characterized by an oxygen excess and exhibiting a superconducting onset temperature greater than or equal to 26° K, a source of current capable of passing a superconducting electric current in said transition metal oxide, and a cooling apparatus capable of maintaining said transition metal oxide below said onset temperature and at a temperature greater than or equal to of 26° K, and said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

79. The apparatus of claim 78, where said transition metal is Cu.

80. A combination, comprising:
a mixed transition metal oxide composition having enhanced polaron formation, said composition including an element causing said transition metal to have a mixed valent state in said composition, said composition further having a distorted octahedral oxygen environment leading to a $T_c$ greater than or equal to 26° K,
a current source capable of providing a superconducting current through said composition at temperatures greater than or equal to 26° K and less than said $T_c$, and
a temperature controller capable of cooling said composition to a temperature greater than or equal to 26° K and less than said $T_c$ and
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

81. An apparatus comprising: a composition exhibiting superconductivity at temperatures greater than or equal to 26° K, said composition being a ceramic-like material in the RE-AE-TM-O system, where RE is a rare earth or near rare earth element, AE is an alkaline earth element, TM is a multivalent transition metal element having at least two valence states in said composition, and O is oxygen, the ratio of the amounts of said transition metal in said two valence states being determined by the ratio RE:AE, a source of current capable of passing a superconducting electric current in said transition metal oxide, and a cooling apparatus capable of maintaining said transition metal oxide below said onset temperature and at a temperature greater than or equal to 26° K.

82. An apparatus comprising: a superconductive composition having a transition temperature greater than or equal to 26° K, the composition including a multivalent transition metal oxide and at least one additional element, said composition having a distorted orthorhombic crystalline structure, a source of current capable of passing a superconducting electric current in said transition metal oxide, and a cooling apparatus capable of maintaining said transition metal oxide below said onset temperature and at a temperature greater than or equal to 26° K, and said at least one additional element comprising at least one element selected from the group consisting of a first element group, a second element group and combinations thereof, wherein said first element group comprises rare earth elements rare earth-like elements and Group IIIB elements and said second element group comprises alkaline earth elements and Group IIA elements.

83. The apparatus of claim 82, where said transition metal oxide is a mixed copper oxide.

84. An apparatus comprising: a superconductive composition having a transition temperature greater than or equal to 26° K, the composition including a multivalent transition metal oxide and at least one additional element, said composition having a distorted orthorhombic crystalline structure, a source of current capable of passing a superconducting electric current in said transition metal oxide, and a cooling apparatus capable of maintaining said transition metal oxide below said onset temperature and at a temperature greater than or equal to 26° K, wherein said one additional element is an alkaline earth element.

85. A superconductive combination, comprising:
a superconducting composition exhibiting a superconducting transition temperature greater than or equal to 26° K, said composition being a transition metal oxide having a distorted orthorhombic crystalline structure,
a current source capable of passing a superconducting electrical current through said composition while said composition is at a temperature greater than or equal to 26° K and less than said superconducting transition temperature, and
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

86. The combination of claim 85, where said transition metal oxide is a mixed copper oxide.

87. A superconductive combination, comprising:
a superconducting composition exhibiting a superconducting transition temperature greater than or equal to 26° K, said composition being a transition metal oxide having a distorted orthorhombic crystalline structure, and
a current source capable of passing a superconducting electrical current through said composition while said composition is at a temperature greater than or equal to 26° K and less than said superconducting transition temperature;
said transition metal oxide is a mixed copper oxide;
wherein said mixed copper oxide includes an alkaline earth element.

88. The combination of claim 87, where said mixed copper oxide further includes a rare earth or rare earth-like element.

89. The combination of claim 87, where said mixed copper oxide further includes a rare earth or Group III B element.

90. The combination of claim 87, where said mixed copper oxide further includes a rare earth or an element comprising a rare earth characteristic.

91. A combination according to claim 90, wherein said mixed copper oxide can be made by known principles of ceramic science.

92. An apparatus comprising: an element capable of caving a superconductive current comprising comprising a composition of matter comprising a superconducting onset temperature greater than or equal to 26° K, said composition of matter made by a method comprising the steps of:
preparing powders of oxygen-containing compounds of a rare earth or rare earth-like element, an alkaline earth element, and copper,
mixing said compounds and firing said mixture to create a mixed copper oxide composition including said alkaline earth element and said rare earth or rare earth-like element, and
annealing said mixed copper oxide composition at an elevated temperature less than about 950° C. in an atmosphere including oxygen to produce a superconducting composition having a mixed copper oxide phase exhibiting a superconducting onset temperature greater than or equal to 26° K, said superconducting composition having a layer-like crystalline structure after said annealing step.

93. The apparatus of claim 92, where the amount of oxygen incorporated into said composition is adjusted by said annealing step, the amount of oxygen therein affecting the critical temperature $T_c$ of the superconducting composition.

94. An apparatus comprising: an element capable of caving a superconductive current comprising a composition of matter for carrying a superconductive current comprising a superconducting onset temperature greater than or equal to 26° K, said superconductor being comprised of a rare earth or rare earth-like element (RE), an alkaline earth element (AE), copper (CU), and oxygen (O) and having the general formula RE-AE-CU-O, said composition being made by a method including the steps of combining said rare earth or rare earth-like element, said alkaline earth element and said copper in the presence of oxygen to produce a mixed copper oxide including said rare earth or rare earth-like element and said alkaline earth element therein, and heating said mixed copper oxide to produce a superconductor having a crystalline layer-like structure and exhibiting a superconducting onset temperature greater than or equal to 26° K the critical transition temperature of said superconductor being dependent on the amount of said alkaline earth element therein.

95. The apparatus of claim 94, where said heating step is done in an atmosphere including oxygen.

96. A combination, comprising:
a mixed copper oxide composition including an alkaline earth element (AE) and a rare earth or rare earth-like element (RE), said composition having a layer-like crystalline structure and multi-valent oxidation states, said composition exhibiting a substantially zero resistance to the flow of electrical current therethrough when cooled to a superconducting state at a temperature greater than or equal to 26° K, said mixed copper oxide having a superconducting onset temperature greater than or equal to 26° K, and
a current source capable of passing an electrical superconducting current through said composition when said composition exhibits substantially zero resistance at a temperature greater than or equal to 26° K and less than said onset temperature.

97. The combination of claim 96, where the ratio (AE,RE):Cu is substantially 1:1.

98. The combination of claim 96, where the ratio (AE,RE):Cu is substantially 2:1.

99. The combination of claim 96, wherein said crystalline structure is perovskite-like.

100. The combination of claim 96, where said mixed copper oxide composition has a non-stoichiometric amount of oxygen therein.

101. The combination of claim 96, where said crystal structure is substantially perovskite.

102. An apparatus comprising: an element capable of carrying a superconducting current comprising a superconducting onset temperature greater than or equal to 26° K, said superconductor being comprised of a rare earth or rare earth-like element (RE), an alkaline earth element (AE), a transition metal element (TM), and Oxygen (O) and having the general formula RE-AE-TM-O, said superconductor being made by a method including the steps of combining said rare earth or rare earth-like element, said alkaline earth element and said transition metal element in the presence of oxygen to produce a mixed transition metal oxide including said rare earth or rare earth-like element and said alkaline earth element therein, and heating said mixed transition metal oxide to produce superconductor having a crystalline layer-like structure and exhibiting a superconducting onset temperature greater than or equal to 26° K, said superconductor having a non-stoichiometric amount of oxygen therein.

103. The apparatus of claim 102, where said transition metal is copper.

104. A superconducting combination, comprising:
a mixed transition metal oxide composition containing a non-stoichiometric amount of oxygen therein, a transition metal and at least one additional element, said composition having substantially zero resistance to the flow of electricity therethrough when cooled to a superconducting state at a temperature greater than or equal to 26° K, said mixed transition metal oxide has a superconducting onset temperature greater than or equal to 26° K, and
current source capable of passing an electrical superconducting current through said composition when said composition is in said superconducting state at a temperature greater than or equal to 26° K, and less than said superconducting onset temperature, and
said mixed transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

105. The combination of claim 104, where said transition metal is copper.

106. An apparatus comprising:
a composition including a transition metal, a rare earth or rare earth-like element, an alkaline earth element, and oxygen, where said composition is a mixed transition metal oxide having a non-stoichiometric amount of oxygen therein and exhibiting a superconducting onset temperature greater than or equal to 26° K,
a temperature controller capable of maintaining said composition to said superconducting state at a temperature greater than or equal to 26° K and less than said superconducting onset temperature, and
a current source capable of passing an electrical current through said composition while said composition is in said superconducting state.

107. The apparatus of claim 106, where said transition metal is copper.

108. An apparatus comprising:
a composition exhibiting a superconductive state at a temperature greater than or equal to 26° K,
a cooler capable of cooling said composition to a temperature greater than or equal to 26° K at which temperature said composition exhibits said superconductive state, and
a current source capable of passing an electrical current through said composition while said composition is in said superconductive state, and
said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

109. The apparatus of claim 108, wherein said transition metal is copper.

110. The apparatus of claim 108, where said transition metal is multivalent.

111. An apparatus according to claim 108 wherein said composition is layered.

112. A combination, comprising:
a composition exhibiting the onset of a DC substantially zero resistance state at an onset temperature in excess of 30° K, and
a current source capable of passing an electrical current through said composition while it is in said substantially zero resistance state, and
said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

113. The combination of claim 112, where said composition is a copper oxide.

114. An apparatus, comprising:
a mixed transition metal oxide material exhibiting an onset of superconductivity at an onset temperature greater than or equal to 26° K, and
a current source for producing an electrical current through said copper oxide material while it is in a superconducting state at a temperature greater than or equal to 26'K, and
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

115. The apparatus of claim 114, where said mixed transition metal oxide material exhibits a layer-like crystalline structure.

116. An apparatus according to claim 115 wherein said transition metal oxide is copper oxide.

117. The apparatus of claim 114, where said said mixed transition metal oxide material exhibits a mixed valence state.

118. An apparatus according to claim 117 wherein said transition metal oxide is copper oxide.

119. The apparatus of claim 114, where said transition oxide material exhibits a substantially layered crystalline structure.

120. The apparatus of claim 114, where said copper oxide material exhibits a crystalline structure comprising a layered characteristic.

121. An apparatus according to claim 120, wherein said copper oxide material can be made by known principles of ceramic science.

122. A superconductive apparatus for causing electric-current flow in a superconductive state at a temperature greater than or equal to 26° K, comprising:
(a) a superconductor element made of a superconductive composition, the superconductive composition comprising a compound having a layer-type perovskite-like crystal structure, the composition having a superconductor transition temperature $T_c$ of greater than or equal to 26° K;
(b) a current source capable of maintaining the superconductor element at a temperature greater than or equal to 26° K and below the superconductor transition temperature $T_c$ of the superconductive composition;
(c) a temperature controller capable of using an electric current to flow in the superconductor element, and
said superconductive composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

123. The superconductive apparatus according to claim 122 in which the compound of the superconductive composition comprises a copper-oxide and at least one rare-earth or rare-earth-like element and at least one alkaline-earth element.

124. The superconductive apparatus according to claim 123 in which the rare-earth or rare-earth-like element is lanthanum.

125. The superconductive apparatus according to claim 123 in which the alkaline-earth element is barium.

126. The superconductive apparatus according to claim 122 in which the compound of the superconductive composition comprises a mixed valent transition metal ions.

127. The superconductive apparatus according to claim 126 in which the compound comprises at least one element in a nonstoichiometric atomic proportion.

128. The superconductive apparatus according to claim 127 in which oxygen is present in the compound in a nonstoichiometric atomic proportion.

129. An apparatus according to claim 122 wherein said transition metal oxide is copper oxide.

130. A superconductive apparatus for conducting an electric current essentially without resistive losses, comprising:
(a) a superconductor element made of a superconductive composition, the superconductive composition consisting essentially of a copper-oxide compound having a layer-type perovskite-like crystal structure, the copper-oxide compound including at least one rare-earth or rare-earth-like element and at least one alkaline-earth element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{q=o}$, the transition-onset temperature $T_c$ being greater than or equal to 26° K;
(b) a temperature controller capable of maintaining the superconductor element at a temperature below the effectively-zero-bulk-resistivity intercept temperature $T_{q=o}$ of the superconductive composition; and
(c) a current source capable of causing an electric current to flow in the superconductor element.

131. The superconductive apparatus according to claim 130 in which the rare-earth or rare-earth-like element is lanthanum.

132. The superconductive apparatus according to claim 130 in which the alkaline-earth element is barium.

133. The superconductive apparatus according to claim 130 in which the copper-oxide compound of the superconductive composition includes mixed valent copper ions.

134. The superconductive apparatus according to claim 133 in which the copper-oxide compound includes at least one element in a nonstoichiometric atomic proportion.

135. The superconductive apparatus according to claim 134 in which oxygen is present in the copper-oxide compound in a nonstoichiometric atomic proportion.

136. A superconductive apparatus comprising: a composition having a transition temperature greater than or equal to 26° K, the composition comprising a transition metal element capable of exhibiting multivalent states and oxygen, including at least one phase that exhibits superconductivity at temperature greater than or equal to 26° K, a temperature controller capable of maintaining said composition at said temperature to exhibit said superconductivity and a current source for capable of passing an electrical superconducting current through said composition while exhibiting superconductivity, and the compositon comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

137. The superconductive apparatus of claim 136, where said composition has a perovskite structure.

138. A device comprising: an element capable of carrying a superconductive current comprising a superconducting transition metal oxide having a superconductive onset temperature greater than or equal to 26° K, a temperature controller capable of mantaining said superconducting transition metal oxide at a temperature less than said superconducting onset temperature, said superconductive transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

139. A device according to claim 138, wherein said superconductive transition metal oxide can be made according to known principles of ceramic science.

140. A device comprising: an element capable of carrying a superconductive current comprising a superconducting composition having a superconductive onset temperature greater than or equal to 26° K, a temperature controller capable of mantaining said superconducting composition at a temperature less than said superconducting onset temperature, and said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

141. A device according to claim 140, wherein said superconductive copper oxide can be made according to known principles of ceramic science.

142. A device according to claim 140 wherein said transition metal is copper.

143. A device comprising: an element capable of carrying a superconductive current comprising a superconducting oxide composition having a superconductive onset temperature greater than or equal to 26° K, a temperature controller capable of mantaining said superconducting copper oxide at a temperature less than said superconducting onset temperature, said composition comprising at least one each of rare earth, an alkaline earth, and copper.

144. A device according to claim 143, wherein said superconductive oxide composition can be made according to known principles of ceramic science.

145. A device comprising: an element capable of carrying a superconductive current comprising a superconducting oxide composition having a superconductive onset temperature greater than or equal to 26° K, a temperature controller capable of mantaining said superconducting copper oxide at a temperature less than said superconducting onset temperature, said composition comprising at least one each of a group IIIB element, an alkaline earth, and copper.

146. A device comprising: an element capable of carrying a superconductive current comprising a composition having a $T_c$ greater than or equal to 26° K, a temperature controller capable of mantaining said composition at a temperature less than said $T_c$, and said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

147. An apparatus comprising: an element capable of carrying a superconductive current comprising a composition having a $T_c$ greater than or equal to 26° K, and a temperature controller capable of maintaining said composition at a temperature less than said $T_c$, and said composition comprising a transition metal, oxygen and at least one element selected from the group consisting of a first element group, a second element group and combinations thereof, wherein said first element group comprises rare earth elements, are earth-like elements and Group IIIB elements and said second element group comprises alkaline earth elements and Group IIA elements.

148. A structure comprising: an element capable of carrying a superconductive current comprising a composition having a $T_c$ greater than or equal to 26° K and wherein said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

149. An apparatus comprising: an element capable of carrying a superconductive current comprising a composition having a $T_c$ greater than or equal to 26° K, and said composition comprising a transition metal, oxygen and at least one element selected from the group consisting of a first element group, a second element group and combinations thereof, wherein said first element group comprises rare earth elements rare earth-like elements and Group IIIB elements and said second element group comprises alkaline earth elements and Group IIA elements.

150. An invention according to claim 149, wherein said transition metal oxide can be made according to known principles of ceramic science.

151. A device comprising: an element capable of carrying a superconductive current comprising a copper oxide having a $T_c$ greater than or equal to 26° K, said copper oxide is capable of being maintained at a temperature less than said $T_c$, and said copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

152. An apparatus comprising: an element capable of carrying a superconductive current comprising a copper oxide having a $T_c$ greater than or equal to 26° K, a temperature controller capable of maintaining said copper oxide is at a temperature less than said $T_c$ and said copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

153. An apparatus according to claim 152, wherein said copper oxide can be made according to known principles of ceramic science.

154. A device comprising: an element capable of carrying a superconductive current comprising a copper oxide having a $T_c$ greater than or equal to 26° K and said copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

155. An apparatus comprising: an element capable of carrying a superconductive current comprising a copper oxide having a $T_c$ greater than or equal to 26° K and said copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

156. An invention according to claim 155, wherein said copper oxide can be made according to known principles of ceramic science.

157. A superconductive apparatus comprising:
a composition of the formula $Ba_xLa_{x-5}Cu_5O_y$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K;
a temperature controller capable of maintaining the temperature of said composition at a temperature less than said critical temperature to induce said superconducting state in said metal oxide phase; and
a current source capable of passing an electrical current through said composition while said metal oxide phase is in said superconducting state.

158. A superconductive apparatus according to claim 157, wherein said copper oxide can be made according to known principles of ceramic science.

159. A transition metal oxide device comprising: an element capable of carrying a superconductive current comprising a $T_c$ greater than or equal to 26° K and said transition metal oxide device comprising a transition metal, oxygen and at least one element selected from the group consisting of a first element group, a second element group and combinations thereof, wherein said first element group comprises rare earth elements rare earth-like elements and Group IIIB elements and said second element group comprises alkaline earth elements and Group IIA elements.

160. A transition metal oxide device according to claim 159, wherein said transition metal oxide can be made according to known principles of ceramic science.

161. A copper oxide device comprising: an element capable of carrying a superconductive current comprising a $T_c$ greater than or equal to 26° K and said copper oxide device comprising a copper, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

162. A copper oxide device according to claim 161, wherein said copper oxide can be made according to known principles of ceramic science.

163. A superconductive apparatus comprising: a composition having a transition temperature greater than or equal to 26° K, the composition including a rare earth or Group III B element, a transition metal element capable of exhibiting multivalent states and oxygen, including at least one phase that exhibits superconductivity at temperature greater than or equal to 26° K, a temperature controller capable of maintaining said composition at said temperature to exhibit said superconductivity and a current source capable of passing an electrical superconducting current through said composition which exhibiting said superconductivity.

164. A superconducting combination, comprising: a superconductive oxide having a transition temperature greater than or equal to 26° K,
a current source capable of passing a superconducting electrical current through said composition while said composition is at a temperature greater than or equal to 26° K and less than said transition temperature, and
a temperature controller capable of cooling said composition to a superconducting state at a temperature greater than or equal to 26° K;
where said superconductive composition includes a multivalent transition metal, oxygen, and at least one additional element;
where said additional element is a rare earth or Group III B element.

165. A superconducting apparatus comprising: a composition having a transition temperature greater than or equal to 26° K, said composition being a substituted Cu-oxide including a superconducting phase having a structure which is structurally substantially similar to the orthorhombic-tetragonal phase of said composition, a temperature controller capable of maintaining said composition at a temperature greater than or equal to said transition temperature to put said composition in a superconducting state; and a current source capable of passing current through said composition while in said superconducting state
where said substituted Cu-oxide includes a rare earth or Group III B element.

166. A combination, comprising:
a mixed copper oxide composition including an alkaline earth element (AE) and a rare earth or Group III B element (RE), said composition having a substantially layered crystalline structure and multi-valent oxidation states, said composition exhibiting a substantially zero resistance to the flow of electrical current therethrough when in a superconducting state at a temperature greater than or equal to 26° K, said mixed copper oxide having a superconducting onset temperature greater than or equal to 26° K and, a current source capable of passing an electrical superconducting current through said composition when said corn position exhibits substantially zero resistance at a temperature greater than or equal to 26° K and less than said onset temperature.

167. An apparatus comprising:
a composition including a transition metal, a rare earth or Group III B element, an alkaline earth element, and oxygen, where said composition is a mixed transition metal oxide having a non-stoichimetric amount of oxygen therein and exhibiting a superconducting state at a temperature greater than or equal to 26° K,
a temperature controller capable of maintaining said composition in said superconducting state at a temperature greater than or equal to 26° K, and less than said superconducting onset temperature, and
a current source capable of passing an electrical current through said composition while said composition is in said superconducting state.

168. A superconductive apparatus for causing electric-current flow in a superconductive state at a temperature greater than or equal to 26° K, comprising:
(a) a superconductor element made of a superconductive composition, the superconductive composition consisting essentially of a transition metal oxide compound having a substantially layered perovskite crystal structure, the composition having a superconductor transition temperature $T_c$ of greater than or equal to 26° K;
(b) a temperature controller capable of maintaining the superconductor element at a temperature greater than or equal to 26° K and below the superconductor transition temperature $T_c$ of the superconductive composition;
(c) a current source capable of causing an electric current to flow in the superconductor element, and
(d) at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

169. A superconductive apparatus according to claim 168 wherein said transition metal is copper.

170. A superconductive apparatus for conducting an electric current essentially without resistive losses, comprising:
(a) a superconductor element made of a superconductive composition, the superconductive composition consisting essentially of a copper-oxide compound having a substantially layered perovskite crystal structure, the copper-oxide compound including at least one rare-earth or Group III B element and at least one alkaline-earth element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{r=o}$, the transition-onset temperature $T_c$ being greater than or equal to 26>K;
(b) a temperature controller capable of maintaining the superconductor element at a temperature below the effectively-zero-bulk-resistivity intercept temperature $T_{r=o}$ of the superconductive composition; and
(c) a current source for capable of causing an electric current to flow in the superconductor element.

171. An apparatus comprising: a transition metal oxide having a phase therein which exhibits a superconducting state at a critical temperature greater than or equal to 26° K,
a temperature controller capable of maintaining the temperature of said material at a temperature less than said critical temperature to produce said superconducting state in said phase,
a current source capable of passing an electrical current through said transition metal oxide while it is in said superconducting state; and
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

172. The apparatus of claim 171, where said transition metal oxide is comprised of a transition metal capable of exhibiting multivalent states.

173. The apparatus of claim 171, where said transition metal oxide is comprised of a Cu oxide.

174. An apparatus comprising:
a composition including a transition metal, a rare earth or rare earth-like element, an alkaline earth element, and oxygen, where said composition is a mixed transition metal oxide having a non-stoichiometric amount of oxygen therein and exhibiting a superconducting state at a temperature greater than or equal to 26° K,
a temperature controller capable of maintaining said composition in said superconducting state at a temperature greater than or equal to 26° K, and
a current source capable of passing an electrical current through said composition while said composition is in said superconducting state.

175. The apparatus of claim 174, where said transition metal is copper.

176. An apparatus:
a composition exhibiting a superconductive state a temperature greater than or equal to 26° K,
a temperature controller capable of maintaining said composition at a temperature greater than or equal to 26° K at which temperature said composition exhibits said superconductive state,
a current source capable of passing an electrical current through said composition while said composition is in said superconductive state; and
said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

177. The apparatus of claim 176, where said composition is layered.

178. The apparatus of claim 176, where said composition is comprises a perovskite-like structure.

179. An apparatus of claim 176 wherein said composition comprises a multiphase material comprising a superconductive phase.

180. An apparatus according to claim 179, wherein said means for carrying a superconductive current can be made according to known principles of ceramic science.

181. A superconductive apparatus for causing electric current flow in a superconductive state at a temperature greater than or equal to 26° K, comprising:
(a) a superconductor element made of a superconductive composition, the superconductive composition consisting essentially of a copper-oxide compound having a layer-type perovskite-like crystal structure, the composition having a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition;

(c) a current source capable of causing an electric current to flow in the superconductor element; and (d) said superconductive composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

182. The superconductive apparatus according to claim 181 in which the copper-oxide compound of the superconductive composition includes mixed valent copper ions.

183. The superconductive apparatus according to claim 182 in which the copper-oxide compound includes at least one element in a nonstoichiometric atomic proportion.

184. The superconductive apparatus according to claim 183 in which oxygen is present in the copper-oxide compound in a nonstoichiometric atomic proportion.

185. A superconductive apparatus for causing electric current flow in a superconductive state at a temperature greater than or equal to 26° K, comprising:

(a) a superconductor element made of a superconductive composition, the superconductive composition consisting essentially of a copper-oxide compound having a layer-type perovskite-like crystal structure, the composition having a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition;

(c) a current source capable of causing an electric current to flow in the superconductor element; and (d) the copper-oxide compound of the superconductive composition includes at least one rare-earth or rare-earth-like element and at least one alkaline-earth element.

186. The superconductive apparatus according to claim 185 in which the rare-earth or rare-earth-like element is lanthanum.

187. The superconductive apparatus according to claim 185 in which the alkaline-earth element is barium.

188. A superconductive apparatus for conducting an electric current essentially without resistive losses, comprising:

(a) a superconductor element made of a superconductive composition, the superconductive composition consisting essentially of a copper-oxide compound having a layer-type perovskite-like crystal structure, the copper-oxide compound including at least one rare-earth or rare-earth-like element and at least one alkaline-earth element, the composition having a superconductive/resistive-transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a current source capable of causing an electric current to flow in the superconductor element.

189. The superconductive apparatus according to claim 188 in which the rare-earth or rare-earth-like element is lanthanum.

190. The superconductive apparatus according to claim 188 in which the alkaline-earth element is barium.

191. The superconductive apparatus according to claim 188 in which the copper-oxide compound of the superconductive composition includes mixed valent copper ions.

192. The superconductive apparatus according to claim 191 in which the copper-oxide compound includes at least one element in a nonstoichiometric atomic proportion.

193. The superconductive apparatus according to claim 192 in which oxygen is present in the copper-oxide compound in a nonstoichiometric atomic proportion.

194. An apparatus comprising: copper oxide having a phase therein which exhibits a superconducting state at a critical temperature greater than or equal to 26° K;

a temperature controller capable of maintaining the temperature of said material at a temperature less than said critical temperature to produce said superconducting state in said phase;

a current source capable of passing an electrical supercurrent through said copper oxide while it is in said superconducting state;

said copper oxide includes at least one element selected from the group consisting of a Group IIA element, a rare earth element and a Group III B element.

195. An apparatus comprising:

a composition comprising copper, oxygen and any element selected from the group consisting of a Group II A element, a rare earth element and a Group III B element, where said composition is a mixed copper oxide having a non-stoichiometric amount of oxygen therein and exhibiting a superconducting state at a temperature greater than or equal to 26° K;

a temperature controller capable of maintaining said composition in said superconducting state at a temperature greater than or equal to 26° K; and a current source capable of passing an electrical current through said composition while said composition is in said superconducting state.

196. An apparatus comprising:

a composition exhibiting a superconductive state at a temperature greater than or equal to 26° K;

a temperature controller capable of maintaining said composition at a temperature greater than or equal to 26° K at which temperature said composition exhibits said superconductive state;

a current source capable of passing an electrical current through said composition while said composition is in said superconductive state; and said composition including a copper oxide and an element selected from the group consisting of Group II A element, a rare earth element and a Group III B element.

197. An apparatus for causing electric-current flow in a superconductive state at a temperature greater than or equal to 26° K, comprising:

(a) a superconductor element made of a superconductive composition, the superconductive composition consisting essentially of a copper-oxide compound having a layer-type perovskite-like crystal structure, the composition having a superconductive transition temperature $T_c$ of greater than or equal to 26° K, said superconductive composition includes at least one element selected from the group consisting of a Group II A element, a rare earth element; and a Group III B element;
(b) a temperature controller capable of maintaining the superconductor element at a temperature greater than or equal to 26° K and below the superconductor transition temperature $T_c$ of the superconductive composition; and
(c) a current source capable of causing an electric current to flow in the superconductor element.

198. An apparatus for conducting an electric current essentially without resistive losses, comprising:
(a) a superconductor element made of a superconductive composition, the superconductive composition consisting essentially of a copper-oxide compound having a layer-type perovskite-like crystal structure, the copper-oxide compound including at least one element selected from the group consisting of a Group II A element, a rare earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=o}$ of the superconductive composition; and
(c) a current source capable of causing an electric current to flow in the superconductor element.

199. An apparatus comprising:
a copper oxide having a phase therein which exhibits a superconducting state at a critical temperature greater than or equal to 26° K;
a temperature controller capable of maintaining the temperature of said material at a temperature less than said critical temperature to produce said superconducting state in said phase;
a current source capable of passing an electrical supercurrent through said copper oxide while it is in said superconducting state;
said copper oxide includes an element selected from the group consisting of a Group II A element and at least one element selected from the group consisting of a rare earth element and a Group III B element.

200. An apparatus comprising:
a composition including copper, oxygen and an element selected from the group consisting of at least one Group II A element and at least one element selected from the group consisting of a rare earth element and a Group III B element, where said composition is a mixed copper oxide having a non-stoichiometric amount of oxygen therein and exhibiting a superconducting state at a temperature greater than or equal to 26° K;
a temperature controller capable of maintaining said composition in said superconducting state at a temperature greater than or equal to 26° K; and
a current source capable of passing an electrical current through said composition while said composition is in said superconducting state.

201. An apparatus comprising:
a composition exhibiting a superconductive state at a temperature greater than or equal to 26° K;
a temperature controller capable of maintaining said composition at a temperature greater than or equal to 26° K at which temperature said composition exhibits said superconductive state;
a current source capable of passing an electrical current through said composition while said composition is in said superconductive state; and
said composition including a copper oxide and at least one element selected from the group consisting of Group II A and at least one element selected from the group consisting of a rare earth element and a Group III B element.

202. A superconductive apparatus for causing electric-current flow in a superconductive state at a temperature greater than or equal to 26° K, comprising:
(a) a superconductor element made of a superconductive composition, the superconductive composition consisting essentially of a copper-oxide compound having a layer-type perovskite-like crystal structure, the composition having a superconductive transition temperature $T_c$ of greater than or equal to 26° K, said superconductive composition includes at least one element selected from the group consisting of a Group II A element and at least one element selected from the group consisting of a rare earth element and a Group III B element;
(b) a temperature controller capable of maintaining the superconductor element at a temperature greater than or equal to 26° K and below the superconductor transition temperature $T_c$ of the superconductive composition; and
(c) a current source capable of causing an electric current to flow in the superconductor element.

203. A superconductive apparatus for conducting an electric current essentially without resistive losses, comprising:
(a) a superconductor element made of a superconductive composition, the superconductive composition consisting essentially of a copper-oxide compound having a layer-type perovskite-like crystal structure, the copper-oxide compound including at least one element selected from the group consisting of a Group II A element and at least one element selected from the group consisting of a rare earth element and a Group III B element, the composition having a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a current source capable of causing an electric current to flow in the superconductor element.

204. An apparatus comprising:
a transition metal oxide having a phase therein which exhibits a superconducting state at a critical temperature greater than or equal to 26° K;
a temperature controller capable of maintaining the temperature of said material at a temperature less than said critical temperature to produce said superconducting state in said phase;
a current source capable of passing an electrical supercurrent through said copper oxide while it is in said superconducting state;
said transitional metal oxide includes at least one element selected from the group consisting of a Group II A element and at least one element selected from the group consisting of a rare earth element and a Group III B element.

205. An apparatus comprising:
a composition including a transition metal, oxygen and an element selected from the group consisting of a Group II A element and at least one element selected from the group consisting of a rare earth element and a Group III B element, where said composition is a mixed transitional metal oxide formed from said transition metal and said oxygen, said mixed transition metal oxide having a non-stoichiometric amount of oxygen therein and exhibiting a superconducting state at a temperature greater than or equal to 26° K;
a temperature controller capable of maintaining said composition in said superconducting state at a temperature greater than or equal to 26° K; and
a current source capable of passing an electrical current through said composition while said composition is in said superconducting state.

206. An apparatus:
forming a composition exhibiting a superconductive state at a temperature greater than or equal to 26° K;
a temperature controller capable of maintaining said composition at a temperature greater than or equal to 26° K at which temperature said composition exhibits said superconductive state;
a current source capable of passing an electrical current through said composition while said composition is in said superconductive state; and
said composition including a transitional metal oxide and at least one element selected from the group consisting of Group II A element and at least one element selected from the group consisting of a rare earth element and a Group III B element.

207. A superconductive apparatus for causing electric-current flow in a superconductive state at a temperature greater than or equal to 26° K, comprising:
(a) a superconductor element made of a superconductive composition, the superconductive composition consisting essentially of a transition metal oxide compound having a layer-type perovskite-like crystal structure, the composition having a superconductive transition temperature $T_c$ of greater than or equal to 26° K, said superconductive composition includes an element selected from the group consisting of a Group II A element and at least one element selected from the group consisting of a rare earth element and a Group III B element;
(b) a temperature controller capable of maintaining the superconductor element at a temperature greater than or equal to 26° K and below the superconductor transition $T_c$ of the superconductive composition; and
(c) a current source capable of causing an electric current to flow in the superconductor element.

208. A superconductive apparatus for conducting an electric current essentially without resistive losses, comprising:
(a) a superconductor element made of a superconductive composition, the superconductive composition consisting essentially of a transition metal-oxide compound having a layer-type perovskite-like crystal structure, the transition metal-oxide compound including at least one element selected from the group consisting of a Group II A element and at least one element selected from the group consisting of a rare earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a current source capable of causing an electric current to flow in the superconductor element.

209. An apparatus comprising:
a copper oxide having a phase therein which exhibits a superconducting state at a critical temperature greater than or equal to 26° K;
a temperature controller capable of maintaining the temperature of said material at a temperature less than said critical temperature to produce said superconducting state in said phase;
a current source capable of passing an electrical supercurrent through said copper oxide while it is in said superconducting state;
said copper oxide includes at least one Group II A element, and at least one element selected from the group consisting of a rare earth element and a Group III B element.

210. An apparatus comprising:
a composition including copper, oxygen, a Group II A element and at least one element selected from the group consisting of a rare earth element and a Group III B element, where said composition is a mixed copper oxide having a non-stoichiometric amount of oxygen therein and exhibiting a superconducting state at a temperature greater than or equal to 26° K;
a temperature controller capable of maintaining said composition in said superconducting state at a temperature greater than or equal to 26° K; and
a current source capable of passing an electrical current through said composition while said composition is in said superconducting state.

211. A structure comprising:
a composition exhibiting a superconductive state at a temperature greater than or equal to 26° K;
a temperature controller capable of maintaining said composition at a temperature greater than or equal to 26° K at which temperature said composition exhibits said superconductive state;
a current source capable of passing an electrical current through said composition while said composition is in said superconductive state; and
said composition including a copper oxide, a Group II A element, at least one element selected from the group consisting of a rare earth element and a Group III B element.

212. A superconductive apparatus for causing electric-current flow in a superconductive state at a temperature greater than or equal to 26° K, comprising:
(a) a superconductor element made of a superconductive composition, the superconductive composition consisting essentially of a copper-oxide compound having a layer-type perovskite-like crystal structure, the composition having a superconductive transition temperature $T_c$ of greater than or equal to 26° K, said superconductive composition includes a Group II A element, and at least one element selected from the group consisting of a rare earth element and a Group III B element;
(b) a temperature controller capable of maintaining the superconductor element at a temperature greater than or equal to 26° K and below the superconductor transition temperature $T_c$ of the superconductive composition; and
(c) a current source capable of causing an electric current to flow in the superconductor element.

213. A superconductive apparatus for conducting an electric current essentially without resistive losses, comprising:
(a) a superconductor element made of a superconductive composition, the superconductive composition consisting essentially of a copper-oxide compound having a layer-type perovskite-like crystal structure, the copper-oxide compound including Group II A element, and at least one element selected from the group consisting of a rare earth element and a Group III B element, the composition having a superconductive-resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a current source capable of causing an electric current to flow in the superconductor element.

214. An apparatus comprising: a composition having a transition temperature greater than or equal to 26° K, the composition including a rare earth or alkaline earth element, a transition metal element capable of exhibiting multivalent states and oxygen, including at least one phase that exhibits superconductivity at temperature greater than or equal to 26° K, a temperature controller capable of maintaining said composition at said temperature to exhibit said superconductivity and a current source capable of passing an electrical superconducting current through said composition with said phrase exhibiting said superconductivity.

215. An apparatus according to claim 214 wherein said composition comprises a substantially layered perovskite crystal structure.

216. An apparatus comprising: an element capable of carrying a superconductive current comprising a superconducting transition metal oxide having a superconductive onset temperature greater than or equal to 26° K, a temperature controller capable of maintaining said superconducting transition metal oxide at a temperature less than said superconducting onset temperature and a current source, and said composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

217. An apparatus according to claim 216 wherein said superconducting transition metal oxide comprises a substantially layered perovskite crystal structure.

218. An apparatus comprising: an element capable of carrying a superconductive current comprising a superconducting copper oxide having a superconductive onset temperature greater than or equal to 26° K, a temperature controller capable of maintaining said superconducting copper oxide at a temperature less than said superconducting onset temperature and a current source, and said superconducting copper oxide further comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

219. An apparatus according to claim 218 wherein said superconducting copper oxide comprises a substantially layered perovskite crystal structure.

220. An apparatus comprising: an element capable of carrying a superconductive current comprising a superconducting oxide composition having a superconductive onset temperature greater than or equal to 26° K, a temperature controller capable of maintaining said superconducting copper oxide at a temperature less than said superconducting onset temperature and a current source, said composition comprising at least one each of rare earth, an alkaline earth, and copper.

221. An apparatus according to claim 220 wherein said superconducting oxide composition comprises a substantially layered perovskite crystal structure.

222. An apparatus comprising: an element capable of carrying a superconductive current comprising a superconducting oxide composition having a superconductive onset temperature greater than or equal to 26° K, a temperature controller capable of maintaining said superconducting copper oxide at a temperature less than said superconducting onset temperature and a current source, said composition comprising at least one each of a Group III B element, an alkaline earth, and copper.

223. An apparatus according to claim 222 wherein said superconducting oxide composition comprises a substantially layered perovskite crystal structure.

224. An apparatus comprising: an element capable of carrying a superconducting electrical current in a transition metal oxide having a $T_c$ greater than or equal to 26° K a temperature controller capable of maintaining said transition metal oxide at a temperature less than said $T_c$, and said transition metal oxide comprising at least one element selected from the group consisting of a first element group, a second element group and combinations thereof, wherein said first element group comprises rare earth elements, rare earth-like elements and Group IIIB elements and said second element croup comprises alkaline earth elements and Group IIA elements.

225. An apparatus according to claim 224 wherein said transition metal oxide comprises a substantially layered perovskite crystal structure.

226. An apparatus comprising: a current source, an element capable of carrying a superconductive current comprising a copper oxide having a $T_c$ greater than or equal to 26° K and a temperature controller capable of maintaining said copper oxide at a temperature less than said $T_c$, and said copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

227. An apparatus according to claim 226 wherein said copper oxide comprises a substantially layered perovskite crystal structure.

228. An apparatus comprising:
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K;

a temperature controller capable of maintaining the temperature of said composition at a temperature less than said critical temperature to induce said superconducting state in said metal oxide phase; and a current source capable of passing an electrical current through said composition while said metal oxide phase is in said superconducting state.

229. An apparatus according to claim 228 wherein said composition comprises a substantially layered perovskite crystal structure.

230. An apparatus comprising: a current source and an element capable of carrying a superconductive current comprising a composition of matter having a $T_c$ greater than or equal to 26° K, said composition comprising at least one each of a Group III B element, an alkaline earth, and copper oxide and a temperature controller capable of maintaining said composition of matter at a temperature less than $T_c$.

231. An apparatus according to claim 230 wherein said composition of matter comprises a substantially layered perovskite crystal structure.

232. An apparatus comprising: a current source and an element capable of carrying a superconductive current comprising a composition of matter having a $T_c$ greater than or equal to 26° K, said composition comprising at least one each of a rare earth, alkaline earth, and copper oxide and a temperature controller capable of maintaining said composition of matter at a temperature less than said $T_c$.

233. An apparatus according to claim 232 wherein said composition of matter comprises substantially layered perovskite crystal structure.

234. An apparatus comprising: a current and an element capable of carrying a superconductive current comprising a composition of matter having a $T_c$ greater than or equal to 26° K, said composition comprising at least one each of a rare earth, and copper oxide and a temperature controller capable of maintaining said composition of matter at a temperature less than said $T_c$.

235. An apparatus according to claim 234 wherein said composition of matter comprises a substantially layered perovskite crystal structure.

236. An apparatus comprising: a current source and an element capable of carrying a superconductive current comprising a composition of matter having a $T_c$ greater than or equal to 26° K carrying, said composition comprising at least one each of a Group III B element, and copper oxide and a temperature controller capable of maintaining said composition of matter at a temperature less than said $T_c$.

237. An apparatus according to claim 236 wherein said composition of matter comprises substantially layered perovskite crystal structure.

238. An apparatus comprising: a current source and an element capable of carrying a superconductive current comprising a transition metal oxide comprising a $T_c$ greater than or equal to 26° K and a temperature controller capable of maintaining said transition metal oxide at a temperature less than said $T_c$, said composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

239. An apparatus according to claim 238 wherein said transition metal oxide comprises substantially layered perovskite crystal structure.

240. An apparatus comprising: a current source and an element capable of carrying a superconductive current comprising a copper oxide composition of matter comprising a $T_c$ greater than or equal to 26° K and a temperature controller capable of maintaining said copper oxide composition of matter at a temperature less than said $T_c$, said copper oxide composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

241. An apparatus according to claim 240 wherein said copper oxide composition comprises substantially layered perovskite crystal structure.

242. An apparatus comprising:

a composition including a transition metal, a Group III B element, an alkaline earth element, and oxygen, where said composition is a mixed transition metal oxide having a non-stoichiometric amount of oxygen therein and exhibiting a superconducting state at a temperature greater than or equal to 26° K, a temperature controller capable of maintaining said composition in said superconducting state at a temperature greater than or equal to 26° K, and a current source capable of passing an electrical current through said composition while said composition is in said superconducting state.

243. The apparatus of claim 242, where said transition metal is copper.

244. A superconductive apparatus for causing electric current flow in a superconductive state at a temperature greater than or equal to 26° K, comprising:

(a) a superconductor element made of a superconductive composition, the superconductive composition consisting essentially of a copper-oxide compound having a substantially layered perovskite crystal structure, the composition having a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition; and (c) a current source capable of causing an electric current to flow in the superconductor element; and (d) the superconductive composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

245. The superconductive apparatus according to claim 244 in which the copper-oxide compound of the superconductive composition includes mixed valent copper ions.

246. The superconductive apparatus according to claim 245 in which the copper-oxide compound includes at least one element in a nonstoichiometric atomic proportion.

247. The superconductive apparatus according to claim 246 in which oxygen is present in the copper-oxide compound in a nonstoichiometric atomic proportion.

248. A superconductive apparatus for causing electric current flow in a superconductive state at a temperature greater than or equal to 26° K, comprising:
(a) a superconductor element made of a superconductive composition, the superconductive composition consisting essentially of a copper-oxide compound having a substantially layered perovskite crystal structure, the composition having a superconductor transition temperature $T_c$ of greater than or equal to 26° K;
(b) a temperature controller capable of maintaining the superconductor element at a temperature greater than or equal to 26° K and below the superconductor transition temperature $T_c$ of the superconductive composition;
(c) a current source capable of causing an electric current to flow in the superconductor element; and
the copper-oxide compound of the superconductive composition includes at least one element selected from the group consisting of a rare-earth element, a Group III B element and an alkaline-earth element.

249. The superconductive apparatus according to claim 248 in which the rare-earth is lanthanum.

250. The superconductive apparatus according to claim 248 in which the alkaline-earth element is barium.

251. A superconductive apparatus for conducting an electric current essentially without resistive losses, comprising:
(a) a superconductor element made of a superconductive composition, the superconductive composition consisting essentially of a copper-oxide compound having a substantially layered perovskite crystal structure, the copper-oxide compound including at least one element selected from the group consisting of a rare-earth element, a Group III B element and an alkaline-earth element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a current source capable of causing an electric current to flow in the superconductor element.

252. The superconductive apparatus according to claim 251 in which said at least one element is lanthanum.

253. The superconductive apparatus ccording to claim 251 in which the alkaline-earth element is barium.

254. The superconductive apparatus according to claim 251 in which the copper-oxide compound of the superconductive composition includes mixed valent copper ions.

255. The superconductive apparatus according to claim 254 in which the copper-oxide compound includes at least one element in a nonstoichiometric atomic proportion.

256. The superconductive apparatus according to claim 255 in which oxygen is present in the copper-oxide compound in a nonstoichiometric atomic proportion.

257. A superconductive apparatus for causing electric-current flow in a superconductive state at a temperature greater than or equal to 26° K, comprising:
(a) a superconductor element made of a superconductive composition, the superconductive composition consisting essentially of a copper-oxide compound having a substantially layered perovskite crystal structure, the composition having a superconductor transition temperature $T_c$ of greater than or equal to 26° K, said superconductive composition includes at least one element selected from the group consisting of a Group II A element, a rare earth element; and a Group III B element;
(b) a temperature controller capable of maintaining the superconductor element at a temperature greater than or equal to 26° K and below the superconductor transition temperature $T_c$ of the superconductive composition; and
(c) a current source capable of causing an electric current to flow in the superconductor element.

258. A superconductive apparatus for conducting an electric current essentially without resistive losses, comprising:
(a) a superconductor element made of a superconductive composition, the superconductive composition consisting essentially of a copper-oxide compound having a substantially layered perovskite crystal structure, the copper-oxide compound including at least one element selected from the group consisting of a Group II A element, a rare earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=o}$ of the superconductive composition; and
(c) a current source capable of causing an electric current to flow in the superconductor element.

259. A superconductive apparatus for causing electric-current flow in a superconductive state at a temperature greater than or equal to 26° K, comprising:
(a) a superconductor element made of a superconductive composition, the superconductive composition consisting essentially of a copper-oxide compound having a substantially layered perovskite crystal structure, the composition having a superconductive transition temperature $T_c$ of greater than or equal to 26° K, said superconductive composition includes a Group II A element and at least one element selected from the group consisting of a rare earth element and a Group III B element;
(b) a temperature controller capable of maintaining the superconductor element at a temperature greater than or equal to 26° K and below the superconductor transition temperature $T_c$ of the superconductive composition; and
(c) a current source capable of causing an electric current to flow in the superconductor element.

260. A superconductive apparatus for conducting an electric current essentially without resistive losses, comprising:
(a) a superconductor element made of a superconductive composition, the superconductive composition consisting essentially of a copper-oxide compound having a substantially layered perovskite crystal structure, the copper-oxide compound including a Group II A element and at least one element selected from the group consisting of a rare earth element and a Group III B element, the composition having a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and (c) a current source capable of causing an electric current to flow in the superconductor element.

261. A superconductive apparatus for causing electric-current flow in a superconductive state at a temperature greater than or equal to 26° K, comprising:
(a) a superconductor element made of a superconductive composition, the superconductive composition consisting essentially of a transition metal oxide compound having a substantially layered perovskite crystal structure, the composition having a superconductive transition temperature $T_c$ of greater than or equal to 26° K, said superconductive composition includes a Group II A element and at least one element selected from the group consisting of a rare earth element and a Group III B element;
(b) a temperature controller capable of maintaining the superconductor element at a temperature greater than or equal to 26° K and below the superconductor transition $T_c$ of the superconductive composition; and
(c) a current source capable of causing an electric current to flow in the superconductor element.

262. A superconductive apparatus for conducting an electric current essentially without resistive losses, comprising:
(a) a superconductor element made of a superconductive composition, the superconductive composition consisting essentially of a transition metal-oxide compound having a substantially layered perovskite crystal structure, the transition metal-oxide compound including a Group II A element and at least one element selected from the group consisting of a rare earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a current source capable of causing an electric current to flow in the superconductor element.

263. An apparatus comprising:
a transition metal oxide comprising a phase therein which exhibits a superconducting state at a critical temperature greater than or equal to 26° K,
a temperature controller capable of maintaining the temperature of said material at a temperature less than said critical temperature to produce said superconducting state in said phase,
a source capable of providing: an electrical current through said transition metal oxide while it is in said superconducting state, and
said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

264. An apparatus according to claim 263, where said transition metal oxide is comprised of a transition metal capable of exhibiting multivalent states.

265. An apparatus according to claim 263, where said transition metal oxide is comprised of a Cu oxide.

266. An apparatus comprising:
a composition including a transition metal, a rare earth or rare earth-like element, an alkaline earth element, and oxygen, where said composition is a mixed transition metal oxide comprising a non-stoichiometric amount of oxygen therein and exhibiting a superconducting state at a temperature greater than or equal to 26° K,
a temperature controller capable of maintaining said composition in said superconducting state at a temperature greater than or equal to 26° K, and
a source capable of providing an electrical current through said composition while said composition is in said superconducting state.

267. An apparatus according to claim 266, where said transition metal is copper.

268. An apparatus comprising:
a composition exhibiting a superconductive state at a temperature greater than or equal to 26° K, a temperature controller capable of maintaining said composition at a temperature greater than or equal to 26° K at which temperature said composition exhibits said superconductive state,
a source capable of providing an electrical current through said composition while said composition is in said superconductive state, and
said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

269. An apparatus according to claim 268, where said composition is comprised of a structure selected from the group consisting of a perovskite structure, a substantially perovskite structure, a perovskite-like structure, a perovskite type structure, a structure comprising a perovskite characteristic, and a perovskite related structure.

270. An apparatus according to claim 269, where said composition is comprised of a structure slected from the group consisting of a layered structure, a layered crystalline structure, a substantially layered structure, a substantially layered crystalline structure, a layered-like structure, a layered-type structure, and a layered characteristic.

271. An apparatus capable of carrying electric current flow in a superconductive state at a temperature greater than or equal to 26° K, comprising:
(a) a superconductor element made of a superconductive composition, the superconductive composition consisting essentially of a copper-oxide compound comprising a layer-type perovskite-like crystal structure, the composition comprising a superconductor transition temperature $T_c$ of greater than or equal to 26° K;
(b) a temperature controller capable of maintaining the superconductor element at a temperature greater than or equal to 26° K and below the superconductor transition temperature $T_c$ of the superconductive composition; and
(c) a source capable of providing an electric current to flow in the superconductor element, and
(d) said superconductive composition at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

272. An apparatus according to claim 271 in which the copper-oxide compound of the superconductive composition includes mixed valent copper ions.

273. An apparatus according to claim 272 in which the copper-oxide compound includes at least one element in a nonstoichiometric atomic proportion.

274. An apparatus according to claim 273 in which oxygen is present in the copper-oxide compound in a nonstoichiometric atomic proportion.

275. An apparatus capable of carrying electric current flow in a superconductive state at a temperature greater than or equal to 26° K, comprising:
(a) a superconductor element made of a superconductive composition, the superconductive composition consisting essentially of a copper-oxide compound comprising a layer-type perovskite-like crystal structure, the composition comprising a superconductor transition temperature $T_c$ of greater than or equal to 26° K;
(b) a temperature controller capable of maintaining the superconductor element at a temperature greater than or equal to 26° K and below the superconductor transition temperature $T_c$ of the superconductive composition;
(c) a source capable of providing an electric current to flow in the superconductor element, and
(d) the copper-oxide compound of the superconductive composition includes at least one rare-earth or rare-earth-like element and at least one alkaline-earth element.

276. An apparatus according to claim 275 in which the rare-earth or rare-earth-like element is lanthanum.

277. An apparatus according to claim 275 in which the alkaline-earth element is barium.

278. An apparatus for conducting an electric current essentially without resistive losses, comprising:
(a) a superconductor element made of a superconductive composition, the superconductive composition consisting essentially of a copper-oxide compound comprising a layer-type perovskite-like crystal structure, the copper-oxide compound including at least one rare-earth or rare-earth-like element and at least one alkaline-earth element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a source capable of providing an electric current to flow in the superconductor element.

279. An apparatus according to claim 278 in which the rare-earth or rare-earth-like element is lanthanum.

280. An apparatus according to claim 278 in which the alkaline-earth element is barium.

281. An apparatus according to claim 278 in which the copper-oxide compound of the superconductive composition includes mixed valent copper ions.

282. An apparatus according to claim 281 in which the copper-oxide compound includes at least one element in a nonstoichiometric atomic proportion.

283. An apparatus according to claim 282 in which oxygen is present in the copper-oxide compound in a nonstoichiometric atomic proportion.

284. An apparatus comprising:
a copper oxide comprising a phase therein which exhibits a superconducting state at a critical temperature greater than or equal to 26° K;
a temperature controller capable of maintaining the temperature of said material at a temperature less than said critical temperature to produce said superconducting state in said phase;
a source capable of providing an electrical current through said copper oxide while it is in said superconducting state;
said copper oxide includes at least one element selected from the group consisting of a Group IIA element, a rare earth element and a Group III B element.

285. An apparatus comprising:
a composition including copper, oxygen and an element selected from the group consisting of a Group II A element, a rare earth element and a Group III B element, where said composition is a mixed copper oxide comprising a non-stoichiometric amount of oxygen therein and exhibiting a superconducting state at a temperature greater than or equal to 26° K;
a temperature controller capable of maintaining said composition in said superconducting state at a temperature greater than or equal to 26° K; and
a source capable of providing an electrical current through said composition while said composition is in said superconducting state.

286. An apparatus comprising:
a composition exhibiting a superconductive state at a temperature greater than or equal to 26° K;
a temperature controller capable of maintaining said composition at a temperature greater than or equal to 26° K at which temperature said composition exhibits said superconductive state:
a source capable of providing an electrical current through said composition while said composition is in said superconductive state; and
said composition including a copper oxide and an element selected from the group consisting of Group II A element, a rare earth element and a Group III B element.

287. An apparatus capable of carrying an electric-current flow in a superconductive state at a temperature greater than or equal to 26° K, comprising:
(a) a superconductor element made of a superconductive composition, the superconductive composition consisting essentially of a copper-oxide compound comprising a layer-type perovskite-like crystal structure, the composition comprising a superconductive transition temperature $T_c$ of greater than or equal to 26° K, said superconductive composition includes at least one element selected from the group consisting of a Group II A element, a rare earth element; and a Group III B element;
(b) a temperature controller for capable of maintaining the superconductor element at a temperature greater than or equal to 26° K and below the superconductor transition temperature $T_c$ of the superconductive composition: and
(c) a source capable of providing an electric current to flow in the superconductor element.

288. An apparatus capable of carrying an electric current essentially without resistive losses, comprising:
(a) a superconductor element made of a superconductive composition, the superconductive composition consisting essentially of a copper-oxide compound comprising a layer-type perovskite-like crystal structure, the copper-oxide compound including at least one element selected from the group consisting of a Group II A element, a rare earth element and a Group III B element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a source capable of providing an electric current to flow in the superconductor element.

289. An apparatus comprising:

a copper oxide comprising a phase therein which exhibits a superconducting state at a critical temperature greater than or equal to 26° K;

a temperature controller capable of maintaining the temperature of said material at a temperature less than said critical temperature to produce said superconducting state in said phase;

a source capable of providing an electrical current through said copper oxide while it is in said superconducting state;

said copper oxide includes at least one element selected from the group consisting of a Group II A element and at least one element selected from the group consisting of a rare earth element and a Group III B element.

290. An apparatus comprising:

a composition including copper, oxygen and an element selected from the group consisting of at least one Group II A element and at least one element selected from the group consisting of a rare earth element and a Group III B element, where said composition is a mixed copper oxide comprising a non-stoichiometric amount of oxygen therein and exhibiting a superconducting state at a temperature greater than or equal to 26° K;

a temperature controller capable of for maintaining said composition in said superconducting state at a temperature greater than or equal to 26° K; and a source capable of providing an electrical current through said composition while said composition is in said superconducting state.

291. An apparatus comprising:

a composition exhibiting a superconductive state at temperature greater than or equal to 26° K;

a temperature controller capable of maintaining said composition at a temperature greater than or equal to 26° K at which temperature said composition exhibits said superconductive state;

a source capable of providing an electrical current through said composition while said composition is in said superconductive state; and said composition including a copper oxide and at least one element selected from the group consisting of Group II A and at least one element selected from the group consisting of a rare earth element and a Group III B element.

292. An apparatus capable of carrying an electric-current flow in a superconductive state at a temperature greater than or equal to 26° K, comprising:

(a) a superconductor element made of a superconductive composition, the superconductive composition consisting essentially of a copper-oxide compound comprising a layer-type perovskite-like crystal structure, the composition comprising a superconductive transition temperature $T_c$ of greater than or equal to 26° K, said superconductive composition includes at least one element selected from the group consisting of a Group II A element and at least one element selected from the group consisting of a rare earth element and a Group III B element;

(b) a temperature controller capable of maintaining the superconductor element at a temperature greater than or equal to 26° K and below the superconductor transition temperature $T_c$ of the superconductive composition; and (c) a source capable of providing an electric current to flow in the superconductor element.

293. An apparatus for conducting an electric current essentially without resistive losses, comprising:

(a) a superconductor element made of a superconductive composition, the superconductive composition consisting essentially of a copper-oxide compound comprising a layer-type perovskite-like crystal structure, the copper-oxide compound including at least one element selected from the group consisting of a Group II A element and at least one element selected from the group consisting of a rare earth element and a Group III B element, the composition comprising a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a source capable of providing an electric current to flow in the superconductor element.

294. An apparatus comprising:

a transition metal oxide comprising a phase therein which exhibits a superconducting state at a critical temperature greater than or equal to 26° K;

a temperature controller capable of maintaining the temperature of said material at a temperature less than said critical temperature to produce said superconducting state in said phase;

a source capable of providing an electrical current through said transition metal oxide while it is in said superconducting state;

said transitional metal oxide includes at least one element selected from the group consisting of a Group II A element and at lest one element selected from the group consisting of a rare earth element and a Group III B element.

295. An apparatus comprising:

a composition including a transition metal, oxygen and an element selected from the group consisting of at least one Group II A element and at least one element selected from the group consisting of a rare earth element and a Group III B element, where said composition is a mixed transitional metal oxide formed from said transition metal and said oxygen, said mixed transition metal oxide comprising a non-stoichiometric amount of oxygen therein and exhibiting a superconducting state at a temperature greater than or equal to 26° K;

a temperature controller capable of maintaining said composition in said superconducting state at a temperature greater than or equal to 26° K; and a source capable of providing an electrical current through said composition while said composition is in said superconducting state.

296. An apparatus comprising:

a composition exhibiting a superconductive state at a temperature greater than or equal to 26° K;

a temperature controller capable of maintaining said composition at a temperature greater than or equal to 26° K at which temperature said composition exhibits said superconductive state;

a source capable of providing an electrical current through said composition while said composition is in said superconductive state; and said composition including a transitional metal oxide and at least one element selected from the group consisting of Group II A element and at least one element selected from the group consisting of a rare earth element and a Group III B element.

297. An apparatus capable of carrying an electric-current flow in a superconductive state at a temperature greater than or equal to 26° K, comprising:
  (a) a superconductor element made of a superconductive composition, the superconductive composition consisting essentially of a transition metal oxide compound comprising a layer-type perovskite-like crystal structure, the composition comprising a superconductive transition temperature $T_c$ of greater than or equal to 26° K, said superconductive composition includes at least one element selected from the group consisting of a Group II A element and at least one element selected from the group consisting of a rare earth element and a Group III B element;
  (b) a temperature controller capable of maintaining the superconductor element at a temperature greater than or equal to 26° K and below the superconductor transition $T_c$ of the superconductive composition; and
  (c) a source of an electric current to flow in the superconductor element.

298. An apparatus for conducting an electric current essentially without resistive losses, comprising:
  (a) a superconductor element made of a superconductive composition, the superconductive composition consisting essentially of a transition metal-oxide compound comprising a layer-type perovskite-like crystal structure, the transition metal-oxide compound including at least one element selected from the group consisting of a Group II A element and at least one element selected from the group consisting of a rare earth element and a Group III B element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
  (b) a temperature controller capable of maintaining the superconductor element at a temperature below the effectively-zero-bulk-resistivity intercept temperature $T_{p=0}$ of the superconductive composition; and
  (c) a source of an electric current to flow in the superconductor element.

299. An apparatus comprising:

a copper oxide comprising a phase therein which exhibits a superconducting state at a critical temperature greater than or equal to 26° K;

a temperature controller capable of maintaining the temperature of said material at a temperature less than said critical temperature to produce said superconducting state in said phase;

a source capable of providing an electrical current through said copper oxide while it is in said superconducting state;

said copper oxide includes at least one element selected from group consisting of a Group II A element, at least one element selected from the group consisting of a rare earth element and at least one element selected from the group consisting of a Group III B element.

300. An apparatus comprising:

a composition including copper, oxygen and an element selected from the group consisting of at least one Group II A element and at least one element selected from the group consisting of a rare earth element at least one element selected from the group consisting of a Group III B element, where said composition is a mixed copper oxide comprising a non-stoichiometric amount of oxygen therein and exhibiting a superconducting state at a temperature greater than or equal to 26° K;

a temperature controller capable of maintaining said composition in said superconducting state at a temperature greater than or equal to 26° K; and a source capable of passing an electrical current through said composition while said composition is in said superconducting state.

301. An apparatus comprising:

a composition exhibiting a superconductive state at a temperature greater than or equal to 26° K;

a temperature controller capable of maintaining said composition at a temperature greater than or equal to 26° K at which temperature said composition exhibits said superconductive state;

a source capable of providing an electrical current through said composition while said composition is in said superconductive state; and said composition including a copper oxide and at least one element selected from the group consisting of Group II A element, at least one element selected from the group consisting of a rare earth element and at least one element selected from the group consisting of a Group III B element.

302. An apparatus for causing an electric-current flow in a superconductive state at a temperature greater than or equal to 26° K, comprising:
  (a) a superconductor element made of a superconductive composition, the superconductive composition consisting essentially of a copper-oxide compound comprising a layer-type perovskite-like crystal structure, the composition comprising a superconductive transition temperature $T_c$ of greater than or equal to 26° K, said superconductive composition includes at least one element selected from the group consisting of a Group II A element, at least one element selected from the group consisting of a rare earth element and at least one element selected from the group consisting of a Group III B element;
  (b) a temperature controller capable of maintaining the superconductor element at a temperature greater than or equal to 26° K and below the superconductor transition temperature $T_c$ of the superconductive composition; and (c) a source capable of providing an electric current to flow in the superconductor element.

303. An apparatus for conducting an electric current essentially without resistive losses, comprising:
(a) a superconductor element made of a superconductive composition, the superconductive composition consisting essentially of a copper-oxide compound comprising a layer-type perovskite-like crystal structure, the copper-oxide compound including at least one element selected from the group consisting of a group II A element, at least one element selected from the group consisting of a rare earth element and at least one element selected from the group consisting of a Group III B element, the composition comprising a superconductive-resistive transition temperature defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a source capable of providing an electric current to flow in the superconductor element.

304. An apparatus comprising: a composition comprising a transition temperature greater than or equal to 26° K, the composition including a rare earth or alkaline earth element, a transition metal element capable of exhibiting multivalent states and oxygen, including at least one phase that exhibits superconductivity at temperature greater than or equal to 26° K, a temperature controller capable of maintaining said composition at said temperature to exhibit said superconductivity and a source of an electrical superconducting current through said composition with said phrase exhibiting said superconductivity.

305. An apparatus according to claim 304 wherein said composition comprises a substantially layered perovskite crystal structure.

306. An apparatus comprising: providing a superconducting transition metal oxide comprising a superconductive onset temperature greater than or equal to 26° K, a temperature controller capable of maintaining said superconducting transition metal oxide at a temperature less than said superconducting onset temperature and a source of a superconducting current therein said superconductive transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

307. An apparatus according to claim 306 wherein said superconducting transition metal oxide comprises a substantially layered perovskite crystal structure.

308. An apparatus comprising: a superconducting copper oxide comprising a superconductive onset temperature greater than or equal to 26° K, a temperature controller capable of maintaining said superconducting copper oxide at a temperature less than said superconducting onset temperature and a source of a superconducting current in said superconducting copper oxide, said superconductive copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

309. An apparatus according to claim 308 wherein said superconducting copper oxide comprises a substantially layered perovskite crystal structure.

310. An apparatus comprising: a superconducting oxide composition comprising a superconductive onset temperature greater than or equal to 26° K, a temperature controller capable of maintaining said superconducting copper oxide at a temperature less than said superconducting onset temperature and a source of a superconducting current therein, said composition comprising at least one each of rare earth, an alkaline earth, and copper.

311. An apparatus according to claim 310 wherein said superconducting oxide composition comprises a substantially layered perovskite crystal structure.

312. An apparatus comprising: a superconducting oxide composition comprising a superconductive onset temperature greater than or equal to 26° K, a temperature controller for capable of maintaining said superconducting copper oxide at a temperature less than said superconducting onset temperature and a source of a superconducting electrical current therein, said composition comprising at least one each of a Group III B element, an alkaline earth, and copper.

313. An apparatus according to claim 312 wherein said superconducting oxide composition comprises a substantially layered perovskite crystal structure.

314. An apparatus comprising: a source of a superconducting electrical current in a transition metal oxide comprising a $T_c$ greater than or equal to 26° K and a temperature controller for capable of maintaining said transition metal oxide at a temperature less than said $T_c$, said transition metal oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

315. An apparatus according to claim 314 wherein said transition metal oxide comprises a substantially layered perovskite crystal structure.

316. An apparatus comprising: a source of a superconducting current in a copper oxide comprising a $T_c$ greater than or equal to 26° K and a temperature controller capable of maintaining said copper oxide at a temperature less than said $T_c$, said copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

317. An apparatus according to claim 316 wherein said copper oxide comprises a substantially layered perovskite crystal structure.

318. An apparatus comprising:
a composition of the formula $Ba_x La_{x-5}, Cu_5 O_y$, wherein x is from about 0.75 to about 1 and y is the oxygen deficiency resulting from annealing said composition at temperatures from about 540° C. to about 950° C. and for times of about 15 minutes to about 12 hours, said composition comprising a metal oxide phase which exhibits a superconducting state at a critical temperature greater than or equal to 26° K;
a temperature controller capable of maintaining the temperature of said composition at a temperature less than said critical temperature to induce said superconducting state in said metal oxide phase; and a source capable of providing an electrical current through said composition while said metal oxide phase is in said superconducting state.

319. An apparatus according to claim 318 wherein said composition comprises a substantially layered perovskite crystal structure.

320. An apparatus comprising: a source of a superconducting electrical current in a composition of matter comprising a $T_c$ greater than or equal to 26° K; said composition comprising at least one each of a III B element, an alkaline earth, and copper oxide and a temperature controller capable of maintaining said composition of matter at a temperature less than $T_c$.

321. An apparatus according to claim 320 wherein said composition of matter comprises a substantially layered perovskite crystal structure.

322. An apparatus comprising: a source of a superconducting electrical current in a composition of matter comprising a $T_c$ greater than or equal to 26° K, said composition comprising at least one each of a rare earth, alkaline earth, and copper oxide and a temperature controller capable of maintaining said composition of matter at a temperature less than said $T_c$.

323. An apparatus according to claim 322 wherein said composition of matter comprises substantially layered perovskite crystal structure.

324. An apparatus comprising: a source of a superconducting electrical current in a composition of matter comprising a $T_c$ greater than or equal to 26° K, said composition comprising at least one each of a rare earth, and copper oxide and a temperature controller capable of maintaining said composition of matter at a temperature less than said $T_c$.

325. An apparatus according to claim 324 wherein said composition of matter comprises a substantially layered perovskite crystal structure.

326. An apparatus comprising: a source of a superconducting electrical current in a composition of matter comprising a $T_c$ greater than or equal to 26° K carrying, said composition comprising at least one each of a III B element, and copper oxide and a temperature controller capable of maintaining said composition of matter at a temperature less than said $T_c$.

327. An apparatus according to claim 326 wherein said composition of matter comprises substantially layered perovskite crystal structure.

328. An apparatus comprising: a source of a superconducting electrical current in a transition metal oxide comprising a $T_c$ greater than or equal to 26° K and a temperature controller capable of maintaining said transition metal oxide at a temperature less than said $T_c$, said transition mental oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

329. An apparatus according to claim 328 wherein said transition metal oxide comprises substantially layered perovskite crystal structure.

330. An apparatus comprising: a source of a superconducting electrical current in a copper oxide composition of matter comprising a $T_c$ greater than or equal to 26° K and a temperature controller capable of maintaining said copper oxide composition of matter at a temperature less than said $T_c$, said copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

331. An apparatus according to claim 330 wherein said copper oxide composition comprises substantially layered perovskite crystal structure.

332. An apparatus comprising:
a composition including a transition metal, a group IIIB element, an alkaline earth element, and oxygen, where said composition is a mixed transition metal oxide comprising a non-stoichiometric amount of oxygen therein and exhibiting a superconducting state at a temperature greater than or equal to 26° K, a temperature controller capable of maintaining said composition in said superconducting state at a temperature greater than or equal to 26° K, and a source capable of providing an electrical current through said composition while said composition is in said superconducting state.

333. An apparatus according to claim 332, where said transition metal is copper.

334. An apparatus for causing electric current flow in a superconductive state at a temperature greater than or equal to 26° K, comprising:
(a) a superconductor element made of a superconductive composition, the superconductive composition consisting essentially of a copper-oxide compound comprising a substantially layered perovskite crystal structure, the composition comprising a superconductor transition temperature $T_c$ of greater than or equal to 26° K;
b) a temperature controller capable of maintaining the superconductor element at a temperature greater than or equal to 26° K and below the superconductor transition temperature $T_c$ of the superconductive composition;
(c) a source of an electric current to flow in the superconductor element, and
(d) said superconductive composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

335. An apparatus according to claim 334 in which the copper-oxide compound of the superconductive composition includes mixed valent copper ions.

336. An apparatus according to claim 335 in which the copper-oxide compound includes at least one element in a nonstoichiometric atomic proportion.

337. An apparatus according to claim 336 in which oxygen is present in the copper-oxide compound in a nonstoichiometric atomic proportion.

338. An An apparatus for causing electric current flow in a superconductive state at a temperature greater than or equal to 26° K, comprising:
(a) a superconductor element made of a superconductive composition, the superconductive composition consisting essentially of a copper-oxide compound comprising a substantially layered perovskite crystal structure, the composition comprising a superconductor transition temperature $T_c$ of greater than or equal to 26° K;
b) a temperature controller capable of maintaining the superconductor element at a temperature greater than or equal to 26° K and below the superconductor transition temperature $T_c$ of the superconductive composition;

(c) a source capable of providing an electric current to flow in the superconductor element, and the copper-oxide compound of the superconductive composition includes at least one element selected from the group consisting of a rare-earth element and a Group III B element and at least one alkaline-earth element.

339. An apparatus according to claim 338 in which the rare-earth or element is lanthanum.

340. An apparatus according to claim 338 in which the alkaline-earth element is barium.

341. An apparatus for conducting an electric current essentially without resistive losses, comprising:
  (a) a superconductor element made of a superconductive composition, the superconductive composition consisting essentially of a copper-oxide compound comprising a substantially layered perovskite crystal structure, the copper-oxide compound including at least one element selected from the group consisting of a rare-earth element and a Group III B element and at least one alkaline-earth element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
  (b) a temperature controller capable of maintaining the superconductor element at a temperature below the effectively-zero-bulk-resistivity intercept temperature $T_{p=0}$ of the superconductive composition; and
  (c) a source capable of providing an electric current to flow in the superconductor element.

342. An apparatus according to claim 341 in which said at least one element is lanthanum.

343. An apparatus according to claim 341 in which the alkaline-earth element is barium.

344. An apparatus according to claim 341 in which the copper-oxide compound of the superconductive composition includes mixed valent copper ions.

345. An apparatus according to claim 344 in which the copper-oxide compound includes at least one element in a nonstoichiometric atomic proportion.

346. An apparatus according to claim 345 in which oxygen is present in the copper-oxide compound in a nonstoichiometric atomic proportion.

347. An apparatus for causing electric-current flow in a superconductive state at a temperature greater than or equal to 26° K, comprising:
  (a) a superconductor element made of a superconductive composition, the superconductive composition consisting essentially of a copper-oxide compound comprising a substantially layered perovskite crystal structure, the composition comprising a superconductive transition temperature $T_c$ of greater than or equal to 26° K, said superconductive composition includes at least one element selected from the group consisting of a Group II A element, a rare earth element; and a Group III B element;
  (b) a temperature controller capable of maintaining the superconductor element at a temperature greater than or equal to 26° K and below the superconductor transition temperature $T_c$ of the superconductive composition; and
  (c) a source capable of providing an electric current to flow in the superconductor element.

348. An apparatus for conducting an electric current essentially without resistive losses, comprising:
  (a) a superconductor element made of a superconductive composition, the superconductive composition consisting essentially of a copper-oxide compound comprising a substantially layered perovskite crystal structure, the copper-oxide compound including at least one element selected from the group consisting of a Group II A element, a rare earth element and a Group III B element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
  (b) a temperature controller capable of maintaining the superconductor element at a temperature below the effectively-zero-bulk-resistivity intercept temperature $T_{p=0}$ of the superconductive composition, and
  (c) a source capable of providing an electric current to flow in the superconductor element.

349. An apparatus for causing electric-current flow in a superconductive state at a temperature greater than or equal to 26° K, comprising:
  (a) a superconductor element made of a superconductive composition, the superconductive composition consisting essentially of a copper-oxide compound comprising a substantially layered perovskite crystal structure, the composition comprising a superconductive transition temperature $T_c$ of greater than or equal to 26° K, said superconductive composition includes at least one element selected from the group consisting of a Group II A element and at least one element selected from the group consisting of a rare earth element and a Group III B element;
  (b) a temperature controller capable of maintaining the superconductor element at a temperature greater than or equal to 26° K and below the superconductor transition temperature $T_c$ of the superconductive composition; and
  (c) a source capable of providing an electric current to flow in the superconductor element.

350. An apparatus for conducting an electric current essentially without resistive losses, comprising:
  (a) a superconductor element made of a superconductive composition, the superconductive composition consisting essentially of a copper-oxide compound comprising a substantially layered perovskite crystal structure, the copper-oxide compound including at least one element selected from the group consisting of a Group II A element and at least one element selected from the group consisting of a rare earth element and a Group III B element, the composition comprising a superconductive/resistive transition defining a superconductive-resistive-transition temperature range between an upper limit defined by a transition-onset temperature Tc and a lower limit defined by an effectively-zero-bulk-resistivity intercept temperature $T_{p=0}$, the transition-onset temperature $T_c$ being greater than or equal to 26° K;
  (b) a temperature controller capable of maintaining the superconductor element at a temperature below the effectively-zero-bulk-resistivity intercept temperature $T_{p=0}$ of the superconductive composition; and
  (c) a source capable of providing an electric current to flow in the superconductor element.

351. An apparatus for causing electric-current flow in a superconductive state at a temperature greater than or equal to 26° K, comprising:
  (a) a superconductor element made of a superconductive composition, the superconductive composition consisting essentially of a transition metal oxide compound comprising a substantially layered perovskite crystal structure, the composition comprising a superconductive transition temperature $T_c$ of greater than or equal to 26° K, said superconductive composition includes at least one element selected from the group consisting of a Group II A element and at least one element selected from the group consisting of a rare earth element and a Group III B element;

(b) a temperature controller capable of maintaining the superconductor element at a temperature greater than or equal to 26° K and below the superconductor transition $T_c$ of the superconductive composition; and (c) a source capable of providing an electric current to flow in the superconductor element.

352. An apparatus for conducting an electric current essentially without resistive losses, comprising:

(a) a superconductor element made of a superconductive composition, the superconductive composition consisting essentially of a transition metal-oxide compound comprising a substantially layered perovskite crystal structure, the transition metal-oxide compound including at least one element selected from the group consisting of a Group II A element and at least one element selected from the group consisting of a rare earth element and a Group III B element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K:

(b) a temperature controller capable of maintaining the superconductor element at a temperature below the effectively-zero-bulk-resistivity intercept temperature $T_{p=0}$ of the superconductive composition; and (c) a source capable of providing providing an electric current to flow in the superconductor element.

353. A superconducting apparatus comprising: a composition having a transition temperature greater than or equal to 26° K, the composition including a rare earth or an element comprising a rare earth characteristic, a transition metal element capable of exhibiting multivalent states and oxygen, including at least one phase that exhibits superconductivity at temperature greater than or equal to 26° K, a temperature controller capable of maintaining said composition at said temperature to exhibit said superconductivity and a current source capable of passing an electrical superconducting current through said composition while exhibiting said superconductivity.

354. The superconducting apparatus of claim 353, further including an alkaline earth element substituted for at least one atom of said rare earth or element comprising a rare earth characteristic in said composition.

355. The superconducting apparatus of claim 354, where said rare earth or element comprising a rare earth characteristic is selected from the group consisting of La, Nd, and Ce.

356. The superconducting apparatus of claim 354, where said phase is crystalline with a structure comprising a perovskite characteristic.

357. The superconducting apparatus of claim 354, where said phase is crystalline with a structure comprising a perovskite related structure.

358. The superconducting apparatus of claim 353, where said phase is crystalline with a structure comprising a perovskite characteristic.

359. The superconducting apparatus of claim 353, where said phase exhibits a crystalline structure comprising a layered characteristic.

360. The superconducting apparatus of claim 353, where said phase is crystalline with a structure comprising a perovskite related structure.

361. A superconductive apparatus comprising: an element capable of carrying a superconductive current comprised of a copper oxide comprising a crystalline structure comprising a layered characteristic and at least one additional element substituted in said crystalline structure, said structure being oxygen deficient and exhibiting a superconducting onset temperature greater than or equal to 26° K, said copper oxide comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

362. A superconducting apparatus according to claim 361, wherein said copper oxide can be made according to known principles of ceramic science.

363. A combination, comprised of:

a transition metal oxide superconductor having a superconductor onset temperature greater than about 26° K including an element which results in a mixed valent state in said oxide, said oxide being crystalline and comprising a structure comprising a layered characteristic, a current source capable of passing a superconducting current through said copper oxide while it is maintained at a temperature greater than or equal to 26° K and less than said superconducting onset temperature, and a temperature controller capable of cooling said copper oxide to a superconductive state at a temperature greater than or equal to 26° K and less than said superconducting onset temperature said transition metal oxide comprising at least one element selected from the group consisting of a first element group, a second element group and combinations thereof, wherein said first element group comprises rare earth elements rare earth-like elements and Group IIIB elements and said second element group comprises alkaline earth elements and Group IIA elements.

364. A combination according to claim 363, wherein said copper oxide can be made according to known principles of ceramic science.

365. A combination, comprised of:

a material comprising a ceramic characteristic comprising an onset of superconductivity at an onset temperature greater than or equal to 26° K, a current source capable of passing a superconducting electrical current through said material comprising a ceramic characteristic while said material is maintained at a temperature greater than or equal to 26° K and less than said onset temperature, a temperature controller capable of cooling said superconducting material having a ceramic characteristic to a superconductive state at a temperature greater than or equal to 26° K and less than said onset temperature, said material being superconductive at temperatures below said onset temperature and a ceramic at temperatures above said onset temperature, and said material comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

366. A combination according to claim 365, wherein said material can be made by known principles of ceramic science.

367. An apparatus comprising a composition exhibiting superconductivity at temperatures greater than or equal to 26° K, said composition being a material comprising a ceramic characteristic in the RE-AE-TM-O system, where RE is a rare earth or near rare earth element, AE is an alkaline earth element, TM is a multivalent transition metal element having at least two valence states in said composition, and O is oxygen, the ratio of the amounts of said transition metal in said two valence states being determined by the ratio RE:AE, a source of current capable of passing a superconducting electric current in said transition metal oxide, and a cooling apparatus capable of maintaining said transition metal oxide below said onset temperature and at a temperature greater than or equal to 26° K.

368. An apparatus according to claim 367, wherein said composition can be made by known principles of ceramic science.

369. An apparatus comprising: an element capable of carrying a superconductive current comprising a superconductor having a superconducting onset temperature greater than or equal to 26° K, said superconductor being made by a method including the steps of:
 preparing powders of oxygen-containing compounds of a rare earth or rare earth-like element, an alkaline earth element, and copper,
 mixing said compounds and firing said mixture to create a mixed copper oxide composition including said alkaline earth element and said rare earth or rare earth-like element, and
 annealing said mixed copper oxide composition at an elevated temperature less than about 950° C. in an atmosphere including oxygen to produce a superconducting composition having a mixed copper oxide phase exhibiting a superconducting onset temperature greater than or equal to 26° K, said superconducting composition comprising a crystalline structure comprising a layered characteristic after said annealing step.

370. An apparatus comprising: an element capable of carrying a superconductive current comprising a superconductor having a superconducting onset temperature greater than or equal to 26° K, said superconductor being comprised of a rare earth or an element (RE) comprising a rare earth characteristic, an alkaline earth element (AE), copper (CU), and oxygen (O) and having the general formula RE-AE-CU-O, said superconductor being made by a method comprising the steps of combining said rare earth or element comprising a rare earth characteristic, said alkaline earth element and said copper in the presence of oxygen to produce a mixed copper oxide including said rare earth or rare earth-like element and said alkaline earth element therein, and
 heating said mixed copper oxide to produce a superconductor having a crystalline structure comprising a layered characteristic and exhibiting a superconducting onset temperature greater than or equal to 26° K the critical transition temperature of said superconductor being dependent on the amount of said alkaline earth element therein.

371. A combination, comprising:
 a mixed copper oxide composition including an alkaline earth element (AE) and a rare earth or element (RE) comprising a rare earth characteristic, said composition comprising a crystalline structure comprising a layered characteristic and multi-valent oxidation states, said composition exhibiting a substantially zero resistance to the flow of electrical current therethrough when cooled to a superconducting state at a temperature greater than or equal to 26° K, said mixed copper oxide having a superconducting onset temperature greater than or equal to 26° K, and
 a current source capable of passing an electrical superconducting current through said composition when said composition exhibits substantially zero resistance at a temperature greater than or equal to 26° K and less than said onset temperature.

372. The combination of claim 371, wherein said crystalline structure comprises a perovskite characteristic.

373. The combination of claim 371, wherein said crystalline structure comprises a perovskite related structure.

374. An apparatus comprising: an element capable of carrying a superconductive current comprising a superconductor having a superconducting onset temperature greater than or equal to 26° K, said superconductor being comprised of a rare earth or an element (RE) comprising a rare earth characteristic, an alkaline earth element (AE), a transition metal element (TM), and Oxygen (O) and having the general formula RE-AE-TM-O, said superconductor being made by a method comprising the steps of combining said rare earth or element comprising a rare earth characteristic, said alkaline earth element and said transition metal element in the presence of oxygen to produce a mixed transition metal oxide including said rare earth or element comprising a rare earth characteristic and said alkaline earth element therein, and
 heating said mixed transition metal oxide to produce superconductor having a crystalline structure comprising a layered characteristic and exhibiting a superconducting onset temperature greater than or equal to 26° K, said superconductor having a non-stoichiometric amount of oxygen therein.

375. A superconductive apparatus for causing electric-current flow in a superconductive state at a temperature greater than or equal to 26° K, comprising:
 (a) a superconductor element made of a superconductive composition, the superconductive composition comprising a transition metal oxide compound having a crystal structure comprising a perovskite characteristic and a layered characteristic, the composition having a superconductor transition temperature $T_c$ of greater than or equal to 26° K;
 (b) a temperature controller capable of maintaining the superconductor element at a temperature greater than or equal to 26° K and below the superconductor transition temperature $T_c$ of the superconductive composition;
 (c) a current source capable of causing an electric current to flow in the superconductor element; and
 (d) said superconductive composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

376. A superconductive apparatus for causing electric-current flow in a superconductive state at a temperature greater than or equal to 26° K, comprising:
 (a) a superconductor element made of a superconductive composition, the superconductive composition comprising a copper-transition metal oxide compound having a crystal structure comprising a perovskite characteristic and a layered characteristic, the composition having a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition;

(c) a current source capable of causing an electric current to flow in the superconductor element; and (d) the copper-oxide compound of the superconductive composition includes at least one rare-earth or element comprising a rare earth characteristic and at least one alkaline-earth element.

377. The superconductive apparatus according to claim 376 in which the rare-earth or element comprising a rare earth characteristic is lanthanum.

378. A superconductive apparatus for conducting an electric current essentially without resistive losses, comprising:

(a) a superconductor element made of a superconductive composition, the superconductive composition consisting essentially of a copper-oxide compound comprising a crystal structure comprising a layered characteristic and a perovskite characteristic, the copper-oxide compound including at least one rare-earth or element comprising a rare earth characteristic and at least one alkaline-earth element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{q=o}$, the transition-onset temperature $T_c$ being greater than or equal to 26° K;

(b) a temperature controller capable of maintaining the superconductor element at a temperature below the effectively-zero-bulk-resistivity intercept temperature $T_{p=o}$ of the superconductive composition; and (c) a current source capable of causing an electric current to flow in the superconductor element.

379. The superconductive apparatus according to claim 378 in which the rare-earth or an element comprising a rare earth characteristic is lanthanum.

380. An apparatus comprising:

a composition including a transition metal, a rare earth or an element comprising a rare earth characteristic, an alkaline earth element, and oxygen, where said composition is a mixed transition metal oxide having a non-stoichiometric amount of oxygen therein and exhibiting a superconducting state at a temperature greater than or equal to 26° K, a temperature controller capable of maintaining said composition in said superconducting state at a temperature greater than or equal to 26° K, and a current source capable of passing an electrical current through said composition while said composition is in said superconducting state.

381. An apparatus according to claim 380, wherein said composition can be made according to known principles of ceramic science.

382. A superconductive apparatus for causing electric current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite characteristic, the composition having a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition; and (c) a source capable of causing an electric current to flow in the superconductor element; and (d) said superconductive composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

383. A superconductive apparatus for causing electric current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite characteristic, the composition having a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition;

(c) a source capable of causing an electric current to flow in the superconductor element; and, the copper-oxide compound of the superconductive composition includes at least one rare-earth or an element comprising a rare earth characteristic and at least one alkaline-earth element.

384. The superconductive apparatus according to claim 383 in which the rare-earth or an element comprising a rare earth characteristic is lanthanum.

385. A superconductive apparatus for conducting an electric current essentially without resistive losses, comprising:

(a) a superconductor element made of a superconductive composition, the superconductive corn position consisting essentially of a copper-oxide compound comprising a crystal structure comprising a layered characteristic and a perovskite characteristic, the copper-oxide compound including at least one rare-earth or rare-earth-like element and at least one alkaline-earth element, the composition having a superconductive/resistive-transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a current source capable of causing an electric current to flow in the superconductor element.

386. The superconductive apparatus according to claim 385 in which the rare-earth or an element comprising a rare earth characteristic is lanthanum.

387. An apparatus for causing electric-current flow in a superconductive state at a temperature greater than or equal to 26° K, comprising:
- (a) a superconductor element made of a superconductive composition, the superconductive composition consisting essentially of a copper-oxide compound comprising a crystal structure comprising a layered characteristic and a perovskite characteristic, the composition having a superconductive transition temperature $T_c$ of greater than or equal to 26° K, said superconductive composition includes at least one element selected from the group consisting of a Group II A element, a rare earth element; and a Group III B element;
- (b) a temperature controller capable of maintaining the superconductor element at a temperature greater than or equal to 26° K and below the superconductor transition temperature $T_c$ of the superconductive composition; and
- (c) a current source capable of causing an electric current to flow in the superconductor element.

388. An apparatus for conducting an electric current essentially without resistive losses, comprising:
- (a) a superconductor element made of a superconductive composition, the superconductive composition consisting essentially of a copper-oxide compound comprising a crystal structure comprising a layered characteristic and a perovskite characteristic, the copper-oxide compound including at least one element selected from the group consisting of a Group II A element, a rare earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
- (b) a temperature controller capable of maintaining the superconductor element at a temperature below the effectively-zero-bulk-resistivity intercept temperature $T_{p=o}$ of the superconductive composition; and
- (c) a current source capable of causing an electric current to flow in the superconductor element.

389. A superconductive apparatus for causing electric-current flow in a superconductive state at a temperature greater than or equal to 26° K, comprising:
- (a) a superconductor element made of a superconductive composition, the superconductive composition consisting essentially of a copper-oxide compound comprising a crystal structure comprising a layered characteristic and a perovskite characteristic, the composition having a superconductive transition temperature $T_c$ of greater than or equal to 26° K, said superconductive composition includes at least one element selected from the group consisting of a Group II A element and at least one element selected from the group consisting of a rare earth element and a Group III B element;
- (b) a temperature controller capable of maintaining the superconductor element at a temperature greater than or equal to 26° K and below the superconductor transition temperature $T_c$ of the superconductive composition; and
- (c) a current source capable of causing an electric current to flow in the superconductor element.

390. A superconductive apparatus for conducting an electric current essentially without resistive losses, comprising:
- (a) a superconductor element made of a superconductive composition, the superconductive composition consisting essentially of a copper-oxide compound comprising a crystal structure comprising a layered characteristic and a perovskite characteristic, the copper-oxide compound including at least one element selected from the group consisting of a Group II A element and at least one element selected from the group consisting of a rare earth element and a Group III B element, the composition having a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
- (b) a temperature controller capable of maintaining the superconductor element at a temperature below the effectively-zero-bulk-resistivity intercept temperature $T_{p=0}$ of the superconductive composition; and
- (c) a current source capable of causing an electric current to flow in the superconductor element.

391. A superconductive apparatus for causing electric-current flow in a superconductive state at a temperature greater than or equal to 26° K, comprising:
- (a) a superconductor element made of a superconductive composition, the superconductive composition consisting essentially of a transition metal oxide compound comprising a crystal structure comprising a layered characteristic and a perovskite characteristic, the composition having a superconductive transition temperature $T_c$ of greater than or equal to 26° K, said superconductive composition includes an element selected from the group consisting of a Group II A element and at least one element selected from the group consisting of a rare earth element and a Group III B element;
- (b) a temperature controller capable of maintaining the superconductor element at a temperature greater than or equal to 26° K and below the superconductor transition $T_c$ of the superconductive composition; and
- (c) a current source capable of causing an electric current to flow in the superconductor element.

392. A superconductive apparatus for conducting an electric current essentially without resistive losses, comprising:
- (a) a superconductor element made of a superconductive composition, the superconductive corn position consisting essentially of a transition metal-oxide compound comprising a crystal structure comprising a layered characteristic and a perovskite characteristic, the transition metal-oxide compound including at least one element selected from the group consisting of a Group II A element and at least one element selected from the group consisting of a rare earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
- (b) a temperature controller capable of maintaining the superconductor element at a temperature below the effectively-zero-bulk-resistivity intercept temperature $T_{p=0}$ of the superconductive composition; and
- (c) a current source capable of causing an electric current to flow in the superconductor element.

393. A superconductive apparatus for causing electric-current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite characteristic, the composition having a superconductive transition temperature $T_c$ of greater than or equal to 26° K, said superconductive composition includes a Group II A element, and at least one element selected from the group consisting of a rare earth element and a Group III B element;
(b) a temperature controller capable of maintaining the superconductor element at a temperature greater than or equal to 26° K and below the superconductor transition temperature $T_c$ of the superconductive composition; and
(c) a current source capable of causing an electric current to flow in the superconductor element.

394. A superconductive apparatus for conducting an electric current essentially without resistive losses, comprising:
(a) a superconductor element made of a superconductive composition, the superconductive composition consisting essentially of a copper-oxide compound comprising a crystal structure comprising a layered characteristic and a perovskite characteristic, the copper-oxide compound including Group II A element, and at least one element selected from the group consisting of a rare earth element and a Group III B element, the composition having a superconductive-resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a current source capable of causing an electric current to flow in the superconductor element.

395. An apparatus capable of carrying electric current flow in a superconductive state at a temperature greater than or equal to 26° K, comprising:
(a) a superconductor element made of a superconductive composition, the superconductive composition consisting essentially of a copper-oxide compound comprising a crystal structure comprising a layered characteristic and a perovskite characteristic, the composition comprising a superconductor transition temperature $T_c$ of greater than or equal to 26° K;
(b) a temperature controller capable of maintaining the superconductor element at a temperature greater than or equal to 26° K and below the superconductor transition temperature $T_c$ of the superconductive composition; and
(c) a source capable of providing an electric current to flow in the superconductor element, and
(d) said superconducting composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

396. A superconductive apparatus for conducting an electric current essentially without resistive losses, comprising:
(a) a superconductor element made of a superconductive composition, the superconductive composition consisting essentially of a copper-oxide compound comprising a crystal structure comprising a layered characteristic and a perovskite characteristic, the copper-oxide compound including Group II A element, and at least one element selected from the group consisting of a rare earth element and a Group III B element, the composition having a superconductive-resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition;
(c) a current source capable of causing an electric current to flow in the superconductor element, and
(d) the copper-oxide compound of the superconductive composition includes at least one rare-earth or an element comprising a rare earth characteristic and at least one alkaline-earth element.

397. An apparatus according to claim 396 in which the rare-earth or element comprising a rare earth characteristic is lanthanum.

398. An apparatus for conducting an electric current essentially without resistive losses, comprising:
(a) a superconductor element made of a superconductive composition; the superconductive composition consisting essentially of a copper-oxide compound comprising a layer-type perovskite-like crystal structure, the copper-oxide compound comprising at least one rare-earth or element comprising a rare earth characteristic and at least one alkaline-earth element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 28° K;
(b) a temperature controller capable of maintaining the superconductor element at a temperature below the effectively-zero-bulk-resistivity intercept temperature $T_{p=0}$ of the superconductive composition; and
(c) a source capable of providing an electric current to flow in the superconductor element.

399. An apparatus according to claim 398 in which the rare earth or element comprising a rare earth characteristic is lanthanum.

400. An apparatus capable of carrying an electric-current flow in a superconductive state at a temperature greater than or equal to 26° K, comprising:
(a) a superconductor element made of a superconductive composition, the superconductive composition consisting essentially of a copper-oxide compound comprising a crystal structure comprising a layered characteristic and a perovskite characteristic, the composition comprising a superconductive transition temperature $T_c$ of greater than or equal to 26° K, said superconductive composition includes at least one element selected from the group consisting of a Group II A element, a rare earth element; and a Group III B element;
(b) a temperature controller capable of maintaining the superconductor element at a temperature greater than or equal to 26° K and below the superconductor transition temperature $T_c$ of the superconductive composition; and (c) a source capable of providing an electric current to flow in the superconductor element.

401. An apparatus capable of carrying an electric current essentially without resistive losses, comprising:

(a) a superconductor element made of a superconductive composition, the superconductive composition consisting essentially of a copper-oxide compound comprising a crystal structure comprising a layered characteristic and a perovskite characteristic, the copper-oxide compound including at least one element selected from the group consisting of a Group II A element, a rare earth element and a Group III B element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a source capable of providing an electric current to flow in the superconductor element.

402. An apparatus capable of carrying an electric-current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite characteristic, the composition comprising a superconductive transition temperature $T_c$ of greater than or equal to 26° K, said superconductive composition includes at least one element selected from the group consisting of a Group II A element and at least one element selected from the group consisting of a rare earth element and a Group III B element;

(b) a temperature controller capable of maintaining the superconductor element at a temperature greater than or equal to 26° K and below the superconductor transition temperature $T_c$ of the superconductive composition; and (c) a source capable of providing an electric current to flow in the superconductor element.

403. An apparatus for conducting an electric current essentially without resistive losses, comprising:

(a) a superconductor element made of a superconductive composition, the superconductive composition consisting essentially of a copper-oxide compound comprising a crystal structure comprising a layered characteristic and a perovskite characteristic, the copper-oxide compound including at least one element selected from the group consisting of a Group II A element and at least one element selected from the group consisting of a rare earth element and a Group III B element, the composition comprising a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition: and (c) a source capable of providing an electric current to flow in the superconductor element.

404. An apparatus capable of carrying an electric-current flow in a superconductive state at a temperature greater than or equal to 26° K, comprising:

(a) a superconductor element made of a superconductive composition, the superconductive composition consisting essentially of a transition metal oxide compound comprising a crystal structure comprising a layered characteristic and a perovskite characteristic, the composition comprising a superconductive transition temperature $T_c$ of greater than or equal to 26° K, said superconductive composition includes at least one element selected from the group consisting of a Group II A element and at least one element selected from the group consisting of a rare earth element and a Group III B element;

(b) a temperature controller capable of maintaining the superconductor element at a temperature greater than or equal to 26° K and below the superconductor transition $T_c$ of the superconductive composition; and (c) a source capable of providing an electric current to flow in the superconductor element.

405. An apparatus for conducting an electric current essentially without resistive losses, comprising:

(a) a superconductor element made of a superconductive composition, the superconductive composition consisting essentially of a transition metal-oxide compound comprising a crystal structure comprising a layered characteristic and a perovskite characteristic, the transition metal-oxide compound including at least one element selected from the group consisting of a Group II A element and at least one element selected from the group consisting of a rare earth element and a Group III B element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a source capable of providing an electric current to flow in the superconductor element.

406. An apparatus for conducting an electric current essentially without resistive losses, comprising:

(a) a superconductor element made of a superconductive composition, the superconductive composition consisting essentially of a copper-oxide compound comprising a crystal structure comprising a layered characteristic and a perovskite characteristic, the copper-oxide compound including at least one element selected from the group consisting of a group II A element, at least one element selected from the group consisting of a rare earth element and at least one element selected from the group consisting of a Group III B element, the composition comprising a superconductive-resistive transition temperature defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a source capable of providing an electric current to flow in the superconductor element.

407. An apparatus capable of carrying electric current flow in a superconductive state at a temperature greater than or equal to 26° K, comprising:

a superconductive element capable of carrying a superconductive current comprising a superconductive composition, said superconductive composition comprising a transition metal, O and at least one element selected from the group consisting of Be, Mg, Ca, Sr, Ba, Ra, Sc, Y, La, Ce, Pr, Nd, Pm, Sm, Eu, Gd, Tb, Dy, Ho, Er, Tm, Yb, and Lu; and said composition comprising a superconductor transition temperature $T_c$ of greater than or equal to 26° K.

408. An apparatus according to claim 407, further including:

a temperature controller capable of maintaining the superconductor element at a temperature greater than or equal to 26° K and below the superconductor transition temperature $T_c$ of the superconductive composition; and a source capable of providing an electric current to flow in the superconductor element.

409. An apparatus according to claim 408, wherein said composition comprises a substantially layered structure.

410. An apparatus according to claim 407, wherein said composition comprises a substantially layered structure.

411. An apparatus comprising: a a superconductive element for conducting a superconducting current at a temperature greater than or equal to 26° K and a current source for providing an electric current to flow in said means for conducting a superconducting current, and said superconducting element comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

412. An apparatus according to claim 411, wherein said superconductive element for conducting a superconductive current comprises a $T_c$ greater than or equal to 26° K.

413. An apparatus according to claim 411, further including a temperature controller capable of maintaining said means for conducting a superconducting current at a said temperature.

414. An apparatus comprising:

a superconductive element capable of carrying a superconductive current comprising $T_c$ greater than or equal to 26° K;

said superconductive element comprises a property selected from one or more of the group consisting of a mixed valent oxide, a transition metal, a mixed valent transition metal, a perovskite structure, a perovskite-like structure, a perovskite related structure, a layered structure, a stoichiomeric or nonstoichiomeric oxygen contents and a dopant, and said said superconductive element comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

415. An apparatus according to claim 414, wherein said superconductive element is at a temperature greater than or equal to 26° K.

416. An apparatus according to claim 414, further including a temperature controller capable of maintaining said superconductive element at a temperature less than said $T_c$.

417. An apparatus comprising:

a superconductive element capable of carrying a superconductive current comprising $T_c$ greater than or equal to 26° K;

said superconductive element comprises transition metal oxide, a layered perovskite structure or a layered perovskite-like structure and comprises a stoichiomeric or nonstoichiomeric oxygen content and at least one element selected from the group consisting of a first element group, a second element group and combinations thereof, wherein said first element group comprises rare earth elements rare earth-like elements and Group IIIB elements and said second element group comprises alkaline earth elements and Group IIA elements.

418. An apparatus according to claim 417, wherein said superconductive element is at a temperature greater than or equal to 26° K.

419. An apparatus according to claim 417, further including a temperature controller capable of maintaining said superconductive element at a temperature less than said $T_c$.

420. An apparatus according to claim 417, wherein said superconductive element comprises copper oxide.

421. An apparatus according to claim 420, wherein said superconductive element can be made according to known principles of ceramic science.

422. A superconductive apparatus for causing electric-current flow in a superconductive state at a temperature greater than or equal to 26° K, comprising:

(a) a superconductor element made of a superconductive composition, the superconductive composition comprising a copper-oxide compound having a crystal structure comprising a perovskite related structure and a layered characteristic, the composition having a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition;

(c) a current source capable of causing an electric current to flow in the superconductor element; and (d) said superconductive composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

423. A superconductive apparatus or conducting an electric current essentially without resistive losses, comprising:

(a) a superconductor element made of a superconductive composition, the superconductive composition consisting essentially of a copper-oxide compound comprising a crystal structure comprising a layered characteristic and a perovskite related structure, the copper-oxide compound including at least one rare-earth or element comprising a rare earth characteristic and at least one alkaline-earth element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{q=o}$, the transition-onset temperature $T_c$ being greater than or equal to 26° K;

(b) a temperature controller capable of maintaining the superconductor element at a temperature below the effectively-zero-bulk-resistivity intercept temperature $T_{q=o}$, of the superconductive composition; and (c) a current source capable of causing an electric current to flow in the superconductor element.

424. A superconductive apparatus for causing electric current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite related structure, the composition having a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition;

(c) a source capable of causing an electric current to flow in the superconductor element; and (d) said superconductive composition comprising at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

425. A superconductive apparatus for conducting an electric current essentially without resistive losses, comprising:

(a) a superconductor element made of a superconductive composition, the superconductive composition consisting essentially of a copper-oxide compound comprising a crystal structure comprising a layered characteristic and a perovskite related structure, the copper-oxide compound including at least one rare-earth or rare-earth-like element and at least one alkaline-earth element, the composition having a superconductive/resistive-transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a current source capable of causing an electric current to flow in the superconductor element.

426. An apparatus for causing electric-current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite related structure, the composition having a superconductive transition temperature $T_c$ of greater than or equal to 26° K, said superconductive composition includes at least one element selected from the group consisting of a Group II A element, a rare earth element; and a Group III B element; and (b) a temperature controller capable of maintaining the superconductor element at a temperature greater than or equal to 26° K and below the superconductor transition temperature $T_c$ of the superconductive composition; and (c) a current source capable of causing an electric current to flow in the superconductor element.

427. An apparatus for conducting an electric current essentially without resistive losses, comprising:

(a) a superconductor element made of a superconductive composition, the superconductive composition consisting essentially of a copper-oxide compound comprising a crystal structure comprising a layered characteristic and a perovskite related structure, the copper-oxide compound including at least one element selected from the group consisting of a Group II A element, a rare earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=o}$ of the superconductive composition; and (c) a current source capable of causing an electric current to flow in the superconductor element.

428. A superconductive apparatus for causing electric-current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite related structure, the composition having a superconductive transition temperature $T_c$ of greater than or equal to 26° K, said superconductive composition includes at least one element selected from the group consisting of a Group II A element and at least one element selected from the group consisting of a rare earth element and a Group III B element;

(b) a temperature controller capable of maintaining the superconductor element at a temperature greater than or equal to 26° K and below the superconductor transition temperature $T_c$ of the superconductive composition; and (c) a current source capable of causing an electric current to flow in the superconductor element.

429. A superconductive apparatus for conducting an electric current essentially without resistive losses, comprising;

(a) a superconductor element made of a superconductive composition, the uperconductive composition consisting essentially of a copper-oxide compound comprising a crystal structure comprising a layered characteristic and a perovskite related structure, the copper-oxide compound including at least one element selected from the group consisting of a Group II A element and at least one element selected from the group consisting of a rare earth element and a Group III B element, the composition having a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a current source capable of causing an electric current to flow in the superconductor element.

430. A superconductive apparatus for causing electric-current flow in a superconductive state at a temperature greater than or equal to 26° K, comprising:

(a) a superconductor element made of a superconductive composition, the superconductive composition consisting essentially of a transition metal oxide compound comprising a crystal structure comprising a layered characteristic and a perovskite related structure, the composition having a superconductive transition temperature $T_c$ of greater than or equal to 26° K, said superconductive composition includes an element selected from the group consisting of a Group II A element and at least one element selected from the group consisting of a rare earth element and a Group III B element;

(b) a temperature controller capable of maintaining the superconductor element at a temperature greater than or equal to 26° K and below the superconductor transition $T_c$ of the superconductive composition; and (c) a current source capable of causing an electric current to flow in the superconductor element.

431. A superconductive apparatus for conducting an electric current essentially without resistive losses, comprising:

(a) a superconductor element made of a superconductive composition, the superconductive composition consisting essentially of a transition metal-oxide compound comprising a crystal structure comprising a layered characteristic and a perovskite related structure, the transition metal-oxide compound including at least one element selected from the group consisting of a Group II A element and at least one element selected from the group consisting of a rare earth element and a Group III B element, the composition having a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a current source capable of causing an electric current to in the superconductor element.

432. A superconductive apparatus for causing electric-current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite related structure, the composition having a superconductive transition temperature $T_c$ of greater than or equal to 26° K, said superconductive composition includes a Group II A element, and at least one element selected from the group consisting of a rare earth element and a Group III B element;

(b) a temperature controller capable of maintaining the superconductor element at a temperature greater than or equal to 26° K and below the superconductor transition temperature $T_c$ of the superconductive composition; and (c) a current source capable of causing an electric current to flow in the superconductor element.

433. A superconductive apparatus for conducting an electric current essentially without resistive losses, comprising:

(a) a superconductor element made of a superconductive composition, the superconductive composition consisting essentially of a copper-oxide compound comprising a crystal structure comprising a layered characteristic and a perovskite related structure, the copper-oxide compound including Group II A element, and at least one element selected from the group consisting of a rare earth element and a Group III B element, the composition having a superconductive-resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a current source capable of causing an electric current to flow in the superconductor element.

434. An apparatus capable of carrying electric current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite related structure, the composition comprising a superconductor transition temperature $T_c$ of greater than or equal to 26° K;

(b) a temperature controller capable of maintaining the superconductor element at a temperature greater than or equal to 26° K and below the superconductor transition temperature $T_c$ of the superconductive composition;

(c) a source capable of providing an electric current to flow in the superconductor element, and (d) said superconductive composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

435. An apparatus capable of carrying an electric-current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite related structure, the composition comprising a superconductive transition temperature $T_c$ of greater than or equal to 26° K, said superconductive composition includes at least one element selected from the group consisting of a Group IIA element, a rare earth element; and a Group III B element;

(b) a temperature controller capable of maintaining the superconductor element at a temperature greater than or equal to 26° K and below the superconductor transition temperature $T_c$ of the superconductive composition; and (c) a source capable of providing an electric current to flow in the superconductor element.

436. An apparatus capable of carrying an electric current essentially without resistive losses, comprising:

(a) a superconductor element made of a superconductive composition, the superconductive composition consisting essentially of a copper-oxide compound comprising a crystal structure comprising a layered characteristic and a perovskite related structure, the copper-oxide compound including at least one element selected from the group consisting of a Group IIA element, a rare earth element and a Group III B element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature T being greater than or equal to 26° K;

(b) a temperature controller capable of maintaining the superconductor element at a temperature below the effectively-zero-bulk-resistivity intercept temperature $T_{p=0}$ of the superconductive composition; and (c) a source capable of providing an electric current to flow in the superconductor element.

437. An apparatus capable of carrying an electric-current flow in a superconductive state at a temperature greater than or equal to 26° K, comprising:

(a) a superconductor element made of a superconductive composition, the superconductive composition consisting essentially of a copper-oxide compound comprising a crystal structure comprising a layered characteristic and a perovskite related structure, the composition comprising a superconductive transition temperature $T_c$ of greater than or equal to 26° K, said superconductive composition includes at least one element selected from the group consisting of a Group IIA element and at least one element selected from the group consisting of a rare earth element and a Group III B element;

(b) a temperature controller capable of maintaining the superconductor element at a temperature greater than or equal to 26° K and below the superconductor transition temperature $T_c$ of the superconductive composition; and (c) a source capable of providing an electric current to flow in the superconductor element.

438. An apparatus for conducting an electric current essentially without resistive losses, comprising:

(a) a superconductor element made of a superconductive composition, the superconductive composition consisting essentially of a copper-oxide compound comprising a crystal structure comprising a layered characteristic and a perovskite related structure, the copper-oxide compound including at least one element selected from the group consisting of a Group IIA element and at least one element selected from the group consisting of a rare earth element and a Group III B element, the composition comprising a superconductive/resistive transition defining a superconductive-resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a source capable of providing an electric current to flow in the superconductor element.

439. An apparatus capable of carrying an electric-current flow in a superconductive state at a temperature greater than or equal to 26° K, comprising:

(a) a superconductor element made of a superconductive composition, the superconductive composition consisting essentially of a transition metal oxide compound comprising a crystal structure comprising a layered characteristic and a perovskite related structure, the composition comprising a superconductive transition temperature $T_c$ of greater than or equal to 26° K, said superconductive composition includes at least one element selected from the group consisting of a Group IIA element and at least one element selected from the group consisting of a rare earth element and a Group III B element;

(b) a temperature controller capable of maintaining the superconductor element at a temperature greater than or equal to 26° K and below the superconductor transition $T_c$ of the superconductive composition; and (c) a source capable of providing an electric current to flow in the superconductor element.

440. An apparatus for conducting an electric current essentially without resistive losses, comprising:

(a) a superconductor element made of a superconductive composition, the superconductive composition consisting essentially of a transition metal-oxide compound comprising a crystal structure comprising a layered characteristic and a perovskite related structure, the transition metal-oxide compound including at least one element selected from the group consisting of a Group IIA element and at least one element selected from the group consisting of a rare earth element and a Group III B element, the composition comprising a superconductive/resistive transition defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;

(b) a temperature controller capable of maintaining the superconductor element at a temperature below the effectively-zero-bulk-resistivity intercept temperature $T_{p=0}$ of the superconductive composition; and (c) a source capable of providing an electric current to flow in the superconductor element.

441. An apparatus for conducting an electric current essentially without resistive losses, comprising:

(a) a superconductor element made of a superconductive composition, the superconductive composition consisting essentially of a copper-oxide compound comprising a crystal structure comprising a layered characteristic and a perovskite related structure, the copper-oxide compound including at least one element selected from the group consisting of a group IIA element, at least one element selected from the group consisting of a rare earth element and at least one element selected from the group consisting of a Group III B element, the composition comprising a superconductive-resistive transition temperature defining a superconductive/resistive-transition temperature range between an upper limit defined by a transition-onset temperature $T_c$ and a lower limit defined by an effectively-zero-bulk-resistivity intercept temperature $T_{p=0}$, the transition-onset temperature $T_c$ being greater than or equal to 26° K;
(b) a temperature controller capable of maintaining the superconductor element at a temperature below the effectively-zero-bulk-resistivity intercept temperature $T_{p=0}$ of the superconductive composition; and
(c) a source capable of providing an electric current to flow in the superconductor element.

442. An apparatus comprising:
a superconductive element capable of carrying a superconductive current comprising
$T_c$ greater than or equal to 26° K:
said superconductive element comprises a metallic, oxygen-deficient, perovskite-like, mixed valent copper compound, said compound comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

443. An apparatus according to claim 442, wherein said superconductive element is at a temperature greater than or equal to to 26° K.

444. An apparatus according to claim 442, further including a temperature controller capable of maintaining said superconductive element at a temperature less than said $T_c$.

445. An apparatus comprising:
a superconductive element capable of carrying a superconductive current comprising $T_c$ greater than or equal to 26° K;
said superconductive element comprises a composition that can be made according to known principles of ceramic science, and
said composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

446. An apparatus according to claim 445, wherein said superconductive element is at a temperature greater than or equal to 26° K.

447. An apparatus according to claim 446, further including a temperature controller capable of maintaining said superconductive element at a temperature less than said $T_c$.

448. An apparatus according to claim 445, wherein said superconductive element comprises copper oxide.

449. An apparatus comprising: a superconductor exhibiting a superconducting onset at an onset temperature greater than or equal to 26° K, said superconductor being comprised of at least four elements, none of which is a means for carrying a superconducting current at a temperature greater than or equal to 26° K, a temperature controller capable of maintaining said superconductor at an operating temperature in excess of said onset temperature to maintain said superconductor in a superconducting state and a current source capable of passing current through said superconductor while in said superconducting state, said superconductor comprises a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

450. An apparatus comprising:
a component for carrying a superconductive current exhibiting a superconductive state at a temperature greater than or equal to 26° K,
a cooler capable of cooling said composition to a temperature greater than or equal to 26° K at which temperature said means for carrying a superconductive current exhibits said superconductive state,
a current source capable of passing an electrical current through said composition while said composition is in said superconductive state; and
said component comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

451. An apparatus according to claim 450, wherein said means for carrying a superconductive current can be made according to known principles of ceramic science.

452. An apparatus comprising:
a metallic, oxygen-deficient, perovskite-like, mixed valent transition metal composition exhibiting a superconductive state at a temperature greater than or equal to 26° K,
a temperature controller capable of maintaining said composition at a temperature greater than or equal to 26° K at which temperature said composition exhibits said superconductive state,
a current source capable of passing an electrical current through said composition while said composition is in said superconductive state; and
said metallic, oxygen-deficient, perovskite-like, mixed valent transition metal composition comprising a transition metal, oxygen and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

453. The apparatus of claim 452, where said metallic, oxygen-deficient, perovskite-like, mixed valent transition metal composition is layered.

454. The apparatus of claim 452, where said metallic, oxygen-deficient, perovskite-like, mixed valent transition metal composition is comprised of a multiphase material comprising a superconductive phase.

455. An apparatus comprising:
a composition comprising oxygen exhibiting a superconductive state at a temperature greater than or equal to 26° K, a temperature controller capable of maintaining said composition at a temperature greater than or equal to 26° K at which temperature said composition exhibits said superconductive state,
a source capable of providing an electrical current through said composition while said composition is in said superconductive state; and
said composition comprising a transition metal and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

456. An apparatus according to claim 455, where said composition is layered.

457. An apparatus according to claim 456, where said composition is comprised of of at least one superconductive phase.

458. A combination, comprising:
an oxygen containing composition exhibiting the onset of a DC substantially zero resistance state at an onset temperature in excess of 30° K,
a current source capable of passing an electrical current through said composition while it is in said substantially zero resistance state; and
said composition further comprising a transition metal, and at least one element selected from the group consisting of a first element group, a second element group and combinations thereof, wherein said first element group comprises rare earth elements, rare earth-like elements and Group IIIB elements and said second element group comprises alkaline earth elements and Group IIA elements.

459. An apparatus according to claim 449, wherein said superconductor can be made according to known principles of ceramic science.

460. A combination according to claim 458, wherein said composition can be made according to known principles of ceramic science.

461. An apparatus comprising:
a composition comprising a transition metal, oxygen and any element selected from the group consisting of a Group II A element, a rare earth element and a Group III B element, where said composition is a mixed copper oxide having a non-stoichiometric amount of oxygen therein and exhibiting a superconducting state at a temperature greater than or equal to 26° K;
a temperature controller capable of maintaining said composition in said superconducting state at a temperature greater than or equal to 26° K; and
a current source capable of passing an electrical current through said composition while said composition is in said superconducting state.

462. An apparatus comprising:
a composition comprising a transition metal, oxygen and (1) a rare earth element or a rare earth-like element or a group III B element, and/or (2) an alkaline earth element or a Group IIA element, where said composition exhibits a superconducting state at a temperature greater than or equal to 26° K;
a temperature controller capable of maintaining said composition in said superconducting state at a temperature greater than or equal to 26° K; and
a current source capable of passing an electrical current through said composition while said composition is in said superconducting state.

463. A structure comprising:
a circuit comprising a circuit element comprising a material comprising a $T_c$ greater than or equal to 26° K capable of carrying a superconducting current
said material comprises a transition metal, oxygen and at least one element selected from the group consisting of a first element group, a second element group and combinations thereof;
said first element group comprises rare earth elements, rare earth-like elements and Group IIIB elements; and
said second element group comprises alkaline earth elements and Group IIA elements.

464. A structure according to claim 463 wherein said material comprises a metallic, oxygen-deficient, perovskite-like, mixed valent copper compound.

465. A structure according to claim 463 wherein said material comprises a multiphase material wherein at least one phase exhibits superconductivity.

466. A structure according to claim 463 wherein said structure is selected from the group consisting of a machine and an article of manufacture.

467. A structure according to claim 463 wherein said material comprises at least one element selected from each of said first element group and said second element group.

468. A structure according to claim 463 where in said structure is selected from the group consisting of a machine and an article of manufacture.

469. An structure according to claim 463 further including a temperature controller capable of maintaining said material at a temperature less than or equal to said to said $T_c$.

470. A structure according to claim 469 further including a current source capable of providing said superconducting current.

471. A structure according to claim 470 wherein said material is capable of being at a temperature less than equal to said $T_c$ and greater than or equal to 26° K.

472. A structure according to claim 471 said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal, a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (RE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

473. A structure according to claim 470 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content, a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE, a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

474. A structure according to claim 469 wherein said material is capable of being at a temperature less than or equal to said $T_c$ and greater than or equal to 26° K.

475. A structure according to claim 474 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material, a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE, a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

476. A structure according to claim 469 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material, a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (RE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

477. A structure according to claim 463 further including a current source capable of providing said superconducting current.

478. A structure according to claim 477 wherein said material is capable of being at a temperature less than or equal to said $T_c$ and greater than or equal to 26° K.

479. A structure according to claim 478 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure, a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (RE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

480. A structure according to claim 477 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure, a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-RE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states, a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}(Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

481. A structure according to claim 463 wherein said material is capable of being at a temperature less than or equal to said $T_c$ and greater than or equal to 26° K.

482. A structure according to claim 481 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure, a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-RE-TM-O system, where RE is a rare earth or near are earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element alkaline earth like element or said element with an alkaline earth characteristic where the superconducting copper oxide phase in said material undergoes an orthorhombic to tetragonal structural phase transition,
a mixed copper oxide doped with an element chosen to result in Cu ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 25° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

483. A structure according to claim 463 wherein said material comprises at least one phase which comprises a property selected from the group consisting of:
a layered structure,
a layered crystalline structure,
a substantially layered structure,
a substantially layered crystalline structure,
a layered-like structure,
a layered-type structure, a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-RE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

484. A structure according to claim 463, wherein said transition metal is selected from the group consisting of copper, nickel and chromium.

485. A structure according to claim 463 wherein said rare earth-like elements comprise a a property which make it essentially a rare earth element.

486. A structure according to claim 463 wherein said composition comprises one or more of Be, Mg, Ca, Sr, Ba, Ra, Sc, Y, La, Ce, Pr, Nd, Pm, Sm, Eu, Gd, Tb, Dy, Ho, Er, Tm, Yb and Lu.

487. A structure according to claim 463 wherein said composition comprises one or more of one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

488. A structure according to claim 463 wherein said material can be made according to known principles of ceramic science.

489. A structure according to claim 463 wherein said material comprises a metallic, oxygen-deficient, perovskite-like, mixed valent transition metal compound.

490. A structure comprising:
a circuit comprising a circuit element comprising a material comprising a $T_c$ greater than or equal to 26° K, said material exhibiting a substantially zero resistance to the flow of electrical current therethrough when in a superconducting state;
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

491. An structure according to claim 490 further including a temperature controller capable of maintaining said material at a temperature less than or equal to said to said $T_c$.

492. A structure according to claim 491 further including a current source capable of providing said superconducting current.

493. A structure according to claim 492 wherein said material is capable of being at a temperature less than equal to said $T_c$ and greater than or equal to 26° K.

494. A structure according to claim 493 said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (RE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

495. A structure according to claim 492 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide,
a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

496. A structure according to claim 491 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (RE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
a mixed copper oxide doped with an element chosen to result in $Cu^{3+}$ ions in said material,
a doped transition metal oxide, a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 26° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

497. A structure according to claim 490 further including a current source capable of providing said superconducting current.

498. A structure according to claim 497 wherein said material is capable of being at a temperature less than or equal to said $T_c$ and greater than or equal to 26° K.

499. A structure according to claim 498 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (RE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element alkaline earth like element or said element with an alkaline earth characteristic where the superconducting copper oxide phase in said material undergoes an orthorhombic to tetragonal structural phase transition, a mixed copper oxide doped with an element chosen to result in $Cu^{3+}$ ions in said material, a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

500. A structure according to claim 497 wherein said material comprises at least one phase which comprises a property selected from the group consisting of:

a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-RE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping,
a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition, a mixed copper oxide doped with an element chosen to result in $Cu^{3+}$ ions in said material, a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}(Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

501. A structure according to claim 490 wherein said material is capable of being at a temperature less than or equal to said $T_c$ and greater than or equal to 26° K.

502. A structure according to claim 501 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-RE-TM-O system, where RE is a rare earth or near are earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide,
a mixed oxide with alkaline earth-like doping, a copper oxide wherein said alkaline earth or alkaline earth element is atomically large with respect to copper,
a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element alkaline earth like element or said element with an alkaline earth characteristic where the superconducting copper oxide phase in said material undergoes an orthorhombic to tetragonal structural phase transition,
a mixed copper oxide doped with an element chosen to result in Cu ions in said material,
a doped transition metal oxide,
a copper oxide wherein at least one other element is an element which results in $Cu^{3+}$ ions in said material,
a copper oxide wherein at least one other element is an element chosen to result in the presence of both $Cu^{2+}$ and $Cu^{3+}$ ions,
a substituted copper oxide exhibiting mixed valence states,
a superconductor being comprised of at least four elements, none of which is itself superconducting at a temperature greater than or equal to 25° K,
at least four elements, none of which is itself a superconductor,
a superconductor being comprised of said transition element which itself is not superconducting,
a superconductor being an oxide having multivalent oxidation states,
a transition metal oxide having substitutions therein, the amount of said substitutions being sufficient to produce sufficient electron-phonon interactions in said material that said material exhibits said superconductivity,
a crystalline mixed valent oxide having a layer-like structure,
at least one element in a nonstoichiometric atomic proportion,
a composition of the formula $Ba_xLa_{x-5}Cu_5O_Y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K,
a composition wherein at least one element is in a nonstoichiometric atomic proportion;
a composition comprising a metallic, oxygen-deficient, perovskite-like, mixed valent transition metal compound, and
combinations thereof.

503. A structure according to claim 490 wherein said material comprises at least one phase which comprises a property selected from the group consisting of:
a layered structure,
a layered crystalline structure,
a substantially layered structure,
a substantially layered crystalline structure,
a layered-like structure,
a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoiciomeric oxygen content,
a non-stoiciomeric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE:RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping, a substituted transition metal oxide, a mixed oxide with alkaline earth-like doping, a copper oxide wherein said alkaline earth or alkaline earth element is atomically large with respect to copper, a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition, a mixed copper oxide doped with an element chosen to result in $Cu^{3+}$ ions in said material, a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

504. A structure according to claim 490, wherein said transition metal is selected from the group consisting of copper, nickel and chromium.

505. A structure according to claim 490 wherein said composition comprises one or more of Be, Mg, Ca, Sr, Ba, Ra, Sc, Y, La, Ce, Pr, Nd, Pm, Sm, Eu, Gd, Tb, Dy, Ho, Er, Tm, Yb and Lu.

506. A structure according to claim 490 wherein said composition comprises one or more of one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

507. A structure according to claim 490 wherein said material can be made according to known principles of ceramic science.

508. A structure according to claim 490 wherein said material comprises a metallic, oxygen-deficient, perovskite-like, mixed valent transition metal compound.

509. A structure according to claim 490 wherein said material comprises a metallic, oxygen-deficient, perovskite-like, mixed valent copper compound.

510. A structure according to claim 490 wherein said material comprises at least one phase that exhibits superconductivity.

511. A structure according to claim 490 wherein said structure is selected from the group consisting of a machine and an article of manufacture.

512. A structure according to claim 490 wherein said material comprises at least one element selected from each of said first element group and said second element group.

513. A structure according to claim 490 where in said structure is selected from the group consisting of a machine and an article of manufacture.

514. A structure comprising:
a circuit comprising a circuit element comprising a material having a $T_c$ greater than or equal to 26° K capable of carrying a superconducting current
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

515. A structure comprising:
a circuit comprising a circuit element comprising a material with a $T_c$ greater than or equal to 26° K capable of carrying a superconducting current
said material comprises a transition metal, oxygen and at least one element selected from the group consisting of a first element group, a second element group and combinations thereof;
said first element group comprises rare earth elements, rare earth-like elements and Group IIIB elements, and
said second element group comprise alkaline earth elements and Group IIA elements.

516. A structure comprising:
a circuit comprising a circuit element comprising a material possessing a $T_c$ greater than or equal to 26° K capable of carrying a superconducting current
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

111

517. A structure comprising:

a circuit comprising a circuit element comprising a material having a $T_c$ greater than or equal to 26° K, said material exhibiting a substantially zero resistance to the flow of electrical current therethrough when in a superconducting state;

said material comprises a transition metal, oxygen and at least one element selected from the group consisting of a first element group, a second element group and combinations thereof;

said first element group comprises rare earth elements; rare earth-like elements and Group IIIB elements, and said second element group comprises alkaline earth elements and Group IIA elements.

518. A structure comprising:

a circuit comprising a circuit element comprising a material with a $T_c$ greater than or equal to 26° K, said material exhibiting a substantially zero resistance to the flow of electrical current therethrough when in a superconducting state;

said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

519. A structure comprising:

a circuit comprising a circuit element comprising a material possessing a $T_c$ greater than or equal to 26° K, said material exhibiting a substantially zero resistance to the flow of electrical current therethrough when in a superconducting state;

said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

520. A structure comprising:

a coil comprising a material comprising a $T_c$ greater than or equal to 26° K possessing a persistent current said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

521. An structure according to claim 520 further including a temperature controller capable of maintaining said material at a temperature less than or equal to said to said $T_c$.

522. A structure according to claim 520 wherein said material is capable of being at a temperature less than or equal to said $T_c$ and greater than or equal to 26° K.

523. A structure according to claim 520 wherein said material comprises at least one phase which comprises a property selected from the group consisting of:

a layered structure,
a layered crystalline structure,
a substantially layered structure,
a substantially layered crystalline structure,
a layered-like structure,

112 a layered-type structure,
a layered characteristic,
a layered perovskite structure,
a layered perovskite crystal structure,
a substantially layered perovskite structure,
a substantially layered perovskite crystal structure,
a perovskite structure,
a substantially perovskite structure,
a perovskite-like structure,
a perovskite type structure,
a structure comprising a perovskite characteristic,
a perovskite related structure,
a crystalline structure,
a layer-like crystalline structure,
a structure which is structurally substantially similar to an orthorhombic-tetragonal phase of said material,
a crystalline structure which enhances electron-phonon interactions to produce superconductivity,
a structure enhancing the number of Jahn-Teller polarons in said material,
a distorted crystalline structure characterized by an oxygen deficiency,
a structure comprising enhanced polaron formation,
a ceramic material,
a ceramic-like material,
a ceramic characteristic,
a ceramic type material,
a stoichiometric oxygen content,
a non-stoichiometric oxygen content,
a multivalent material,
a multivalent transition metal,
a transition metal element capable of exhibiting multivalent states,
a mixed valent material,
mixed valent ions,
mixed valent transition metal ions,
multivalent ions,
multivalent transition metal ions,
multivalent copper,
multivalent copper ions,
mixed valent copper,
mixed valent copper ions,
a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
a mixed copper oxide material including an alkaline earth element (AE) and a rare earth or rare earth-like element (RE) where the ratio (AE,RE):Cu is substantially 1:1,
a mixed copper oxide material including an alkaline earth element (AE) and a rare earth or rare earth-like element (RE) where the ratio (AE,RE):Cu is substantially 2:1
a structure comprising a distorted octahedral oxygen environment,
a distorted orthorhombic crystalline structure,
an alkaline earth element substituted for at least one atom of said rare earth, rare earth-like element or rare earth characteristic in said material
a transition metal oxide,
a mixed transition metal oxide,
a copper oxide,
a mixed oxide,
a mixed oxide with alkaline earth doping,
a substituted transition metal oxide, a mixed oxide with alkaline earth-like doping, a copper oxide wherein said alkaline earth or alkaline earth element is atomically large with respect to copper, a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition, a mixed copper oxide doped with an element chosen to result in $Cu^{3+}$ ions in said material, a doped transition metal oxide, a copper oxide wherein at least one other element is an element which results in $Cu^{3+}$ ions in said material, a copper oxide wherein at least one other element is an element chosen to result in the presence of both $Cu^{2+}$ and $Cu^{3+}$ ions, a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

524. A structure according to claim 520, wherein said transition metal is selected from the group consisting of copper, nickel and chromium.

525. A structure according to claim 520 wherein said rare-earth like elements include a property which make it essentially a rare earth element.

526. A structure according to claim 520 wherein said composition comprises one or more of Be, Mg, Ca, Sr, Ba, Ra, Sc, Y, La, Ce, Pr, Nd, Pm, Sm, Eu, Gd, Tb, Dy, Ho, Er, Tm, Yb and Lu.

527. A structure according to claim 520 wherein said composition comprises one or more of one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

528. A structure according to claim 520 wherein said material can be made according to known principles of ceramic science.

529. A structure according to claim 520 wherein said material comprises a metallic, oxygen-deficient, perovskite-like, mixed valent transition metal compound.

530. A structure according to claim 520 wherein said material comprises a metallic, oxygen-deficient, perovskite-like, mixed valent copper compound.

531. A structure according to claim 520 wherein said material comprises a multiphase material wherein at least one phase possesses said persistent current.

532. A structure according to claim 520 wherein said structure is selected from the group consisting of a machine and a article of manufacture.

533. A structure according to claim 520 wherein said material comprises at least one element selected from each of said first element group and said second element group.

534. A structure according to any one of claim 520 to 532 or 533 wherein said structure is selected from the group consisting of:

a power generation device,
an electrical power transmission device,
an electrical power transmission element,
a coil,
a magnet,
a plasma device,
a nuclear device,
a nuclear magnetic resonance device,
a nuclear magnetic imaging device,
a magnetic levitation device,
a power generation system,
a thermonuclear fusion device,
a switching device,
a Josephson junction device,
an electrical packaging device,
a circuit device,
a electronic instrumentation device,
a train,
a magnetic suceptomoter, and
a magnetometer.

535. A structure according to claim 520 wherein said structure is capable of magnetic levitation.

536. A structure comprising:

a coil comprising a material having a T, greater than or equal to 26° K possessing a persistent current said material comprises a transition metal, oxygen and at least one element selected from the group consisting of a first element group, a second element group and combinations thereof;

said first element group comprises rare earth elements, rare earth-like elements and Group IIIB elements, and said second element group comprises alkaline earth elements and Group IIA elements.

537. A structure comprising:

a coil comprising a material with a $T_c$ greater than or equal to 26° K possessing a persistent current said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

538. A structure comprising:
a coil comprising a material possessing a $T_c$ greater than or equal to 26° K possessing a persistent current
said material comprises a transition metal, oxygen and at least one element selected from the group consisting of a first element group, a second element group and combinations thereof;
said first element group comprises rare earth elements, rare earth-like elements and Group IIIB elements, and
said second element group comprises alkaline earth elements and Group IIA elements.

539. A superconductive combination according to any one of claim 104 or 105, wherein said mixed transition metal oxide can be made according to known principles of ceramic science.

540. An apparatus according to anyone any one of claim 106, 107, 174, 176, 177, 195, 196, 200, 201, 205, 206, 210, 214, 228, 243, 260, 229, 266, 267, 268, 270, 285, 286, 290, 291, 295, 296 or 304,
wherein said composition can be made according to known principles of ceramic science.

541. A combination according to any one of claim 112, 113 or 47 to 49, wherein said composition can be made according to known principles of ceramic science.

542. A superconductive apparatus according to any one of claim 6 to 16, 44 to 46, 82 to 84, 136, 163, 353-359 or 40, wherein said composition can be made according to known principles of ceramic science.

543. An apparatus according to any one of claim 114 to 117 or 119, wherein said mixed copper oxide can be made according to known principles of ceramic science.

544. A combination according to any one of claim 80 or 166, wherein said mixed copper oxide can be made according to known principles of ceramic science.

545. A superconductive apparatus according to any one of claim 59 to 64, 122 to 135, 244 to 247, 62, 375 or 376, wherein said superconductive composition can be made according to known principles of cerarnc science.

546. A superconductive combination according to any one of claim 17 to 29, 137, 164, 31 or 24-40, wherein said superconductive composition can be made according to known principles of ceramic science.

547. An apparatus according to any one of claim 220 or 221, wherein said superconductive composition can be made according to known principles of ceramic science.

548. An apparatus according to any one of claim 216, 215, 217, 306 or 307, wherein said superconductive transition metal oxide can be made according to known principles of ceramic science.

549. An apparatus according to any one of claim 308, 310, 309 or 311, wherein said superconductive copper oxide can be made according to known principles of ceramic science.

550. An apparatus according to any one of claim 222, 223, 303, 313 or 406, wherein said superconductive oxide composition can be made according to known principles of ceramic science.

551. A device according to any one of claim 145 or 148, wherein said transition metal oxide can be made according to known principles of ceramic science.

552. An apparatus according to any one of claim 34 to 36, 76 to 79, 147, 171 to 173, 204, 224, 225, 263 to 265, 294, 314, 328, 332, 333, 315 or 329, wherein said transition metal oxide can be made according to known principles of ceramic science.

553. A superconductive apparatus according to any one of claim 37-39, 31 or 40, wherein said transition metal oxide can be made according to known principles of ceramic science.

554. An apparatus according to any one of claims 51 to 55, wherein said superconductor can be made according to known principles of ceramic science.

555. A device according to any one of claim 151 or 154, wherein said copper oxide can be made according to known principles of ceramic science.

556. An apparatus according to any one of claim 194, 199, 209, 226, 227, 284, 289, 299, 300, 301, 316 or 317, wherein said copper oxide can be made according to known principles of ceramic science.

557. A combination according to any one of claim 71 or 363, wherein said transition metal oxide conductor can be made according to known principles of ceramic science.

558. A superconductive combination according to any one of claim 85 to 87 or 89, wherein said superconductive composition can be made according to known principles of ceramic science.

559. A superconductive apparatus according to any one of claim 168, 170, 181 to 184, 188 to 193, 202, 203, 207, 208, 212, 213, 251 to 262, 379-386, or 389-394, wherein said superconductive composition can be made according to known principles of ceramic science.

560. An apparatus according to any one of claim 197, 198, 220, 221, 271 to 274, 278 to 283, 292, 293, 334, 338 to 346, 387, 388, 395-399, 402 or 403, wherein said superconductive composition can be made according to known principles of ceramic science.

561. A combination according to any one of claim 96 to 100, 222, 371 or 372, wherein said mixed copper oxide composition can be made according to known principles of ceramic science.

562. A device according to any one of claims 2 to 5, wherein said composition of matter can be made according to known principles of ceramic science.

563. An apparatus according to any one of claim 230 to 238, 231 to 239, 1, 287, 288, 297, 298, 302, 303, 320 to 326, 323 to 327, 400, or 404 to 406, wherein said composition of matter can be made according to known principles of ceramic science.

564. An apparatus according to any one of claim 222 or 223, wherein said superconductive oxide composition can be made according to known principles of ceramic science.

565. An apparatus according to any one of claim 240 or 241, wherein said copper oxide composition can be made according to known principles of ceramic science.

566. An apparatus according to any one of claim 330 or 331, wherein said copper oxide composition can be made according to known principles of ceramic science.

567. A superconducting apparatus according to any one of claim 353-356 or 359, wherein said composition can be made according to known principles of ceramic science.

568. A superconducting combination according to any one of claim 24, 32 or 30, wherein said composition can be made according to known principles of ceramic science.

569. A superconducting apparatus according to any one of claim 40 or 62, wherein said composition can be made according to known principles of ceramic science.

570. A combination according to any one of claim 371 or 372, wherein said mixed copper oxide can be made by known principles of ceramic science.

571. A superconductive apparatus according to any one of claims 375, 376, 377, 378, 379 and 382, wherein said composition can be made by known principles of ceramic science.

572. A superconductive apparatus according to any one of claim 382 to 393 or 394, wherein said superconductive composition can be made by known principles of ceramic science.

573. An apparatus according to any one of claim 395 to 405 or 406, wherein said superconductive composition can be made by known principles of ceramic science.

574. An apparatus according to any one of claim 407 to 410 or 409, wherein said composition comprises a substantially perovskite crystal structure.

575. An apparatus according to claim 574, wherein said composition can be made according to known principles of ceramic science.

576. An apparatus according to any one of claim 407 to 410 or 409, wherein said composition comprises a perovskite-like structure.

577. An apparatus according to any one of claim 407 to 410 or 409, wherein said composition comprises a perovskite characteristic.

578. An apparatus according to any one of claim 407 to 410 or 409, wherein said composition comprises a perovskite related structure.

579. An apparatus according to any one of claims 407 to 409, wherein said composition can be made according to known principals of ceramic science.

580. An apparatus according to any one of claim 411, 412 or 413, wherein said superconductive element for conducting a superconducting current comprises a multiphase material comprising least one superconducting phase.

581. An apparatus according to claim 580, wherein said superconductive element for conducting a superconducting current can be made according to known principles of ceramic science.

582. An apparatus according to any one of claims 411, 412 and 413, wherein said superconductive element for conducting a superconducting current comprises one or more of the groups consisting of Be, Mg, Ca, Sr, Ba, Ra, Sc, Y, La, Ce, Pr, Nd, Pm, Sm, Eu, Gd, Tb, Dy, Ho, Er, Tm, Yb and Lu.

583. An apparatus according to claim 582, wherein said superconductive element for conducting a superconducting current can be made according to known principles of ceramic science.

584. An apparatus according to any one of claim 411, 412 or 413, wherein said superconductive element for conducting a superconducting current comprises one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

585. An apparatus according to claim 584, wherein said superconductive element for conducting a superconducting current can be made according to known principles of ceramic science.

586. An apparatus according to any one of claims 411, 412 and 413, wherein said superconductive element for conducting a superconducting current comprises a layered structure.

587. An apparatus according to claim 586, wherein said superconductive element for conducting a superconducting current can be made according to known principles of ceramic science.

588. An apparatus according to any one of claims 411, 412 and 413, wherein said superconductive element for conducting a superconducting current comprises a substantially perovskite structure.

589. An apparatus according to claim 588, wherein said superconductive element for conducting a superconducting current can be made according to known principles of ceramic science.

590. An apparatus according to any one of claims 411, 412 and 413, wherein said superconductive element for conducting a superconducting current comprises a perovskite-like structure.

591. An apparatus according to claim 590, wherein said superconductive element for conducting a superconducting current can be made according to known principles of ceramic science.

592. An apparatus according to any one of claims 411, 412 and 413, wherein superconductive element for conducting a superconducting current comprises a perovskite related structure.

593. An apparatus according to claim 592, wherein said superconductive element for conducting a superconducting current can be made according to known principles of ceramic science.

594. An apparatus according to any one of claims 411, 412 and 413, wherein said superconductive element for conducting a superconducting current comprises a structure having a perovskite characteristic.

595. An apparatus according to claim 594, wherein said superconductive element for conducting a superconducting current can be made according to known principles of ceramic science.

596. An apparatus according to any one of claims 411, 412 and 413, wherein said superconductive element for conducting a superconducting current comprises a transition metal.

597. An apparatus according to claim 596, wherein said superconductive element for conducting a superconducting current can be made according to known principles of ceramic science.

598. An apparatus according to any one of claims 411, 412 and 413, wherein said superconductive element for conducting a superconducting current comprises a copper oxide.

599. An apparatus according to claim 598, wherein said superconductive element for conducting a superconducting current can be made according to known principles of ceramic science.

600. An apparatus according to any one of claims 411, 412 and 413, wherein said superconductive element for conducting a superconducting current comprises oxygen in a nonstoichiomeric amount.

601. An apparatus according to claim 600, wherein said superconductive element for conducting a superconducting current can be made according to known principles of ceramic science.

602. An apparatus according to any one of claims 411, 412 and 413, wherein said superconductive element for conducting a superconducting current comprises a multivalent transition metal.

603. An apparatus according to claim 602, wherein said superconductive element for conducting a superconducting current can be made according to known principles of ceramic science.

604. An apparatus according to any one of claim 411, 412 or 413, wherein said superconductive element for conducting a superconducting current can be made according to known principles of ceramic science.

605. An apparatus according to any one of claim 414, 415 or 416, wherein said superconductive element comprises one or more of the group consisting of Be, Mg, Ca, Sr, Ba, Ra, Sc, Y, La, Ce, Pr, Nd, Pm, Sm, Eu, Gd, Tb, Dy, Ho, Er, Tm, Yb and Lu.

606. An apparatus according to claim 605, wherein said superconductive element comprises a copper.

607. An apparatus according to of claim 606, wherein said superconductive element can be made according to known principles of ceramic science.

608. An apparatus according to any one of claim 414, 415 or 416, wherein said superconductive element comprises one or more of Be, Mg, Ca, Sr, Ba and Ra and one or more of Se, Y, La, Ce, Pr, Nd, Pm, Sm, Eu, Gd, Tb, Dy, Ho, Er, Tm, Yb and Lu.

609. An apparatus according to claim 608, wherein said superconductive element comprises copper.

610. An apparatus according to of claim 609, wherein said superconductive element can be made according to known principles of ceramic science.

611. An apparatus according to any one of claim 414, 415 or 416, wherein said superconductive element can be made according to known principles of ceramic science.

612. An apparatus according to any one of claim 417, 418 or 419, wherein said superconductive element comprises one or more of the group consisting of Be, Mg, Ca, Sr, Ba, Ra, Sc, Y, La, Ce, Pr, Nd, Pm, Sm, Eu, Gd, Tb, Dy, Ho, Er, Tm, Yb and Lu.

613. An apparatus according to claim 612, wherein said superconductive element comprises a multiphase material comprising a superconductive phase.

614. An apparatus according to claim 613, wherein said superconductive element can be made according to known principles of ceramic science.

615. An apparatus according to claim 612, wherein said superconductive element can be made according to known principles of ceramic science.

616. An apparatus according to claim 615, wherein said superconductive element can be made according to known principles of ceramic science.

617. An apparatus according to any one of claim 417, 418 or 419, wherein said superconductive element comprises one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

618. An apparatus according to claim 617, wherein said superconductive element comprises multiphase material comprising a superconductive phase.

619. An apparatus according to claim 618, wherein said superconductive element can be made according to known principles of ceramic science.

620. An apparatus according to claim 617, wherein said superconductive element can be made according to known principles of ceramic science.

621. An apparatus according to any one of claim 417, 418 or 419, wherein said superconductive element can be made according to known principles of ceramic science.

622. An apparatus according to claim 621, wherein said superconductive element can be made according to known principles of ceramic science.

623. An apparatus according to any one of claim 442, 443 or 444, wherein said superconductive element comprises one or more of the group consisting of Be, Mg, Ca, Sr, Ba, Ra, Sc, Y, La, Ce, Pr, Nd, Pm, Sm, Eu, Gd, Tb, Dy, Ho Er, Tm, Yb and Lu.

624. An apparatus according to any one of claim 442, 443 or 444, wherein said superconductive element comprises one or more of Be, Mg, Ca, Sr, Ba and Ra and one or more of Sc, Y, La, Ce, Pr, Nd, Pm, Sm, Eu Gd, Tb, Dy, Ho, Er, Tm, Yb and Lu.

625. An apparatus according to any one of claim 445, 446 or 447, wherein said superconductive element comprises one or more of the group consisting of Be, Mg, Ca, Sr, Ba, Ra, Sc, Y, La, Ce, Pr, Nd, Pm, Sm, Eu, Gd, Tb, Dy, Ho, Er, Tm, Yb and Lu.

626. An apparatus according to claim 625, wherein said superconductive element comprises a multiphase material comprising a superconductive phase.

627. An apparatus according to any one of claim 445, 446 or 447, wherein said superconductive element comprises one or more of Be, Mg, Ca, Sr, Ba and Ra and one or more of Sc, Y, La, Ce, Pr, Nd, Pm, Sm, Eu, Gd, Tb, Dy, Ho, Er, Tm, Yb and Lu.

628. An apparatus according to claim 627, wherein said superconductive element comprises a multiphase material comprising a superconductive phase.

629. An apparatus according to any one of claim 445, 446 or 447, wherein said superconductive element is substantially perovskite.

630. An apparatus according to any one of claim 445, 446 or 447, wherein said superconductive element comprises a perovskite-like structure.

631. An apparatus according to any one of claim 445, 446 or 447, wherein said superconductive element comprises a perovskite related structure.

632. An apparatus according to any one of claim 445, 446 or 447, wherein said superconductive element comprises a nonstoichiometric amount of oxygen.

633. An apparatus according to any one of claim 445, 446 or 447, wherein said superconductive element comprises a layered structure.

634. An apparatus according to any one of claim 452, 453 or 454 wherein said composition can be made according to known principles of ceramic science.

635. An apparatus according to any one of claim 455, 456 or 457 wherein said composition can be made according to known principles of ceramic science.

636. An apparatus according to any one of claim 422 to 440 or 441, wherein said superconductive element can be made according to known principles of ceramic science.

637. An apparatus according to any one of claim 442 to 623 or 624, wherein said superconductive element can be made according to known principles of ceramic science.

638. A structure according to any one of claim 463 to 466 or 467 wherein said structure is selected from the group consisting of:
  a power generation device,
  an electrical power transmission device,
  an electrical power transmission element,
  a coil,
  a magnet,
  a plasma device,
  a nuclear device,
  a nuclear magnetic resonace device,
  a nuclear magnetic imaging device,
  a magnetic levitation device,
  a power gerneation system,
  a thermonuclear fusion device,
  a switching device,
  a Josephson junction device,
  an electrical packaging device,
  a circuit device,
  a electronic instrumentation device,
  a magnetic suceptomoter, and
  a magnetometer.

639. A structure according to any one of claim 463 to 467 or 638 wherein said structure is a coil comprised of said material.

640. A structure according to claim 639 wherein said material possesses substantially zero electrical resistance.

641. A structure according to claim 639 wherein said coil possesses substantially zero electrical resistance.

642. A structure according to claim 639 wherein said coil is capable of carrying a superconducting current flowing therein without a source providing for said superconducting current.

643. A structure according to any one of claim 463 to 641 or 468 wherein said material possesses substantially zero electrical resistance.

644. A structure according to any one of claim 463 to 467 or 638 wherein said circuit element has an input capable of receiving an input current and an output capable of outputting an output current through substantially zero electrical resistance between said input and said output.

645. A structure according to claim 644 wherein said material possesses substantially zero electrical resistance.

646. A structure according to claim 644 wherein said structure is designed for said circuit element to be capable of carrying said superconducting current.

647. A structure according to claim 646 wherein said material possesses substantially zero electrical resistance.

648. A structure according to any one of claim 463 to 467 or 638 wherein said circuit element has an input capable of receiving an input current and an output capable of outputting an output through substantially zero electrical resistance, between said input and said output.

649. A structure according to claim 648 wherein said material possesses substantially zero electrical resistance.

650. A structure according to claim 648 wherein said structure is designed for said circuit element to be capable of carrying said superconducting current.

651. A structure according to claim 650 wherein said material possesses substantially zero electrical resistance.

652. A structure according to claim 651 wherein said material is capable of being at a temperature less than or equal to said $T_c$ and greater than or equal to 26° K.

653. A structure according to claim 652 wherein said material comprises at least one phase which comprises a property selected from the group consisting of:
    a layered structure,
    a layered crystalline structure,
    a substantially layered structure,
    a substantially layered crystalline structure,
    a layered-like structure,
    a layered-type structure,
    a layered characteristic,
    a layered perovskite structure,
    a layered perovskite crystal structure,
    a substantially layered perovskite structure,
    a substantially layered perovskite crystal structure,
    a perovskite structure,
    a substantially perovskite structure,
    a perovskite-like structure,
    a perovskite type structure,
    a structure comprising a perovskite characteristic,
    a perovskite related structure,
    a crystalline structure,
    a layer-like crystalline structure,
    a structure which is structurally substantially similar to an orthorhombic-tetragonal phase of said material,
    a crystalline structure which enhances electron-phonon interactions to produce superconductivity,
    a structure enhancing the number of Jahn-Teller polarons in said material,
    a distorted crystalline structure characterized by an oxygen deficiency,
    a structure comprising enhanced polaron formation,
    a ceramic material,
    a ceramic-like material,
    a ceramic characteristic,
    a ceramic type material,
    a stoiciomeric oxygen content,
    a non-stoiciomeric oxygen content,
    a multivalent material,
    a multivalent transition metal,
    a transition metal element capable of exhibiting multivalent states,
    a mixed valent material,
    mixed valent ions,
    mixed valent transition metal ions,
    multivalent ions,
    multivalent transition metal ions,
    multivalent copper,
    multivalent copper ions,
    mixed valent copper,
    mixed valent copper ions,
    a ceramic-like material in the RE-AE-TM-O system, where RE is a rare earth or near rare earth element, AE is an alkaline earth element, TM is a multivalent transition metal element having at least two valence states in said ceramic-like material, and O is oxygen wherein the ratio of the amounts of said transition metal in said two valence states being determined by the ratio RE:AE,
    a mixed copper oxide material including an alkaline earth element (AE) and a rare earth or rare earth-like element (RE) where the ratio (AE,RE):Cu is substantially 1:1,
    a mixed copper oxide material including an alkaline earth element (AE) and a rare earth or rare earth-like element (RE) where the ratio (AE,RE):Cu is substantially 2:1
    a structure comprising a distorted octahedral oxygen environment,
    a distorted orthorhombic crystalline structure,
    an alkaline earth element substituted for at least one atom of said rare earth, rare earth-like element or rare earth characteristic in said material
    a transition metal oxide,
    a mixed transition metal oxide,
    a copper oxide,
    a mixed oxide,
    a mixed oxide with alkaline earth doping,
    a substituted transition metal oxide,
    a mixed oxide with alkaline earth-like doping,
    a copper oxide wherein said alkaline earth or alkaline earth element is atomically large with respect to copper,
    a copper oxide doped with an alkaline earth element, alkaline earth like element, or an element with an alkaline earth characteristic where the concentration of said alkaline earth element, alkaline earth like element, or said element with an alkaline earth characteristic is near to the concentration of said alkaline earth element, alkaline earth like element or said element with an alkaline earth characteristic where the superconducting copper oxide phase in said material undergoes an orthorhombic to tetragonal structural phase transition,
    a mixed copper oxide doped with an element chosen to result in $Cu^{3+}$ ions in said material,
    a doped transition metal oxide,
    a copper oxide wherein at least one other element is an element which results in $Cu^{3+}$ ions in said material,
    a copper oxide wherein at least one other element is an element chosen to result in the presence of both $Cu^{2+}$ and $Cu^{3+}$ ions,
    a substituted copper oxide exhibiting mixed valence states, a superconductor being comprised of at least four elements, none of which is itself superconducting at a temperature greater than or equal to 26° K, at least four elements, none of which is itself a superconductor, a superconductor being comprised of said transition element which itself is not superconducting, a superconductor being an oxide having multivalent oxidation states, a transition metal oxide having substitutions therein, the amount of said substitutions being sufficient to produce sufficient electron-phonon interactions in said material that said material exhibits said superconductivity, a crystalline mixed valent oxide having a layer-like structure, at least one element in a nonstoichiometric atomic proportion, a composition of the formula $Ba_xLa_{x-5}Cu_5O_y$ wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition of the formula $BaLa_{5-x}Cu_5O_{5(3-y)}$, wherein x is from about 0.75 to about 1 and y is the oxygen deficiency resulting from annealing said composition at temperatures from about 540° C. to about 950° C. and for times of about 15 minutes to about 12 hours, said composition having a metal oxide phase which exhibits a superconducting state at a critical temperature greater than or equal to 26° K, a composition wherein at least one element is in a nonstoichiometric atomic proportion;

a composition comprising a metallic, oxygen-deficient, perovskite-like, mixed valent transition metal compound, and combinations thereof.

654. A structure according to any one of claim 463 to 641 or 468 wherein said structure is designed for said circuit element to be capable of carrying said superconducting current.

655. A structure according to claim 654 wherein said material possesses substantially zero electrical resistance.

656. A structure according to any one of claim 463 to 467 or 638 wherein said circuit element is capable of carrying a superconducting current flowing therein through substantially zero electrical resistance.

657. A structure according to claim 656 wherein said material possesses substantially zero electrical resistance.

658. A structure according to any one of claim 490 to 511 or 512 wherein said structure is selected from the group consisting of:
a power generation device,
an electrical power transmission device,
an electrical power transmission element,
a coil,
a magnet,
a plasma device,
a nuclear device,
a nuclear magnetic resonace device,
a nuclear magnetic imaging device,
a magnetic levitation device,
a power gerneation system,
a thermonuclear fusion device,
a switching device,
a Josephson junction device,
an electrical packaging device,
a circuit,
a electronic instrumentation device,
a magnetic suceptomoter, and
a magnetometer.

659. A structure according to any one of claim 490 to 512 or 658 wherein said structure is a coil comprised of said material.

660. A structure according to claim 659 wherein said material possesses substantially zero electrical resistance.

661. A structure according to claim 659 wherein said coil possesses substantially zero electrical resistance.

662. A structure according to claim 659 wherein said coil is capable of carrying a superconducting current flowing therein without a source providing for said superconducting current when in a superconducting state.

663. A structure according to any one of claim 490 to 661 or 513 wherein said material possesses substantially zero electrical resistance.

664. A structure according to any one of claim 490 to 512 or 658 wherein said circuit element has an input capable of receiving an input current and an output capable of outputting an output current through substantially zero electrical resistance, between said input and said output.

665. A structure according to claim 664 wherein said material possesses substantially zero electrical resistance.

666. A structure according to claim 664 wherein said structure is designed for said circuit element to be capable of carrying said superconducting current.

667. A structure according to claim 666 wherein said material possesses substantially zero electrical resistance.

668. A structure according to any one of claim 490 to 512 or 658 wherein said circuit element has an input capable of receiving an input current and an output capable of outputting an output through substantially zero electrical resistance, between said input and said output.

669. A structure according to claim 668 wherein said material possesses substantially zero electrical resistance.

670. A structure according to claim 668 wherein said structure is designed for said circuit element to be capable of carrying said superconducting current.

671. A structure according to claim 670 wherein said material possesses substantially zero electrical resistance.

672. A structure according to any one of claim 490 to 661 or 513 wherein said structure is designed for said circuit element to be capable of carrying said superconducting current.

673. A structure according to claim 672 wherein said material possesses substantially zero electrical resistance.

674. A structure according to any one of claim 490 to 512 or 658 wherein said circuit element is capable of carrying a superconducting current flowing therein through substantially zero electrical resistance.

675. A structure according to claim 674 wherein said material possesses substantially zero electrical resistance.

676. A structure according to any one of claim 463 to 467 or 638 wherein said circuit element is capable of carrying a superconducting current flowing therein without a source providing for said superconducting current.

677. A structure according to any one of claim 490 to 512 or 658 wherein said circuit element is capable of carrying a superconducting current flowing therein without a source providing for said superconducting current when in a superconducting state.

678. A structure according to any one of claim 463, 490, 514 to 518 or 519 wherein said rare-earth like elements include elements having a property which make it essentially a rare earth element.

679. A structure according to claim 490 wherein said rare earth-like elements comprise a a property which make it essentially a rare earth element.

* * * * *